(12) United States Patent
Lowrey et al.

(10) Patent No.: US 7,839,674 B2
(45) Date of Patent: *Nov. 23, 2010

(54) PROGRAMMABLE MATRIX ARRAY WITH CHALCOGENIDE MATERIAL

(75) Inventors: Tyler Lowrey, San Jose, CA (US); Ward Parkinson, Boise, ID (US); Guy Wicker, Southfield, MI (US)

(73) Assignee: Ovonyx, Inc., Troy, MI (US)

( * ) Notice: Subject to any disclaimer, the term of this patent is extended or adjusted under 35 U.S.C. 154(b) by 117 days.

This patent is subject to a terminal disclaimer.

(21) Appl. No.: 12/286,784

(22) Filed: Oct. 2, 2008

(65) Prior Publication Data

US 2009/0034325 A1 Feb. 5, 2009

Related U.S. Application Data

(63) Continuation of application No. 11/318,789, filed on Dec. 24, 2005, now Pat. No. 7,499,315, and a continuation-in-part of application No. 10/459,632, filed on Jun. 11, 2003, now Pat. No. 6,987,688, and a continuation-in-part of application No. 11/032,792, filed on Jan. 11, 2005, now abandoned, and a continuation-in-part of application No. 11/158,619, filed on Jun. 22, 2005, now Pat. No. 7,426,135.

(51) Int. Cl.
*G11C 11/00* (2006.01)

(52) U.S. Cl. .................. 365/163; 365/148; 365/154; 365/171

(58) Field of Classification Search ............. 365/163, 365/148, 154, 171, 63; 257/2–4, E27.004
See application file for complete search history.

(56) References Cited

U.S. PATENT DOCUMENTS

| | | | |
|---|---|---|---|
| 6,847,543 B2 * | 1/2005 | Toyoda et al. | 365/154 |
| 7,307,451 B2 * | 12/2007 | Pellizzer et al. | 326/41 |
| 7,376,008 B2 * | 5/2008 | Shepard | 365/175 |
| 7,499,315 B2 * | 3/2009 | Lowrey et al. | 365/163 |

* cited by examiner

*Primary Examiner*—David Lam
(74) *Attorney, Agent, or Firm*—Kevin L. Bray

(57) ABSTRACT

A chalcogenide material is proposed for programming the cross-connect transistor coupling interconnect lines of an electrically programmable matrix array. Leakage may be reduced by optionally placing a thin insulating breakdown layer in series with the select device or a phase change material. The matrix array may be used in a programmable logic device.

23 Claims, 42 Drawing Sheets

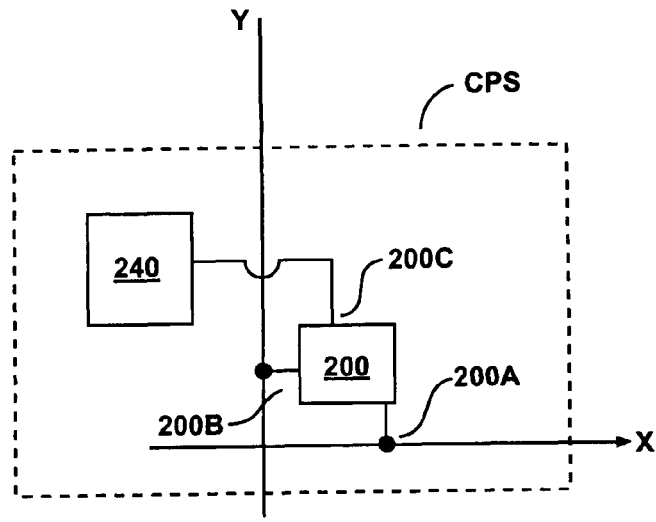
FIG - 4E
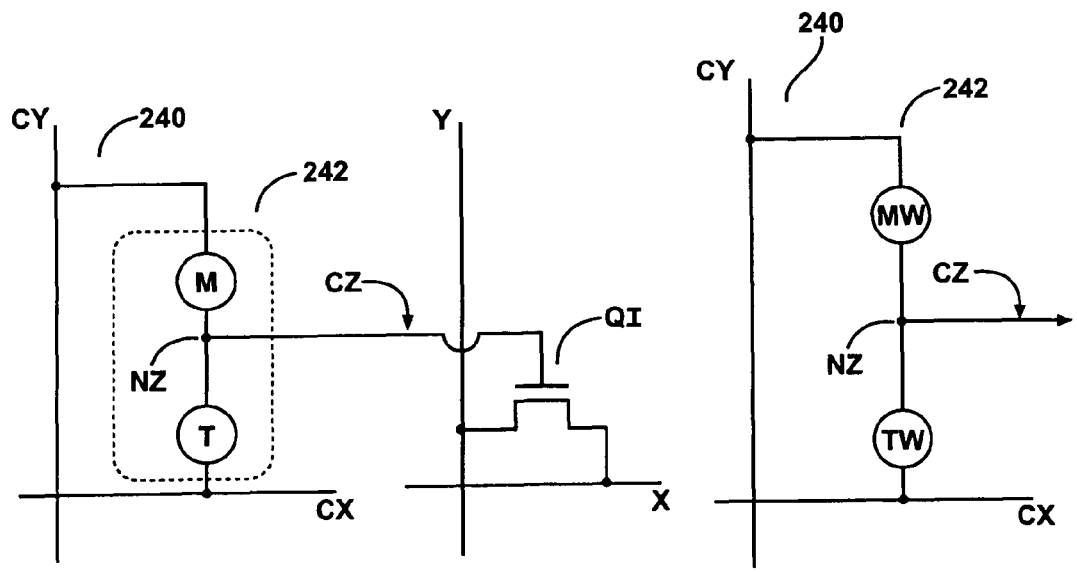
FIG - 5A  FIG - 5B

US 7,839,674 B2

PROGRAMMABLE MATRIX ARRAY WITH CHALCOGENIDE MATERIAL

RELATED APPLICATION INFORMATION

This application is a continuation of U.S. patent application Ser. No. 11/318,789, filed on Dec. 24, 2005, now issued as U.S. Pat. No. 7,499,315. This application is also a continuation-in-part of U.S. patent application Ser. No. 10/459,632, filed on Jun. 11, 2003, now issued as U.S. Pat. No. 6,987,688. This application is also a continuation-in-part of U.S. patent application Ser. No. 11/032,792, filed on Jan. 11, 2005, now abandoned. This application is also a continuation-in-part of U.S. patent application Ser. No. 11/158,619, filed on Jun. 22, 2005, now issued as U.S. Pat. No. 7,426,135. U.S. patent application Ser. No. 10/459,632, now issued as U.S. Pat. No. 6,987,688, is hereby incorporated by reference herein. U.S. patent application Ser. No. 11/032,792, now abandoned, is hereby incorporated by reference herein. U.S. patent application Ser. No. 11/158,619 now issued as U.S. Pat. No. 7,426,135, is hereby incorporated by reference herein.

FIELD OF THE INVENTION

The present invention generally relates to programmable integrated circuit devices, and more particularly to a programmable matrix array with programmable connections determined by a phase-change material driving a cross-point coupled transistor.

BACKGROUND OF THE INVENTION

Generally, phase-change materials are capable of being electrically programmed between a first structural state where the material is generally amorphous and a second structural state where the material is generally crystalline. The term "amorphous", as used herein, refers to a structural condition which is relatively less ordered or more disordered than a single crystal. The term "crystalline", as used herein, refers to a structural condition which is relatively more ordered than amorphous. The phase-change material exhibits different electrical characteristics depending upon its state. For instance, in its crystalline, more ordered state the material exhibits a lower electrical resistivity than in its amorphous, less ordered state. Each material phase can be conventionally associated with a corresponding logic value. For example, the lower resistance crystalline state may be associated with a logic "1" while the higher resistance amorphous state may be associated with a logic "0".

Materials that may be used as a phase-change material include alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy which may be used as a phase-change material is the alloy Ge$_2$Sb$_2$Te$_5$ (also referred to as GST225). An example of a chalcogenide alloy which is particularly useful as a threshold switching material is the alloy Si$_{14}$Te$_{39}$As$_{37}$Ge$_9$X$_1$ where X may be element In or the element P.

The phase-change materials may change states through application of an electrical signal. The electrical signal may be a voltage across or a current through the phase change material. The electrical signal may be in the form of one or more electrical pulses. As an example, the volume of material may be programmed from its higher resistance reset state (more amorphous) to its lower resistance set state (less amorphous and more crystalline) through application of an electrical pulse (e.g. a current pulse) referred to as a set pulse. While not wishing to be bound by theory, it is believed that the set pulse is sufficient to change at least a portion of the volume of memory material from a less-ordered amorphous state to a more-ordered crystalline state. The volume of material may be programmed back from the low resistance set state to the high resistance reset state by application of an electrical pulse with more amplitude than a set pulse (e.g. a current pulse) referred to as a reset pulse. While not wishing to be bound by theory, it is believed that application of a reset pulse to the volume of material is sufficient to change at least a portion of the volume of memory material from a more-ordered crystalline state to a less-ordered amorphous state. It is conceivable that other forms of energy, including, but not limited to optical energy (such as from a laser), thermal energy, electromagnetic energy or mechanical energy (such as acoustical energy) may be used to change the state of the volume of material.

A phase-change material may be used to form a phase-change memory. Typically, a phase-change memory is arranged as an array of phase-change memory cells having rows and columns with associated word lines and bit lines, respectively. Each memory cell includes a memory element. The memory cell may further include an access device (also referred to in the art as an isolation device or a steering element). The access device may be coupled in series with the memory element. Examples of access devices include (without limitation) diodes, transistors and threshold switching elements. A threshold switching element may also be referred to as threshold switch. A threshold switching element may be formed of a chalcogenide material. A threshold switching element may be formed of an S-type threshold switching material. An example of using a threshold switching element as an access device in provided in U.S. Pat. No. 3,573,757 which is hereby incorporated by reference herein.

In a memory array, each memory cell may be coupled between a respective word line (also referred to as a row line or an X line) and a respective bit line (also referred to as a column line or a Y line).

The memory cells can be selected for a reading operation, for example, by applying suitable voltages to the respective word lines and suitable current or voltage pulses to the respective bit lines. In response to forcing a current into the bit line, the voltage reached at the bit line depends on the resistance of the storage element, i.e., on the logic value stored in the selected memory cell.

For general memory use, either commodity or embedded, the logic value stored in the memory cell may be evaluated by sense amplifiers of the memory. Typically, a sense amplifier includes a comparator receiving the bit line voltage, or a related voltage, and a suitable reference voltage. As an example in response to a current forced into the selected column, if the bit line driven by a read current achieves a voltage that is higher than the reference voltage for having higher resistance than the lower resistance case, the bit may be decreed to correspond to a stored logic value "0", whereas if the bit line voltage is smaller than the reference voltage for the cell having lower resistance, then the bit may be decreed to correspond to the stored logic value "1".

Products, such as programmable logic devices, achieve random logic designs by providing standard logic interconnected to user specifications typically through an X-Y grid, although the lines to be interconnected may also be on the same level, with cross-unders used (such as poly or N+). This X-Y grid may be conceptually similar to the X-Y grid of a memory array and consists of X lines (corresponding, for example, to row or word lines) and a plurality of Y lines (corresponding, for example, to column or bit lines). The X lines typically cross (either over or under) the Y lines. The X lines may be oriented in a first direction while the Y lines are all oriented in a second direction different from the first direction. The X lines may be substantially perpendicular to the Y lines. The X lines may be physically spaced apart from the Y lines. The X lines may be insulated from the Y lines, however, it is possible that the X lines may be pre-connected to the Y lines such as through a shorting contact. When interconnecting logic instead of memory elements of a memory array, the X-Y grid may be more random in spacing and irregular in length than the X-Y grid of the memory array.

In a memory array, the impedance between the X lines and the Y lines is preferably very high, like an open circuit, until the select device is enabled, such as by row selection or column selection, or both row and column selection. Such selection may entail lowering or raising the X and/or Y lines. Selecting a particular X line lowers the impedance between a memory element and a corresponding Y line, with the path of impedance not necessarily to the selected X line, but instead being a path, for example, to ground. When the path within the cell is to ground, a select transistor may be used wherein the gate is controlled by the X-line. If the select path within the cell is to the X line, the select device may be, for example, a diode or a threshold switching element. The impedance of certain types of threshold switching element may be reduced when the voltage across the element equals or exceeds a threshold voltage. The element turns on whereby the voltage across the element may then snap back to a holding voltage which is less than the threshold voltage. The threshold switching element may remain on until current through the element drops below a holding current.

In contrast, the X-Y grid of conducting lines used for interconnecting logic (such as in a programmable logic array) may have a relatively linear resistance between the lines instead of the piecewise linear resistance. For a logic device such as a programmable logic array, resistance may be relatively high where no connection (an open circuit) is intended and relatively low where a connection (a short circuit) is intended.

The appropriate connections between the X lines and Y lines at the cross-points determining interconnect among logic gates and electronic functions may be programmed in different ways. One type of programming technology used to selectively determine connections is mask programming. This is done by the semiconductor manufacturer during the chip fabrication process. Examples of mask programmable devices include mask programmable gate arrays, mask programmable logic arrays and mask programmable ROMs. In the case of mask programming, a CLOSED connection may be an actual short circuit (for example, by using a contact or via) between an X line and a Y line at a cross-point, while an OPEN connection may be an actual open circuit (where the lines may be separated by an insulator such as Silicon dioxide or Silicon nitride). This approach may be characterized by good layout efficiency and performance, but higher tooling costs and time delay to first article product, since custom masks and layout are used for each different customer product and these may need to be generated and applied to silicon before the customer specific product is completed.

In contrast to mask programmable devices, field programmable devices are programmed after manufacture. Examples of field programmable devices include programmable ROM (PROM), electrically erasable ROM (EEPROM), field programmable logic arrays (FPLA), the programmable array logic device (PAL.RTM.), the complex programmable logic device (CPLD), and the field-programmable gate array (FPGA).

Field programmable devices make use of programmable connections at the cross-points of the X lines and the Y lines in order to program the device after the time of manufacture, and such programming may be done by the manufacturer to customer specification, or by the OEM upon receipt, or by the end customer in the field, and even updated periodically such as through an internet download (which may update connections or repair bugs found in the field).

For field programmable devices such as field programmable logic arrays (FPLA), the programmable connections may be made so that a relatively high resistance between the lines represents an OPEN connection between the lines while a relatively low resistance represents a CLOSED connection between the lines. Products with relatively lower resistance for CLOSED connections may be faster with improved voltage margin. Margin and speed may also be improved if the capacitance of the programmable connection tied to the interconnected lines is low, as well as the lines and devices interconnected. Programmable connections having a higher resistance for OPEN connections may have lower leakage and better voltage margin, since those connections intended to be OPEN connections may have a voltage difference across the lines (as various levels or logic states are applied to the driver and/or receiver lines). That is, any resistor between the lines bleeds current and increases battery drain, while decreasing the voltage margin.

The power drained off by the cross-points intended to be OPEN is a larger problem in larger logic arrays with more X-Y interconnects, and hence more cross-points. For non-mask programmed field programmable devices, whether tying together logic or other electronic functions, there is a need for a programmable connection that can provide a relatively low resistance in CLOSED connections and a relatively high resistance in OPEN connections. Preferably, the programmable connection shall also add little capacitance to the interconnected conductive lines and change the wafer fabrication process as little as possible.

A programmable connection for a field programmable device, such as a field programmable logic array (FPLA) may be a volatile or non-volatile connection (the difference being whether the device must be re-programmed each time power is restored). For example, when a computer is turned off, the logic pattern desired in the field programmable logic chips may be stored in hard disc. Upon power-on restart, the logic interconnect pattern may be reloaded into the configuration memory elements controlling the interconnect between logic gates and other functions, at the expense of delayed restart. Such a volatile approach, may store the state of the programmable connection at each cross-point node on a static ram (SRAM) driving an n-channel cross point transistor, as shown in FIG. 1.

FIG. 1 shows an example of a programmable connection that uses a conventional SRAM to drive the gate of an n-channel transistor QI at the cross-point. The p-channel pull-up transistors Q2 and Q4, provide a high logic level near the power supply, and the n-channel pull-down transistors Q6 and Q8, provide a pull-down to the lower power supply, in the usual CMOS fashion. Here, the p-channel Q2 and Q4 are also cross coupled into an SRAM so that node N2 or node N4 may be high and the other low. Line PX may select the SRAM through transistor Q12 so that data may be written into the configuration bit from line PY (where the data may be furnished and driven by a processor). Output node N2 drives the gate of a transistor QI, making it conductive when the gate of QI is high, or non-conductive when the gate is driven (by programming the SRAM) to a low or off state. The transistor QI is coupled between the Y conductive line and the X conductive line.

The programmable connection may be characterized by its worst case capacitance and resistance over the voltage and temperature range of the lines interconnected, a lower resistance when "on" providing less delay and better voltage margin. Especially desirable is low on resistance during the transition of the coupled lines from a high to low, or low to high. A higher resistance when "off" (lines not coupled) provides lower leakage and battery drain, as well as improved voltage margin by reducing line and driver voltage drop from leakage.

In the SRAM type programmable connection example version shown in FIG. 1, the source to drain "on" resistance is lower for voltages on the coupled X and Y lines that are less than the power supply to which the gate is driven, since the resistance from source to drain of the n-channel transistor tends to increase when the source and drain voltages approach the gate voltage. Accordingly, in some versions of greater complexity, the n-channel transistor QI may have a special low threshold voltage Vt or the power supply in the configuration control SRAM may be higher than in the logic interconnect area, so the N2 line is high enough that QI is on even when X and Y are high.

Alternately, the n-channel transistor QI may be in parallel with a p-channel with gate driven by node N4. This full mux approach may provide a lower resistance but it may be at the expense of greater capacitance and increased chip area for each matrix switch.

As a further example, to make such an approach non-volatile, the SRAM in FIG. 1 may be replaced by an EPROM, EEPROM, or Flash transistor properly loaded to drive the n-channel interconnect transistor QI, or the SRAM may be mirrored with non-volatile memory such as FeRAM. Programming the non-volatile memory may be accomplished with a special higher voltage or current for the non-volatile element. However, such an approach increases process complexity.

Further, both the SRAM or the non-volatile memory alternative may require considerable area in the base silicon to control the interconnect transistor. In addition, the area of the interconnect transistor coupling the lines uses up area in the base silicon (and grows the chip).

The connections in field programmable devices such as FPLAs may also be made non-volatile by using anti-fuses at the X-Y interconnect as shown in FIG. 2A, which shows anti-fuse 10 coupled between an X line and a Y line. Such products, for example FPLAs and FPGAs, desirably reduce the chip area and layers dedicated to programming the programmable connection, by reducing the semiconductor active devices (by eliminating the SRAM) and interconnect to program the SRAM (e.g. PX and PY) at each switch. This may also free up base silicon by forming the cross-point as a thin-film layer between interconnect layers, thus eliminating the area related to the cross-point transistor that is programmed by the SRAM (or other non-volatile alternatives such as Flash or FeRam or EEprom).

The anti-fuse 10 acts as an OPEN connection before it is programmed. The OPEN connection is characterized by the amount of leakage at maximum voltage between the coupled X-Y lines. The anti-fuse may be implemented using an insulative breakdown material that is broken down to provide a conductive pathway through application of a sufficiently high voltage across the material.

Once programmed to a lower resistance state, an anti-fuse cannot be readily reversed. Accordingly, testing prior to shipping or in the field (at the OEM manufacturer or by the customer) may be difficult, since reversing a programmed anti-fuse may be impractical. Also, subsequent changes in the field, such as by remote connection via modem or internet, may not be possible that could reduce repair and upgrade costs since the anti-fuse, once punctured into a low resistance state, may not be reversible (other than by impractically high current, which may adversely affect reliability). If a high resistance is subsequently needed after programming into a low resistance state at the cross-connect, the chip must be replaced instead of re-programmed.

The anti-fuse 10 may be formed as a metal-metal anti-fuse as shown in FIG. 2B that includes a first metal layer 12A, a second metal layer 12B, an dielectric layer 14 and a breakdown layer 16. The metal layers 12A,B may be formed of an alloy of tungsten, titanium and silicon. The breakdown layer 16 may be formed of an amorphous silicon.

Manufacturers of equipment may find an error in FPLA operation/functionality after programming at the factory and shipment to the customer that could be fixed (if the programming is reversible), perhaps thereby allowing correction such as through remote dial-up or internet access download to re-program the logic. Or, the chip may be removed in the field and re-programmed by plugging into an adaptor to a computer.

However, while such an option is possible with SRAM or its non-volatile re-programmable equivalent (such as Flash, EEPROM, or FeRam), such an option may not be possible with an anti-fuse based approach. Instead, the part must instead be removed and replaced, perhaps at considerable expense to the manufacturer and inconvenience to the customer.

Further, due to the limitations of programming irreversible links, such as anti-fuse based FPGA, in only one direction (to be a short), testing of the arrays intended for use by the customer may be done only indirectly, such as by programming spare (unused) but representative anti-fuses along side the main array of interconnect fuses before a part is shipped. However, actual programming of (untested) links by the customer may be unsuccessful, since the links or cross-points actually used may be defective since they were untested before being shipped or used. Cross-points found unprogrammable may require return of the unit to the factory or even replacement in the final equipment, if personalization is done after assembly.

Each of these discards may be at successively higher cost and require an undesirable manufacturing and field use flow which is incompatible with a more preferred zero-defect manufacturing and use. To better improve "yield" and reduce defects in the field, the size and complexity of irreversible fuse or anti-fuse based approaches may be limited to relatively small arrays of interconnect compared to the more testable SRAM based approaches.

Further, the non-SRAM based approaches may add processing steps beyond those of making the logic to be interconnected, and those extras processing steps may excessively raise cost. Customer preferences for a more testable non-volatile storage with lower cost and lower power suggest that such additional processing steps relative to SRAM are preferably offset by reduced chip size and processing steps.

Accordingly, there is need for a programmable matrix array using non-volatile programmable connections that are reversible both at the factory and in the field.

SUMMARY OF THE INVENTION

One aspect of the present invention is a programmable connection comprising a non-volatile programmable resistance material such as a phase-change memory material used in a control circuit to drive a transistor (or another type of controllable interconnect device) coupled between an X line and a Y line. Such a programmable connection may be programmed by controlling the state of the transistor (or other form of controllable interconnect device). The state of the transistor may be controlled by changing the state of the phase-change material.

The phase-change memory material may be coupled in series with a select device (such as a chalcogenide or S-type threshold switch, a transistor or a diode) between address lines (such as the CX lines and the CY lines) and programming the memory material may be accomplished by raising the voltage between the address lines to exceed the thresholds of the select device and phase-change material, and then passing adequate current through the phase-change material for a state change. Current may be limited by adding a transistor source-drain in series with the combination, with the gate of the transistor biased to be slightly on for normal operation and hard on for programming.

To further reduce power on unused cross-points, a breakdown layer may be placed in series with the memory material and the select device between the address lines. The breakdown layer may be incorporated as part of the memory element or the select device, or it may be formed as part of a breakdown device (such as an anti-fuse). The breakdown layer may be formed of a dielectric material. The breakdown layer may be disposed such that it is serially coupled between the select device and the power supply or current source. When a breakdown layer is included, it must first be broken down before the phase-change material can be programmed. Hence, with a breakdown layer, the initial programming to a CLOSED connection (e.g. cross-point transistor turned "on") may, for example, not only entail resetting the phase-change material to its high resistance state but also creating a current pathway through the breakdown layer by puncturing or breaking it down with voltage or current.

The programmable connection may be tested by programming the phase-change material to the set state and then to the reset state. It is noted, that only those programmable connections which may potentially be CLOSED (initially or later) would need the breakdown layer's penetrated at factory or at initial customer test. For example, if a customer knows that certain cross-points in a general purpose FPLA will probably not be used in a certain application, the breakdown layers of the corresponding programmable connections need not be penetrated. Since the breakdown layer causes the programmable connection to have higher impedance until penetrated, the leakage is thereby reduced while retaining general flexibility at each X-Y interconnection to program it later, if needed. The dielectric, if viewed as an anti-fuse, is thereby made reversible in the field.

Permanently wired interconnects may also be used for other logic connections in order to reduce the number of programmable connections, thereby further reducing leakage as well as test requirements. Alternately, an SRAM programmable connection like those shown in FIG. 1 (or one or more other existing alternatives familiar to those reasonably skilled in the art) may be wired in parallel with or used on the same chip with the phase-change programmable connections disclosed herein, such as where faster programming is necessary.

The breakdown layer may have an adequately high resistance so that no significant increase in leakage or battery drain occurs for those programmable connections having a breakdown layer that is not selected and penetrated.

Advantageously, the programmable phase-change memory element, select device (for example, a chalcogenide threshold switch), and optionally a breakdown layer in series with the select device, may be made as a thin-film layers located between conductive lines (such as CX and CY as shown below). This may reduce chip size and/or free up more underlying chip area for logic while still being reversible for improved testability or field repair/changes. The select device may itself include a breakdown layer in series with the select device active material (such as with the threshold switching material). The breakdown layer may be broken down in those programmable connections expected to be used in a given application.

Another embodiment of the invention is an integrated circuit, comprising: a plurality of first conductive lines; a plurality of second conductive lines; and a plurality of programmable connections, each of the programmable connections coupled between one of the first conductive lines and one of the second conductive lines, each of the programmable connections comprising a controllable interconnect device, such as an interconnect transistor, coupled between the first and second conducting lines. The state of the interconnect transistor may be controlled by a control circuit comprising a phase-change memory element in series with a select device. For example, the interconnect transistor may be an MOS transistor having a control gate. The control gate may be directly or indirectly coupled to the control circuit. The select device may, for example, be a transistor, a diode or a threshold switching element. To reduce power, a breakdown layer may be additionally coupled in series between the memory element and select device. The breakdown layer may be broken down on only those programmable connections that need to be programmed.

Another embodiment of the invention is an integrated circuit, comprising: a first conductive line; a second conductive line; a controllable interconnect device coupled between the first and second conductive lines, the interconnect device having a control terminal for controlling the state of the interconnect device; and a control circuit comprising: a phase-change memory element coupled between a first node and a control node, the memory element comprising a phase-change memory material, and an active device coupled between the control node and a second node, the control node coupled to the control terminal of the interconnect device.

Another embodiment of the invention is an integrated circuit, comprising: a first conductive line; a second conductive line; a controllable interconnect device coupled between the first and second conductive lines, the interconnect device having a control terminal for controlling the state of the interconnect device; and a control circuit comprising: a first phase-change memory element comprising a phase-change memory material; and an active device coupled in series with the memory element, the control terminal of the interconnect device coupled to a node between the memory element and the active device. A transistor may be added in series to limit current drain during normal operation (other than when programming the control bit).

Another embodiment of the invention is an integrated circuit, comprising: a first conductive line; a second conductive line; a controllable interconnect device coupled between the first and second conductive lines; a control circuit for controlling the state of the interconnect device, the control circuit comprising a chalcogenide material. The integrated circuit may be a programmable matrix array. The integrated circuit may be a programmable logic device. The chalcogenide material may include a phase-change material. The chalcogenide material may include a threshold switching material. The threshold switching material may be a substantially non phase-change material.

Another embodiment of the invention is an integrated circuit, comprising: a first conductive line; a second conductive line; a controllable interconnect device coupled between the first and second conductive lines; an SRAM device coupled to the interconnect device, the SRAM device comprising a chalcogenide material.

Another embodiment of the invention is an electrical device, comprising: a first conductive line; a second conductive line; a controllable interconnect device coupled between the first and second conductive lines; a control circuit providing a control signal to the interconnect device for controlling the state of the interconnect device, the control circuit comprises at least one phase-change memory element and/or at least one threshold switching element. The controllable interconnect device may be a transistor such as a MOS transistor or a bipolar transistor. The MOS transistor may be an n-channel transistor. The controllable interconnect device may be a three terminal silicon controlled rectifier. The controllable interconnect device may be a three terminal threshold switching element such as a three terminal chalcogenide threshold switching element. The controllable interconnect device may be any type of controllable impedance device. The electrical device may be an integrated circuit. The electrical device may be a programmable matrix array. The electrical device may be a programmable logic device.

Another embodiment of the invention is a programmable matrix array, comprising: a plurality of first conductive lines; a plurality of second conductive lines; a plurality of controllable interconnect devices, each of the interconnect devices coupled between a corresponding first conductive line and a corresponding second conductive line; and a plurality of control cells, each of the control cells controlling the state of a corresponding interconnect device, each of the control cells comprising a chalcogenide material.

Another embodiment of the invention is a programmable matrix array, comprising: a plurality of first conductive lines; a plurality of second conductive lines; a plurality of controllable interconnect devices, each of the interconnect devices coupled between a corresponding first conductive line and a corresponding second conductive line; and a plurality of control cells, each of said control cells controlling the state of a corresponding interconnect device, each of the control cells comprising a phase-change memory element and/or a threshold switching element.

Another embodiment of the invention is a programmable logic device, comprising: a plurality of first conductive lines; a plurality of second conductive lines; a plurality of controllable interconnect devices, each of the interconnect devices coupled between a corresponding first conductive line and a corresponding second conductive line; and a plurality of control cells, each of the control cells controlling the state of a corresponding interconnect device, each of the control cells comprising a chalcogenide material. The chalcogenide material may include a phase-change material. The chalcogenide material may include a threshold switching material. The threshold switching material may be a substantially non phase-change material.

Another embodiment of the invention is a programmable logic device, comprising: a plurality of first conductive lines; a plurality of second conductive lines; a plurality of controllable interconnect devices, each of the interconnect devices coupled between a corresponding first conductive line and a corresponding second conductive line; and a plurality of control cells, each of said control cells controlling the state of a corresponding interconnect device, each of the control cells comprising a phase-change memory element and/or a threshold switching element.

Another embodiment of the invention is a method of operating a programmable logic device, said device including an X line, a Y line, a controllable interconnect device coupled between said X line and said Y line, and a control circuit controlling the state of said controllable interconnect device, said control circuit including a chalcogenide device, said method comprising: providing said controllable interconnect device; providing said control circuit said control circuit include said chalcogenide device; causing said controllable interconnect device to be in a first state by placing said chalcogenide device in a first state; and causing said controllable interconnect device to be in a second state by placing said chalcogenide device in a second state.

BRIEF DESCRIPTION OF THE DRAWINGS

FIG. 4E is an embodiment of a programmable connection of the present invention;

FIG. 5A is an embodiment of a programmable connection of the present invention showing a control circuit that includes a memory element and a threshold switching element;

FIG. 5B is an embodiment of a control circuit of the present invention that includes a memory element without a breakdown layer and a threshold switching element without a breakdown layer;

DETAILED DESCRIPTION OF THE INVENTION

Figure 1:
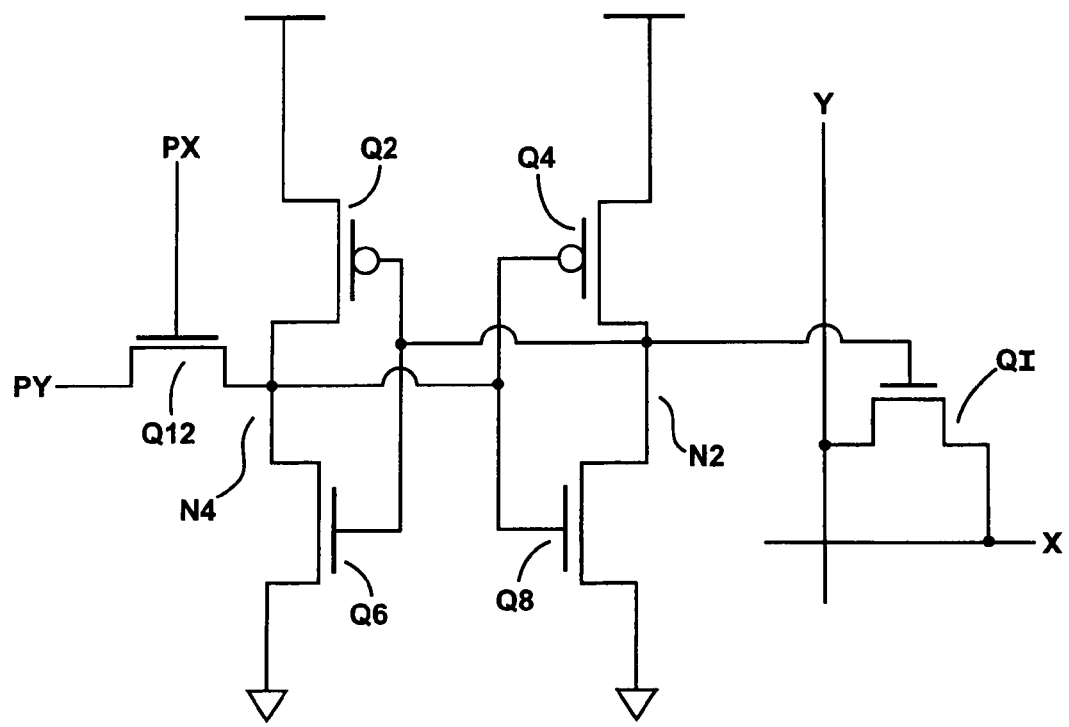
FIG. 1 shows an example of a volatile programmable connection using SRAM technology that drives a cross-point transistor coupled between and X line and a Y line.
Figure 2A:
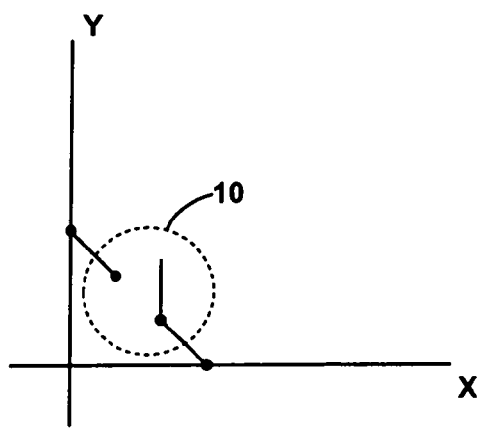
FIG. 2A shows a programmable connection using anti-fuse technology.
Figure 2B:
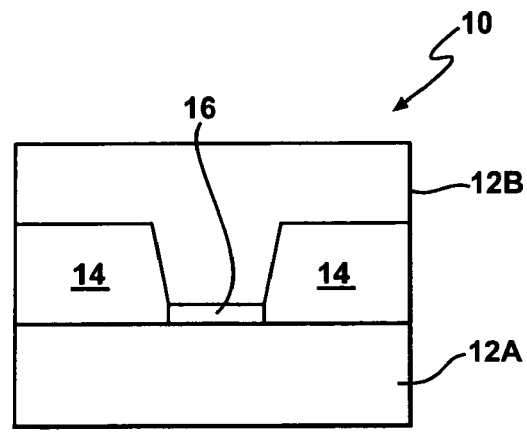
FIG. 2B shows an example of an anti-fuse comprising a breakdown layer.
Figure 3:
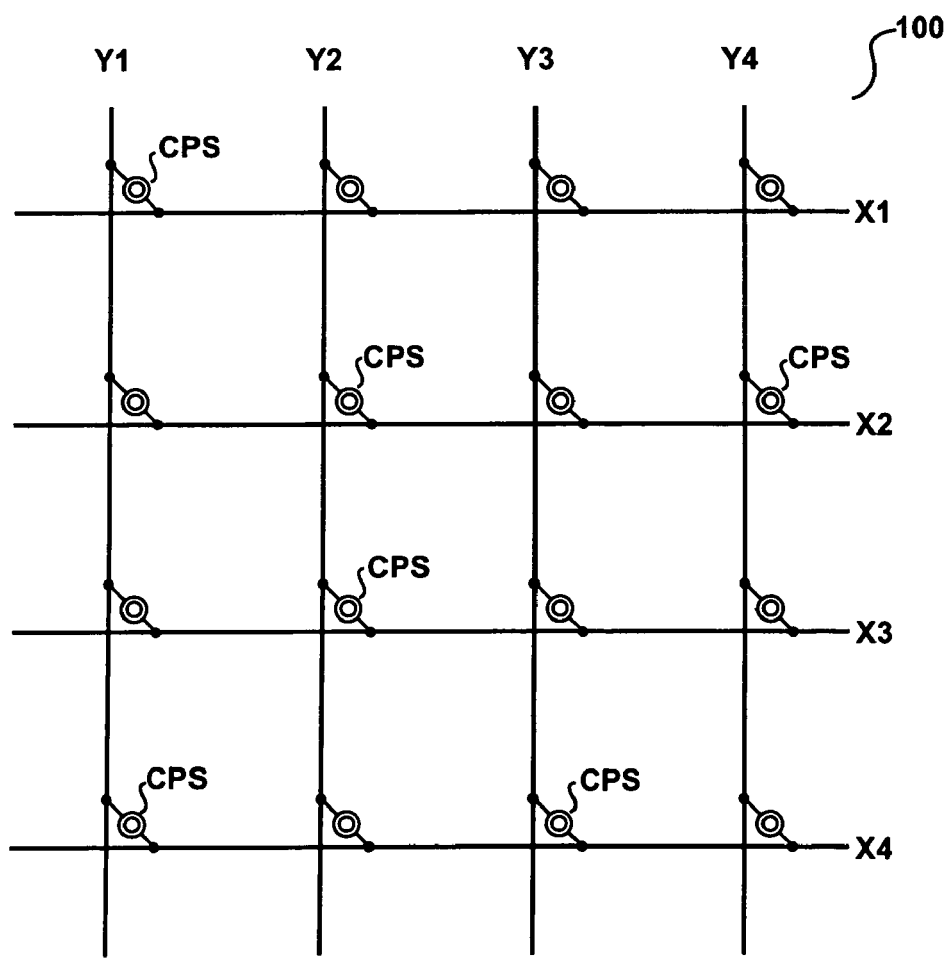
FIG. 3 is an embodiment of a programmable matrix array of the present invention using programmable connections comprising a phase-change material driving a cross-point transistor.

FIG. 3 shows an embodiment of an electrically programmable matrix array 100 of the present invention. The programmable matrix array 100 may be used in a programmable logic device. The matrix array includes a first set of conductive lines X1 through X4 which are also referred to as X lines. The X lines may be row lines or word lines. The matrix array includes a second set of conductive lines Y1 through Y4 which are also referred to as Y lines. The Y lines may be column lines or bit lines. In the example shown (not meant to be limiting), there are four X lines and four Y lines. However, more generally, there may be one or more X lines, and there may be one or more Y lines. In one or more embodiments there may be a plurality of X lines and a plurality of Y lines. In one or more embodiments of the invention, the X lines and the Y lines may be address lines. In one or more embodiments of the invention, it may even be possible that there be more or fewer X lines, and even one or zero X lines. For example, in an embodiment of the invention it may be possible that ground or the power supply may be used instead of a conductive line. In one or more embodiments, it may even be possible that there are similarly more or fewer Y lines, and even one or zero Y lines.

In the embodiment shown in FIG. 3, each of the X lines cross (either over or under) a Y line at an angle. The angle may be substantially 90.degree. (that is, the X lines may be substantially perpendicular to the Y lines). However, other angles are also possible. In one or more embodiments of the invention, the X lines are oriented in one direction while the Y lines are oriented in another direction. The points at which the X and Y lines cross over or under may be referred to as the cross-over points or cross-points. In one or more embodiments of the invention, it is also possible that the X lines do not cross the Y lines.

The embodiment of the matrix array 100 includes a plurality of programmable connections CPS. Each of the programmable connections CPS is coupled between an X line and a Y line.

It is noted that the present invention includes embodiments comprising a first conductive line, a second conductive line and a programmable connection coupled between the first and second conductive lines. The first and second conductive lines may cross each other at some angle. The angle may be about 90 degrees or it may be another angle. The first conductive line may be oriented in a first direction while the second conductive line may be oriented in a second direction. Alternately, the first conductive line may not cross the second conductive line. For example, the first conductive line may simply be adjacent to the second conductive line. Also, they may be even run parallel to each other. The first conductive line may be an X line while the second conductive line may be a Y line.

Likewise, the present invention includes embodiments comprising a plurality of first conductive lines, a plurality of second conductive lines and a plurality of programmable connections where each programmable connection is coupled between a corresponding one of the first conductive lines and a corresponding one of the second conductive lines. The first conductive lines may or may not cross the second conductive lines.

Figure 4A:
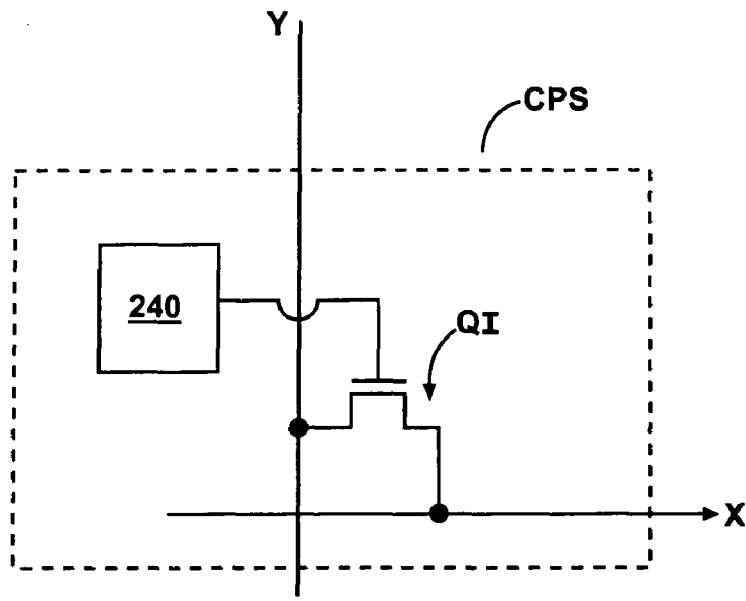
FIG. 4A is an embodiment of a programmable connection of the present invention showing a control circuit driving a cross-point transistor.

An embodiment of a programmable connection of the present invention is shown as programmable connection CPS in FIG. 4A. The programmable connection CPS comprises an NMOS transistor QI coupled between an X line and a Y line. The X line may, for example, be one of X1 through X4 shown in FIG. 3 while the Y line may, for example, be one of Y1 through Y4 shown in FIG. 3. Each programmable connection CPS further comprises a control circuit 240 that is coupled to the gate of the MOS transistor QI. The control circuit 240 controls the state of the transistor QI. When the signal applied to the gate from the control circuit is a high voltage, the NMOS transistor conducts so as to couple the X line to the Y line. And, when the control circuit 240 applies a low voltage to the gate of QI, the NMOS transistor QI is off so as to disconnect the X line from the Y line. In the embodiment shown in FIG. 4A, the control circuit 240 is coupled to the interconnect transistor QI. In one or more embodiments of the invention, the control circuit 240 may not be coupled between the X and Y lines.

The NMOS transistor QI may be replaced with a PMOS transistor. More generally, the NMOS transistor QI may be replaced with any type of controllable interconnect device. A controllable interconnect device may, for example, be a transistor (such as a MOS transistor or a bipolar transistor). The controllable interconnect device may be a silicon controlled rectifier (typically referred to as an SCR). The controllable interconnect device may be a three terminal threshold switching element (such as a chalcogenide three terminal threshold switching element). The controllable interconnect device may be any type of controllable switch. Examples of controllable switches include transistors (such as MOS transistors and bipolar transistors) as well as silicon controlled rectifier (SCR) devices. A controllable switch may be a three terminal switch. One of the terminals may be a control terminal that controls the conduction pathway between the other two terminals.

A controllable interconnect device may be include a control terminal such that the conduction pathway (e.g. the current pathway) through the device is controlled by the control terminal. Hence, in an embodiment of the invention, the controllable interconnect device may include a first, second and third terminal. The conduction pathway may be between the first and second terminals while the third terminal may be used to control the conduction pathway. For example, the third control terminal may be used to control an electrical characteristic of the conduction pathway (such as, for example, its resistance). By altering the conduction pathway, the control terminal may control the amount of current flowing between the first and second terminals.

FIG. 4E shows an example of a controllable interconnect device as a three terminal device. The interconnect device includes a first terminal 200A coupled to the X line, a second terminal 200B coupled to the Y line and a third control terminal 200C coupled to the control circuit 240. The device 200 may have a conduction pathway (for example, a current pathway) between its first terminal 200A and its second terminal 200B. In an embodiment of the invention, the control terminal 200C may be used to control the state of the conduction pathway of the device 200 between the first terminal 200A and the second terminal 200B. For example, the control terminal 200C may be used to control an electrical characteristic of the conduction pathway. As an example, control terminal 200C may be used to control the electrical resistance (or conductance) of the conduction pathway of device 200 between terminals 200A and 200B. The interconnect device 200 may be a controllable impedance device such that the impedance (such as the resistance or conductance) of the conduction pathway may be modified. The state of the connection between the X and Y line may correspond to the resistance of the interconnect device. As an example, a relatively high resistance may correspond to an OPEN connection while a relatively low resistance may correspond to a CLOSED connection.

In an embodiment of the invention, the device 200 shown in FIG. 4E, may, for example, be a three terminal switch. In an embodiment of the invention, the interconnect device 200 may be a transistor (such as a MOS transistor or a bipolar transistor). In an embodiment of the invention, the interconnect device 200 may be a silicon controlled rectifier (SCR). If the device 200 is a MOS transistor, then the first terminal 200A may be the source (or drain) of the transistor, the second terminal 200B may be the drain (or source) of the transistor while the third control terminal 200C may be the gate of the transistor. An example of the case in which the controllable interconnect device is an NMOS transistor is shown in FIG. 4A.

It is conceivable that, in one or more embodiments of the invention, that the conduction pathway of the controllable interconnect device be controlled without the use of a separate control terminal. For example, it may be controlled by some type of energy (such as, for example, thermal, electrical, mechanical, optical or electromagnetic energy) without the need of a separate control terminal.

In the NMOS transistor QI as well as in a PMOS transistor, the gate terminal is an example of a control terminal which may be used to control the current flow between the source terminal and drain terminal. In particular, within each programmable connection, a controllable interconnect device may have a first terminal coupled to a corresponding X line and a second terminal coupled to a corresponding Y line wherein the current flow between the first and second terminal is controlled.

It is noted that the controllable interconnect device may be a circuit comprising one or more electrical elements. The circuit may include two or more electrical elements that are electrically coupled together.

Figure 4B:
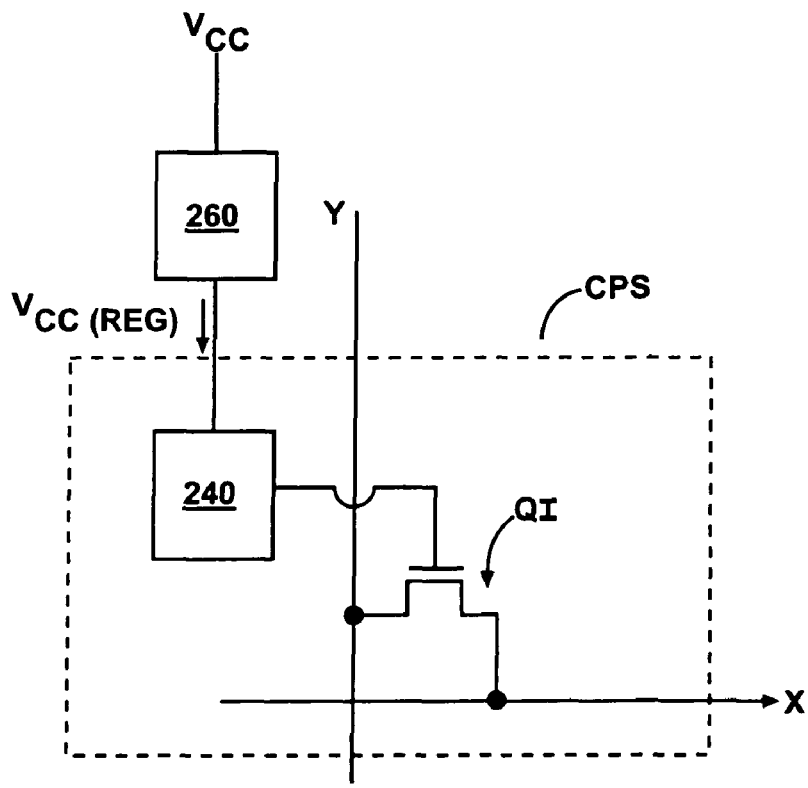
FIG. 4B is an embodiment of a programmable connection of the present invention showing a voltage regulator coupled to a control circuit.

Another embodiment of the invention is shown in FIG. 4B. In this embodiment, a voltage regulator 260 is coupled to the control circuit 240. The voltage regulator receives the power supply voltage Vcc as an input and provides a regulated voltage Vcc(REG) as an output to the control circuit. The regulator may be implemented, for example (without limitation) using a (Widlar) Band-gap regulator, or other alternatives, as are familiar to those reasonably skilled in the art. The output voltage may be relatively independent of the fluctuations of the power supply and controllable TC (temperature coefficient). The output voltage versus temperature may be appropriately programmed to fit the requirements of the appropriate control circuit 240, using familiar techniques that may be optimized for both voltage and TC (temperature coefficient) that are engineered for normal use and programming.

For those control circuits using a chalcogenide material in the memory element and/or select device (such as a threshold switching element), proper operation may depend upon certain voltages applied across either the memory element and/or threshold switching element staying below, for example, threshold voltages. A voltage regulator may be useful to ensure that voltages applied across chalcogenide devices are regulated. A regulated voltage such as Vcc(REG) may be utilized in series between the power supply and the element or memory in the control circuit 240.

Similarly, a voltage regulator may be used to provide a reduced as well as controlled voltage to the logic section of the PLA (or FPLA or FPGA). That is the logic driving and receiving signals from the X line and/or Y line may be driven by a Vcc(REG) from the voltage regulator, which may be at a reduced level relative to Vcc to the chip.

Figure 4C:
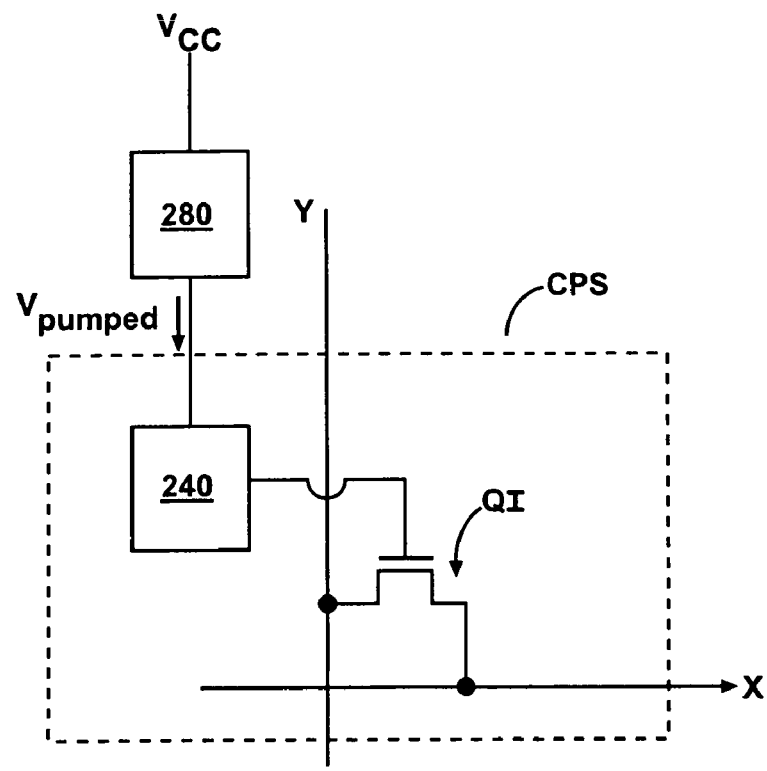
FIG. 4C is an embodiment of a programmable connection of the present invention showing a charge pump coupled to a control circuit.

Another embodiment of the invention is shown in FIG. 4C where a charge pump 280 is coupled to the control circuit 240. Similarly, a pumped voltage can be supplied to the logic section. The charge pump receives a voltage such as Vcc as an input and provides a pumped up voltage Vpumped, which is greater than Vcc, as an output. The resulting voltage to either the control circuit 240 or logic section may also be regulated, and either or both may be driven by the pumped, regulated, or regulated pumped voltage.

Figure 4D:
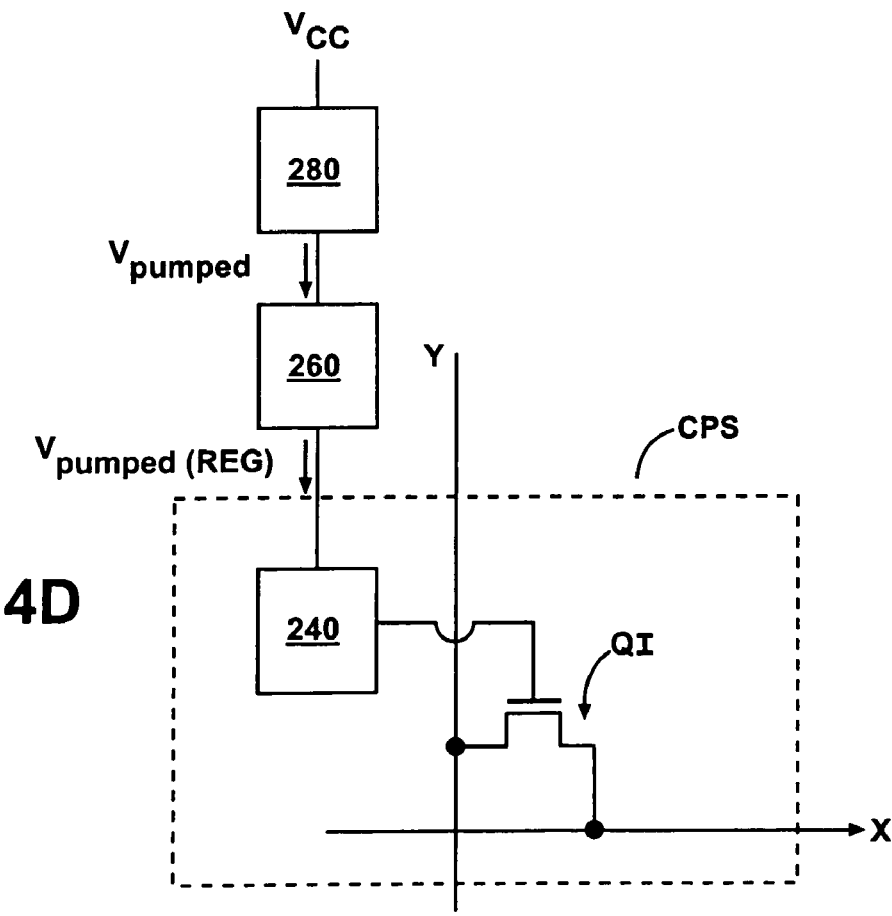
FIG. 4D is an embodiment of a programmable connection of the present invention showing a charge pump coupled to a regulator coupled to a control circuit.

Another embodiment of the invention is shown in FIG. 4D where a charge pump 280 provides a voltage Vpumped to a regulator 260 which provides a regulating pumped voltage Vpumped(REG) to the control circuit 240. Similarly a pumped and/or regulated voltage can be provided to the logic section.

A charge pump may be useful when a higher voltage is needed than that which can be supplied by the chip voltage supply. For example, it may be desirable to use a programming voltage which is higher than the normal operating voltage during programming of the control circuit 240.

Also, it may be desirable, to have a voltage applied as the output of the control circuit 240 that is greater than the voltage supplied to drive the logic gates coupled to the X and/or Y lines. For example, if the high level from the control circuit 240 into the gate of QI is Vcc(logic)+Vt(transistor QI)+Von (transistor QI), then when transistor QI is to be on (gate voltage high for NMOS), the QI transistor may be on over the full range of logic swing for drivers into the X and/or Y lines.

An embodiment of a programmable connection of the present invention is shown in FIG. 5A. FIG. 5A shows an NMOS transistor QI coupled between an X line and a Y line. The X line and Y line may belong to a first programmable matrix array.

Referring to the embodiment of the invention shown in FIG. 5A, the control circuit 240 comprises a CY line, a CX line and a control cell 242 coupled between the CY line and CX line. The control cell 242 includes a memory element M in series with a threshold switching element T. Line CZ is coupled between node NZ and the gate of transistor QI. The memory element M is coupled between the CY line and the node NZ. The threshold switching element T is coupled between the node NZ and the CY line. The positioning of the memory element and threshold switching element may be reversed so that the memory element is coupled between line CX and node NZ while the threshold switch is coupled between line CY and node NZ. In one or more other embodiments, the CX and CY lines may be interchanged. (In additional embodiments of the invention, it is conceivable that threshold switching element T be replaced with a transistor or a diode. The transistor may be a MOS transistor. Likewise, in additional embodiments of the invention, it is conceivable that the memory element M be replaced with a transistor or a diode. The transistor may be a MOS transistor).

The phase-change memory element M comprises a phase-change memory material. The memory element may further include one or more electrodes for providing an electrical signal to the memory material. The phase-change material may be any phase-change material, as are familiar to those reasonably skilled in the art. The phase-change material may be a chalcogenide material. An example of a chalcogenide material that may be used as a phase-change material is $Ge_2Sb_2Te_5$. This alloy is also referred to as GST 225. Other examples of phase-change materials which may be used as memory materials are discussed in U.S. Pat. Nos. 5,166,758, 5,296,716, 5,341,328, 5,359,205, 5,406,509, 5,414,271, 5,534,711, 5,534,712, 5,536,947, 5,596,522, 5,825,046 and 6,087,674, all of which are hereby incorporated by reference herein.

It is noted that for each of the embodiments described herein, additional embodiments of the invention may be formed by replacing the phase-change memory element M with any type of programmable resistance memory element which is programmable between at least a first and second resistance state, whether volatile or non-volatile. Likewise, a phase-change material may be replaced with another type of programmable resistance material (which may not be a phase-change material).

The threshold switching element T comprises a threshold switching material. The threshold switching element T may further include one or more electrodes for providing an electrical signal to the threshold switching material.

In one or more embodiments of the present invention, the threshold switching material may be a chalcogenide material. Any chalcogenide threshold switching material may be used in the present invention. One or more of the chalcogenide threshold switching materials may not readily crystallize with the addition of energy (but there may be some crystallization) while one or more of the chalcogenide threshold switching materials may not crystallize at all with the addition of energy. In one or more embodiments of the present invention, the threshold switching material (such as the chalcogenide threshold switching material) may be an essentially non phase-change material.

An example of a chalcogenide alloy which is useful as a threshold switching material is the alloy $Si_{14}Te_{39}As_{37}Ge_9X_1$ where X may be element In or the element P. In one or more embodiments of the invention, the threshold switching material may be an S-type threshold switching material. In one or more embodiments of the invention, the S-type material may be a chalcogenide material. In one or more embodiments of the invention, the S-type material may not be a chalcogenide material. The threshold switching material may be in series with the memory material between the CY line and the CX line.

The threshold switching element T is an example of an access device. In other embodiments of the invention, the threshold switching element T may be replaced with another form of access device, such as a transistor or a diode. Likewise, in other embodiments of the present invention, the threshold switching element T may be replaced with some other type of active device.

The order of coupling the transistor QI to the X and Y lines may be reversed. The gate of the transistor QI is coupled to node NZ between the memory element M and the threshold switching element T. The order of memory element M and threshold switching element T may be reversed, or the lines CX and CY may be reversed. In the embodiment shown, it is possible that line CY may be coupled to a fixed voltage, to a ground potential, to an unregulated voltage (such as an unregulated power supply), or to a regulated voltage (such as a regulated power supply). Line CX may be coupled to a fixed voltage, a ground potential, an unregulated voltage (such as an unregulated power supply) or a regulated voltage (such as a regulated power supply).

Figure 15A:
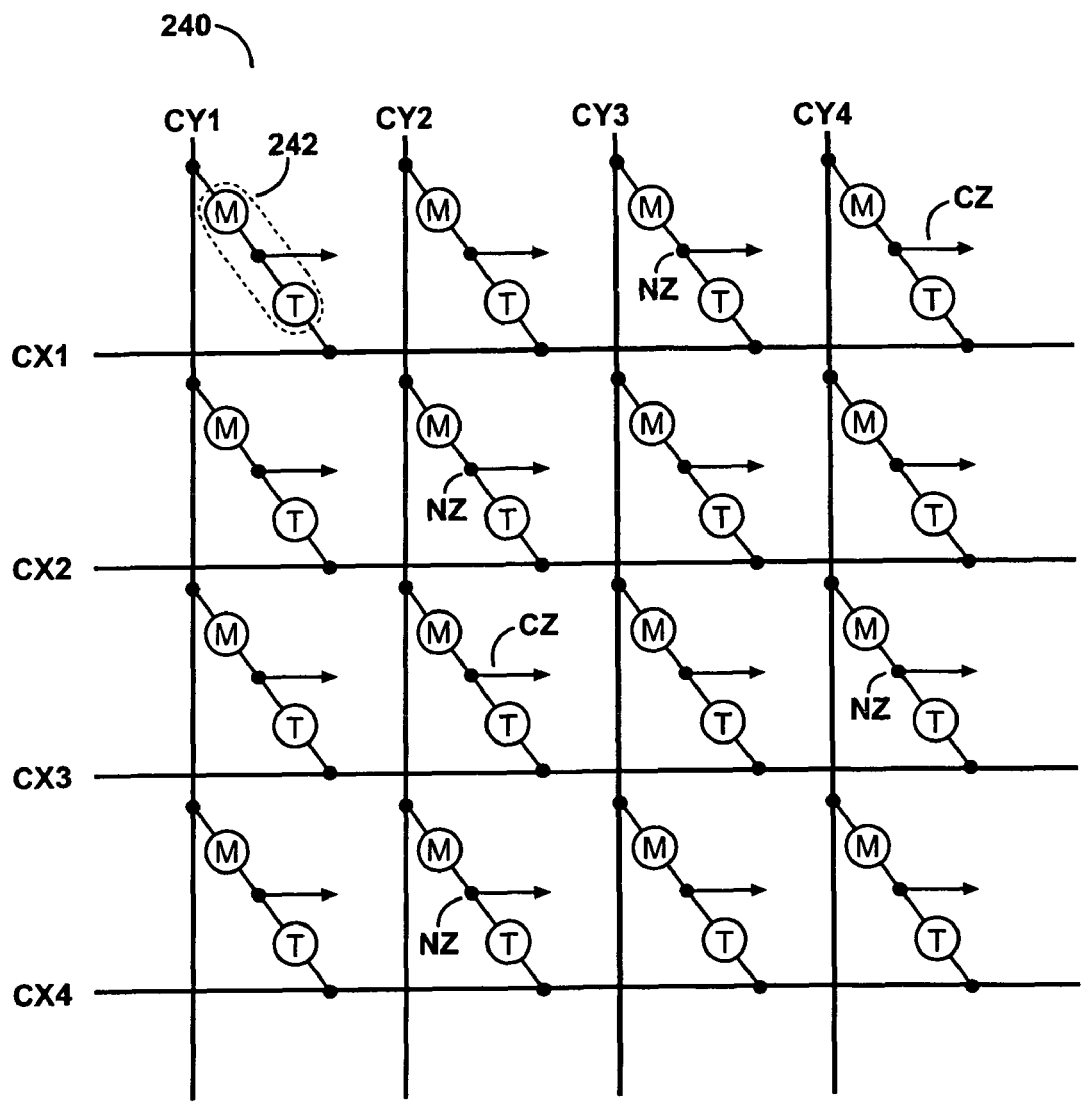
FIG. 15A shows an embodiment of a control circuit of the present invention including a four by four matrix of control cells where each control cell includes a memory element in series with a threshold switching element.
Figure 30A:
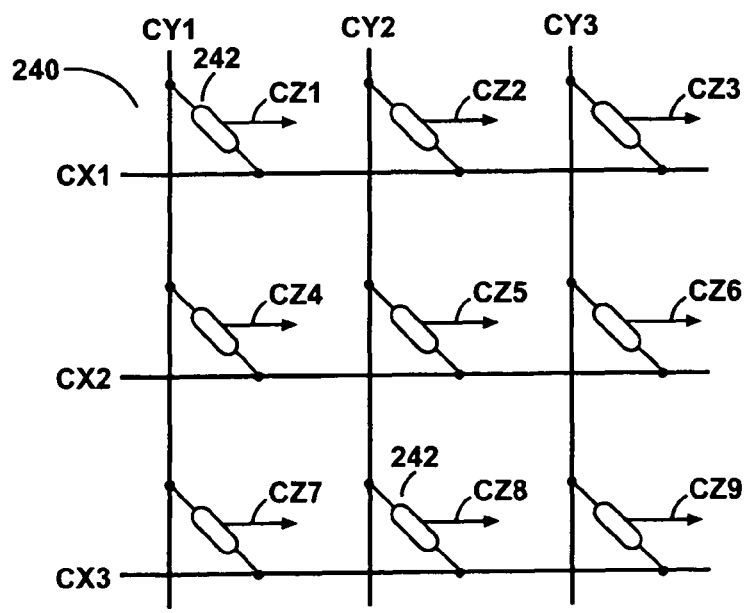
FIG. 30A shows an embodiment of a control circuit of the present invention comprising an array of control cells with CX lines and CY lines.
Figure 30B:
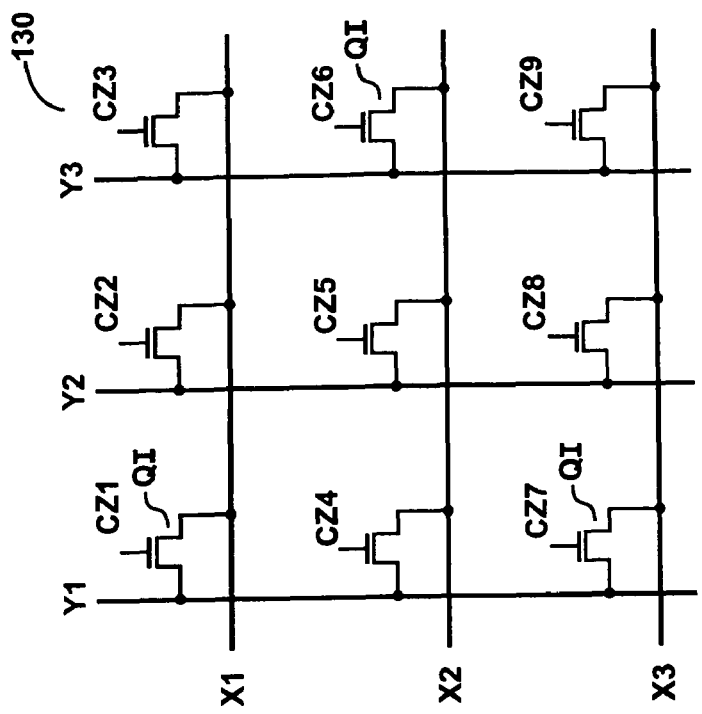
FIG. 30B shows an embodiment of a control circuit of the present invention including a three by three array of control cells where each control cell is providing a control signal to a corresponding interconnect transistor of an X-Y array.
Figure 30B:
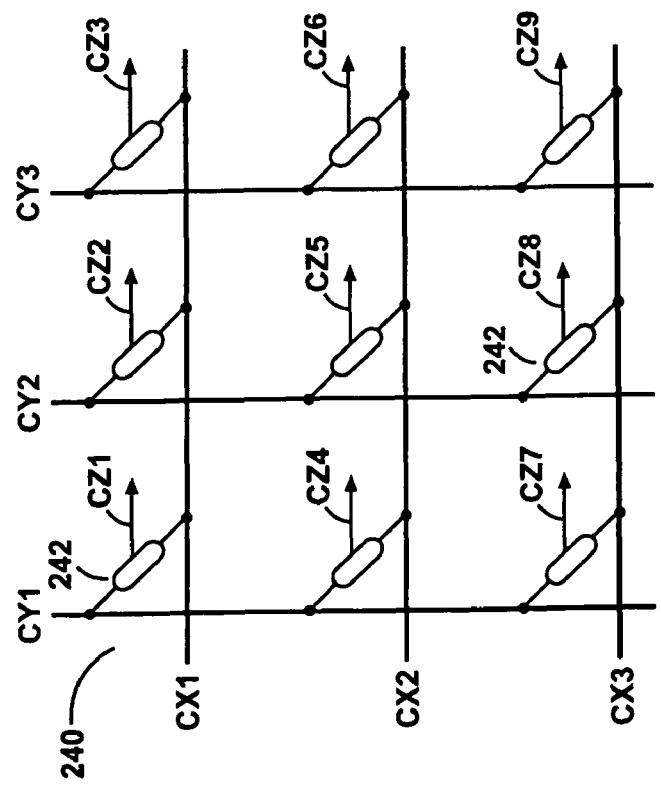
Figure 30C:
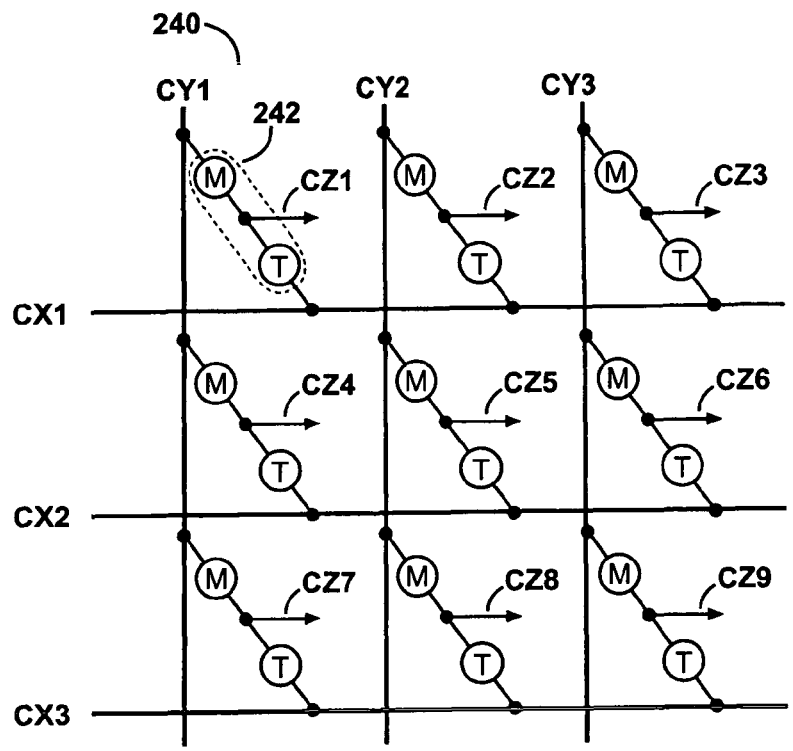
FIG. 30C shows an embodiment of a control circuit of the present invention comprising an array of control cells with CX lines and CY lines.

It is noted that the line pair (X,Y) may belong to a first matrix array (such as the one shown in FIG. 3). The line pair (CX, CY) may belong to a separate second matrix array that is part of the control circuit 240. The CX and CY lines may be used to program the control cell 242 so that output control signals are produced on line CZ that control the state of the controllable switching elements coupled between respective interconnect X and Y lines. Hence, the line pair (CX, CY) may be part of a larger CX-CY matrix array as shown in FIG. 15A. Additional examples, of CX-CY arrays are shown in FIGS. 30A, 30B and 30C. FIG. 15A shows a control circuit 240 comprising a CX-CY matrix array with four CX lines CX1-CX4 and four CY lines CY1-CY4. In one or more embodiments of the invention, there may be at least one CX line and at least one CY line. In one or more embodiments of the invention, there may be a plurality of CX lines and a plurality of CY lines. In an embodiment of the invention the CX lines may be coupled to a low voltage or ground. In an embodiment of the invention the CY lines may be coupled to a low voltage or ground. In one or more embodiments of the invention, the CX lines and the CY lines may be address lines.

In the embodiment shown in FIG. 15A, the CX lines are oriented in a first direction while the CY lines are oriented in a second direction different from the first direction. The CX lines may be perpendicular to the CY lines. The CX lines may cross the CY lines at some angle that is not perpendicular. In one or more embodiments, the CX lines may cross (either over or under) the CY lines. Likewise, in one or more embodiments, the CX lines do not have to cross the CY lines. For example, a CX line may simply be adjacent to a CY line (it is possible that they are on the same level from the substrate). In the embodiment shown, one or more of the CX lines crosses over or under one or more of the CY lines. In the embodiment shown in FIG. 15A, each memory element M is coupled in series with a corresponding threshold switch T. A control node NZ may be coupled to a respective control terminal of a controllable switch that coupled between an X line and a Y line.

Figure 15B:
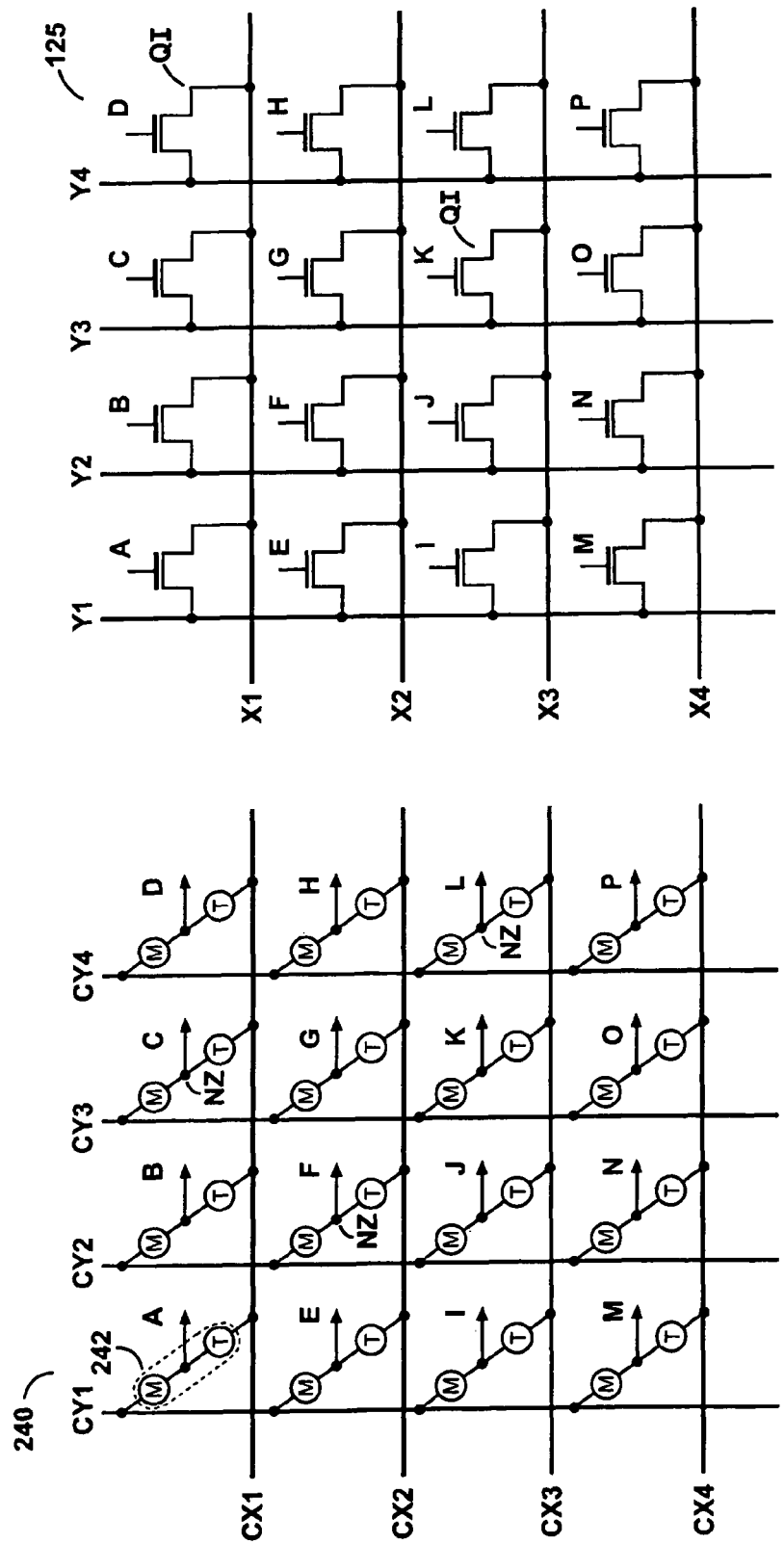
FIG. 15B shows an embodiment of a control circuit of the present invention including a four by four matrix of control cells where each control cell is providing a control signal to a corresponding interconnect transistor.

An embodiment of the present invention showing a possible relationship between the control CX-CY matrix and an X-Y matrix of controllable switching elements is shown in FIG. 15B. FIG. 15B shows a four by four array of control cells 242 (with CX-CY lines). Each of the control cells 242 provides a corresponding output line A through P. Each of the output lines A through P is coupled to the corresponding gate A through P of a corresponding transistor QI which is coupled between corresponding X and Y lines of the X-Y matrix. The size of the X-Y array and the size of the CX-CY array is not limited to any particular size.

In the embodiment of the control circuit 240 shown in FIG. 15A, the control circuit is in the form of an array of control cells 242. Each control cell 242 includes a memory element M in series with a threshold switching element T. A threshold switching element may also be referred to as a threshold switch. In one or more embodiments of the invention, the threshold switching element T may be replaced with another type of access device such as a transistor or a diode, or a threshold switching element T in series with a transistor or diode. In addition, in one or more embodiments of the invention, a control cell may be formed using a memory element coupled between a CX line and a CY line without an access device. In one or more embodiments a memory element M may be in series with a threshold switching element T. In one or more embodiments, the memory element M may be in series with a threshold switching element T and a controllable current source such as a transistor (for example, a p-channel transistor with gate controlled by a current mirror or regulator). Into any of these embodiments, a transistor may be placed in series and/or in parallel with the memory element and/or the threshold switching element.

Referring to the embodiment shown in FIG. 15B, it is noted that the X-Y matrix 125 in combination with the control circuit 240 may be used to form a programmable matrix array such as the array 100 shown in FIG. 3. Likewise, the X-Y matrix 125 in combination with the control circuit 240 may be used in a programmable logic device.

In one or more embodiments of the invention, the control signals may be taken from a node other than the node NZ. In one or more embodiments an additional control signal may control an additional transistor coupled across the X and Y lines.

Referring again to FIG. 5A, the control node NZ is coupled to the gate of transistor QI via conductive line CZ. Hence, the approximate voltage on node NZ is applied to the gate of transistor QI and controls the state of the transistor, and therefore the resistance of QI from source to drain between the couplable interconnect. The voltage at node NZ may be referred to as Vnz. The voltage at node NZ may be also be referred to as Vgate since, in the embodiment shown, the voltage at node NZ is applied to the gate of the transistor QI.

NMOS transistor QI is ON when Vnz is high, thereby creating a CLOSED connection between the X line and the Y line. NMOS transistor is OFF when Vnz is low, thereby creating an OPEN connection between the X line and the Y line. If a PMOS transistor is used instead of NMOS as the cross-connect transistor, then the PMOS transistor will be ON when the voltage Vnz is low and OFF (OPEN connection) when the voltage Vnz is high.

As noted, transistor QI may be replaced with another type of controllable interconnect device. In an embodiment of the invention, the controllable interconnect device preferably includes a first and second terminal whereby the electrical current pathway within the device is between the first and second terminals. The interconnect device may also include a control terminal which controls the current pathway (for example, the impedance of the pathway) so that more or less current can flow between the first and second terminals. Hence, the first terminal of the interconnect device may be coupled to the Y line (or the X line), the second terminal of the interconnect device may be coupled to the X line (or Y line), and the control terminal of the counterconnect device may be coupled to the node NZ. As noted, an example of a controllable interconnect device that may be used (instead of a MOS transistor) is a bipolar transistor or an SCR device (a silicon controlled rectifier).

One or more breakdown layers may be placed in series with the memory material of memory element M or select device T. This may be done in several different ways. The memory element M may be formed with or without a breakdown layer. Likewise, the threshold switching element T may be formed with or without a breakdown layer. When a memory element is formed with a breakdown layer, the breakdown layer is preferably formed in series with the memory material. Likewise, when a threshold switch is formed with a breakdown layer, the breakdown layer is preferably formed in series with the threshold switching material.

Figure 5C:
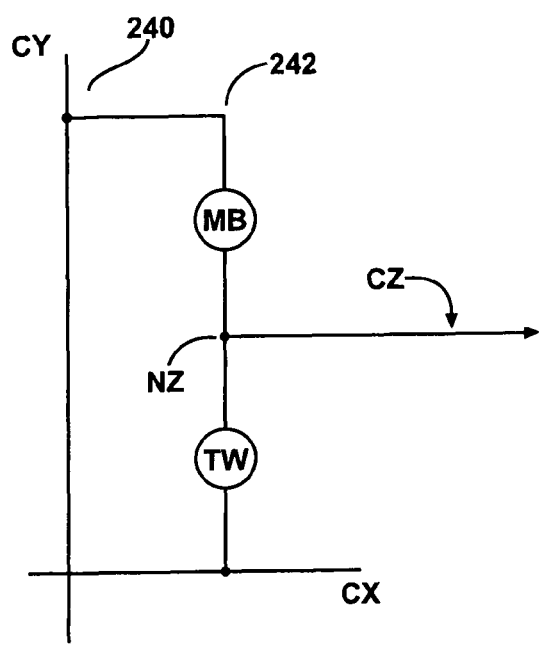
FIG. 5C is an embodiment of a control circuit of the present invention that includes a memory element with a breakdown layer and a threshold switching element without a breakdown layer.
Figure 5D:
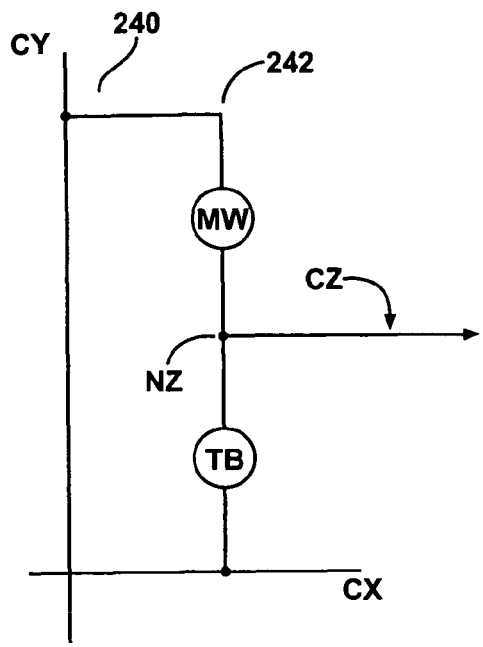
FIG. 5D is an embodiment of a control circuit of the present invention that includes a memory element without a breakdown layer and a threshold switching element with a breakdown layer.
Figure 5E:
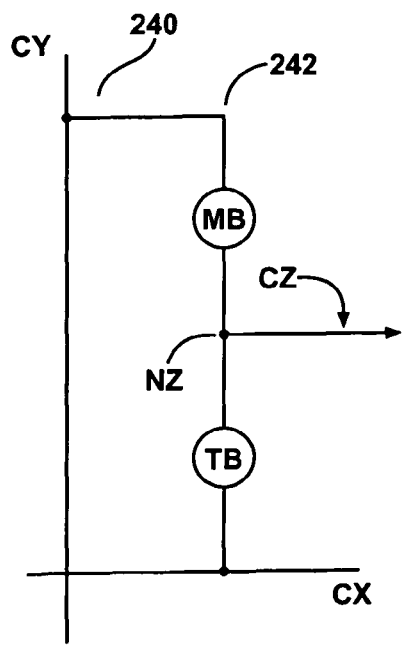
FIG. 5E is an embodiment of a control circuit of the present invention that includes a memory element with a breakdown layer and a threshold switching element with a breakdown layer.

FIGS. 5B through 5K show additional embodiments of control circuits of the present invention. FIG. 5B shows an embodiment of a control circuit 240 of the present invention including a control cell 242 comprising a memory element MW formed without a breakdown layer and a threshold switch TW formed without a breakdown layer. FIG. 5C shows an embodiment of a control circuit 240 of the present invention including a control cell 242 comprising a memory element MB formed with a breakdown layer and a threshold switch TW formed without a breakdown layer. FIG. 5D shows an embodiment of a control circuit 240 of the present invention including a control cell 242 comprising a memory element MW formed without a breakdown layer and a threshold switch TB formed with a breakdown layer. FIG. 5E shows an embodiment of a control circuit 240 of the present invention including a control cell 242 comprising a memory element MB formed with a breakdown layer and a threshold switch TB formed with a breakdown layer.

As used herein, a memory element "M" may or may not include a breakdown layer, a memory element "MW" does not include a breakdown layer, a memory element "MB" includes a breakdown layer. Likewise, a threshold switch "T" may or may not include a breakdown layer, a threshold switch "TW" does not include a breakdown layer, and a threshold switch "TB" includes a breakdown layer.

Figure 5F:
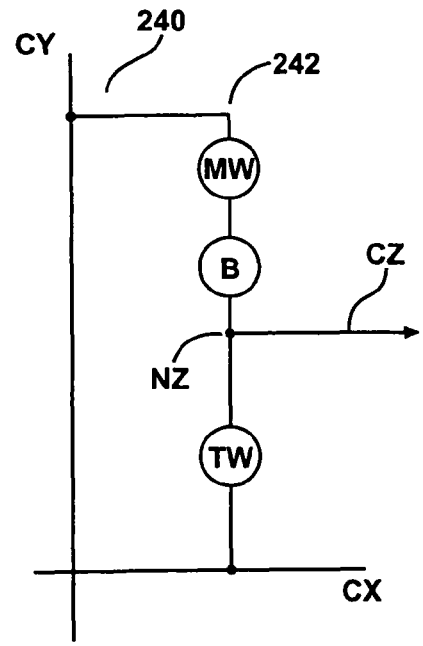
FIG. 5F is an embodiment of a control circuit of the present invention that includes a memory element without a breakdown layer, a breakdown device and a threshold switching element without a breakdown layer.
Figure 5G:
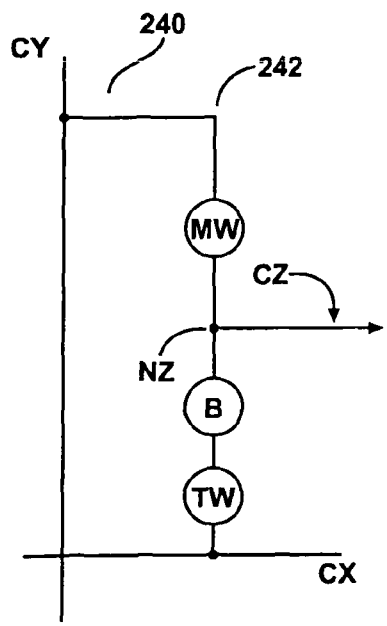
FIG. 5G is an embodiment of a control circuit of the present invention that includes a memory element without a breakdown layer, a breakdown device and a threshold switching element without a breakdown layer.
Figure 5H:
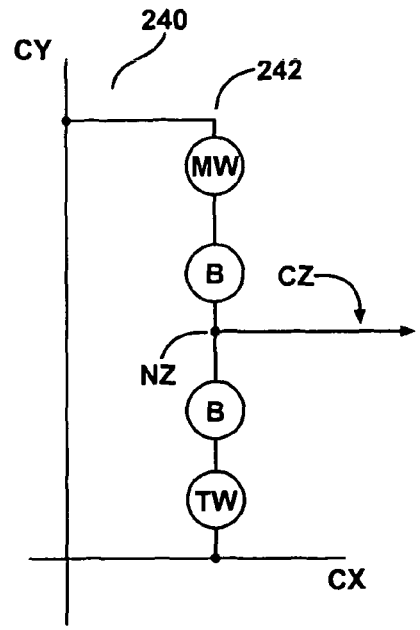
FIG. 5H is an embodiment of a control circuit of the present invention that includes a memory element without a breakdown layer, a first breakdown device, a second breakdown device and a threshold switch without a breakdown layer.

A breakdown layer may thus be introduced in series with the memory material and/or in series with the threshold material by incorporating it in the memory element and/or the threshold switch. This may be done, for example, within the electrode or in series with the electrode as an additional layer. Alternately, it is possible to introduce a breakdown layer into the control circuit 240 by adding a separate breakdown device, such as an anti-fuse, wired in series with the memory element and/or the threshold switch. FIG. 5F shows an embodiment of the control circuit 240 of the present invention including a control cell 242 comprising a memory element MW (without a breakdown layer) in series with a breakdown device B between the CY line and node NZ. The control cell 242 further comprises a threshold switching element TW (without a breakdown layer) coupled between node NZ and the CX line. FIG. 5G shows an embodiment of a control circuit 240 of the present invention including a control cell 242 comprising a breakdown device B in series with a threshold switch TW (without a breakdown layer) between node NZ and the CX line. The same control cell 242 further comprises a memory element MW (without a breakdown layer) coupled between the CY line and node NZ. FIG. 5H is an embodiment of a control circuit 240 including a control cell 242 comprising a breakdown device B in series with a memory element MW between the CY line and node NZ. The same control cell 242 further comprises another breakdown device B in series with threshold switch TW. In each of the embodiments of the present invention shown in FIGS. 5F, 5G and 5H, the memory element MW (without a breakdown layer) may be replaced with a memory element MB (with a breakdown layer). Likewise, the threshold switch TW (without a breakdown layer) may be replaced with a threshold switch TB (with a breakdown layer).

The breakdown layer may be any dielectric or insulative material known in the art. For example, the dielectric material may comprise any oxide, nitride, oxynitride or combination thereof. The dielectric material may be oxide of aluminum or an oxide of silicon. The dielectric may be a nitride of aluminum or a nitride of silicon. Examples include silicon nitride, $SiO_2$, $Si_3O_4$ and $Al_2O_3$. In one embodiment, the breakdown layer may be formed of a material comprising the elements silicon, nitrogen and hydrogen. In another embodiment, the breakdown layer may be formed of a material comprising, in atomic percent, between about 30-40% silicon, 40-50% nitrogen and up to 30% hydrogen. The breakdown layer may comprise amorphous silicon. For example, an amorphous silicon breakdown layer may be used in an anti-fuse.

In the present invention, the thickness of the breakdown layer is not limited to any particular thickness. In one or more embodiments, the breakdown layer may have a thickness between about 10 Angstroms and about 200 Angstroms as necessary to support the voltage until puncturing the breakdown layer is desired. In one or more embodiments, the breakdown layer may have a thickness between about 20 Angstroms and about 100 Angstroms. In one or more embodiments, the breakdown layer may have a thickness between about 40 Angstroms and about 60 Angstroms. In one or more embodiments, the breakdown layer may have a thickness of about 50 Angstroms. The thickness used may vary depending upon the selection of operating power supply range and margin against transients that is desired before the breakdown layer or select device is triggered.

The material used for the breakdown layer as well as the thickness of the breakdown layer may be chosen so that the breakdown voltage across the breakdown layer is about 6 volts or less (preferably for power supplies of 4 volts or less). The material for the breakdown layer as well as the thickness of the breakdown layer may be chosen so that the breakdown layer has a resistance of about 2,000 ohms or less after the breakdown layer is broken down (punctured into a short or low resistance).

The breakdown layer may have a high melting point and a low chemical reactivity. The resistivity of the breakdown layer may be between about $10^{12}$ to about $10^{17}$ ohm-cm. Silicon nitride may be preferred for improved integrity. $Al_2O_3$, for example, in the 20-40 Angstrom range, may be preferred for its higher melting point and reduced drift in device characteristics, such as reset current. Depending on whether done in-situ or deposited at the time between depositing the layers, dilute HF dip may desirably remove a native oxide. Such thickness and material may be engineered by those reasonably skilled in the art, depending on the breakdown voltage desired. Desirable variations in this layer material and adjacent electrodes for different applications will be apparent to one reasonably skilled in the art. Conversely, a fuse may be used instead of a breakdown layer or antifuse using techniques familiar to those reasonably skilled in the art.

Referring to the embodiments shown in FIGS. 5A through 5H, before any breakdown layer is broken down, the breakdown layer may be used to limit (and may almost eliminate) leakage through or across the control cell 242. If a breakdown layer exists (and before it is broken down) the voltage at node NZ, the state of the transistor QI as well as the state of the connection between the X line and Y line may be determined by the appropriate placement of the breakdown layer relative to the CY line, the CX line and the node NZ. For example, as shown in FIGS. 5C and 5F, the breakdown layer may be placed between the node NZ and the CY line. Likewise, as shown in FIGS. 5D and 5G, the breakdown layer may be placed between node NZ and the CX line.

As an example, assume as in FIG. 5C that a breakdown layer is present between node NZ and the CY line. In one embodiment of operating the control circuit, the CX line may be made high during normal logic operation while CY may be made low (or ground). If this is the case, then most of the voltage may be dropped across the breakdown layer so that the voltage at node NZ is high and the transistor QI is normally on so that the connection between the X and Y lines remains CLOSED when the breakdown layer is left unpopped (not broken down).

As another example, assume as in FIG. 5D that a breakdown layer is present between node NZ and the CX line and has not been broken down. Again, in one embodiment of operating the control circuit, the CX line may be kept high during normal logic operation while the CY line may be kept low (or ground) during normal logic operation. If this is the case, then most of the voltage drop is across the breakdown layer so that the voltage Vnz on node NZ should be normally low and the transistor QI should be normally off so that the connection between the Y line and X line remains OPEN when the breakdown layer is left unpopped (not broken down).

It is, of course, conceivable that, in one or more embodiments of operating the control circuits of the present invention, that the voltages applied to the CX lines and the CY lines be reversed so that the CX line may be made low (or ground) during normal logic operation while the CY line may be made high during normal logic operation. In this case, the voltage at node NZ may be low (and the connection OPEN) when the breakdown layer is between NZ and CY (such as shown in FIG. 5C). Likewise, the voltage at node NZ may be high (and the connection between X and Y CLOSED) when the breakdown layer is between NZ and CX (such as shown in FIG. 5D).

Thus, the choice of having the connection between an X and Y line as normally OPEN or normally CLOSED may be determined by the relative placement of the breakdown layer relative to the node NZ, the CX line and the CY line. Likewise, the choice of having the connection as normally OPEN or CLOSED may be made by placing the appropriate voltages on the CX and CY lines during normal logic operation. For certain applications it may be desired that transistor QI may be normally off and the connection between the X and Y lines may be normally OPEN.

Referring to the embodiment of the control circuit shown in FIG. 5A, if there is no breakdown layer or if any breakdown layer has already broken down, then the voltage at node NZ, the state of transistor QI as well as the state of the connection between the X line and Y line may be controlled by programming the memory element M between its low resistance set state and its high resistance reset state.

Referring to the embodiment of the invention shown for example in FIG. 5A, it may be the case, as an example, that either no breakdown layer has been added or that any added breakdown layer has been broken down. In this case, the voltage at node NZ may be controlled by programming the memory element M back and forth between its low resistance state (e.g. set state) and its high resistance state (e.g. reset state). An example of a method of programming the memory element M between its set and reset states is to apply a programming voltage Vp across the control lines (CX and CY) of the selected target control bit to be programmed. The programming voltage Vp should be sufficient to trigger the threshold switching element T into its on state. An appropriate current may be applied through the memory element M for programming the memory element M to the state of choice. For example, the state of the memory element may be controlled by controlling the amplitude and/or duration and/or trailing edge of an applied current pulse.

The programming voltage Vp may be chosen to be greater than the sum of the threshold voltage of the threshold switching element T and the threshold voltage of the memory element M. Hence, as an example, we may choose Vp greater than Vth(T)+Vth(M) where Vth(M) is the threshold voltage of the memory element in its high resistance or reset state. Vp may be greater than the normal logic operating voltage Vcc so that a charge pump may be used to create a voltage Vp higher than Vcc.

There are many different ways of operating the control circuit 240 shown in FIG. 5A when, for example, there is either no breakdown layer or that any breakdown layer has already been broken down.

In one or more embodiments of the present invention, the resistance of the threshold switching element in its off state (without any breakdown layer) may be greater than the resistance of the memory element in its reset state (without any breakdown layer). For example, in one or more embodiments of the present invention, the resistance of the threshold switching element in its off state (without any breakdown layer) may be around 10 to around 20 times greater than the resistance of the memory element in its reset state (without any breakdown layer).

The threshold voltage Vth(T) of the threshold switching element may be made less than the magnitude of the voltage difference between the CX and CY lines during normal logic operation (for example, when the memory element is not being programmed). In addition, the sum of Vth(T)+Vth(M) may be made to be greater than the magnitude of the voltage difference between the CX and CY lines during normal logic operation (where Vth(T) is the threshold voltage of the threshold switching element while Vth(M) is the threshold voltage of the memory element in its high resistance or reset state). These operating conditions may be expressed as follows: Vth(T)<|VCX−VCY|<Vth(T)+Vth(M) (1) where |VCX−VCY| represents the magnitude of the difference between the voltage on the CX line and the voltage on the CY line during normal logic operation.

In one example, during normal logic operation, the CX line may be held at a voltage of about Vcc+Vh(T)+Vt(n-channel) where Vh(T) is the holding voltage of the threshold switching element T and Vt(n-channel) is the threshold voltage of the n-channel transistor QI. The CY line may be held at a voltage of about 0 volts (e.g. ground). The voltage difference between the CY and CX lines may thus be expressed as Vcc+Vh(T)+Vt(n-channel). That is, |VCX−VCY|=Vcc+Vh(T)+Vt(n-channel) (2) The operating condition (1) may thus be expressed as follows: Vth(T)<Vcc+Vh(T)+Vt(n-channel) <Vth(T)+Vth(M) (1') where Vth(T) is the threshold voltage of the threshold switching element and Vth(M) is the threshold voltage of the memory element in its high resistance or reset state.

If the operating condition (1') is satisfied, then when the memory element is in its set state, the magnitude of the voltage across the CX and CY lines (which is Vcc+Vh(T)+Vt(n-channel)) should be sufficient to turn on the threshold switching element T. In addition, the voltage at node NZ should be about Vcc+Vt(n-channel). This voltage should be sufficient to keep transistor QI on (and the connection between the X and Y lines CLOSED) during the full logic swing.

However, when the memory element is in its reset state, the magnitude of the voltage across the CX and CY lines (being less that Vth(T)+Vth(M)) is not be sufficient to turn on the threshold switching element T. The threshold switching element T is thus turned off so that its resistance is high. Since, in this embodiment, it is assumed that the resistance of the threshold switching element T in its off state is much greater than the resistance of the memory element M in its reset state, most of the voltage drop is across the threshold switching element T and the voltage at node NZ is low (for example, close to 0V or ground). In this case, the transistor QI is turned off and the connection between the X and Y lines is OPEN.

In another embodiment of the present invention, it is conceivable that the resistance of the threshold switching element in its off state (without a breakdown layer) may be made less than the resistance of the memory element in its reset state (without a breakdown layer). As an example, it is conceivable that the resistance of the threshold switching element in its off state may be made to be around, 100 K ohms (that is, about 100,000 ohms), the resistance of the memory element in its reset state may be made to be around 10M ohms (that is, about 10,000,000 ohms), and the resistance of the memory element in its set state may be made to be around 10 K ohms (that is, about 10,000 ohms). Referring again to the embodiment shown in FIG. 5A (and assuming that, for example, there is either no breakdown layers or that any breakdown layers have been broken down), one or more methods of operation are possible. As an example, the threshold voltage Vth(T) may be made to be greater than the magnitude of the difference between the voltage on the CX line and the voltage on the CY line during normal logic operation. That is, we may have the following operating condition: Vth(T)>|VCX−VCY|(3)

If the voltages on the CX and CY lines satisfy the operating condition (3), then the threshold switching element will be in its high resistance off state regardless of the state of the memory element M. In one embodiment of a method of operating the control circuit, a high voltage may be applied to the CX line while a low voltage (or ground) may be applied to the CY line. When the memory element is in its reset state, most of the voltage is dropped across the memory element M (since in this embodiment it is assumed that the reset resistance of the memory element is made higher than the off state resistance of the threshold switching element). The voltage at node NZ is thus high, the transistor QI is on and the connection is CLOSED. However, when the memory element is in its set state, then most of the voltage is dropped across the threshold switching element T so that the voltage at node NZ is low, the transistor QI is off and the connection between and X and Y lines is OPEN.

Once again, the memory element may be programmed by applying a programming voltage Vp across the lines. The programming voltage Vp may have a magnitude which is greater than Vth(M)+Vth(T).

It is noted that the method of operation described above as well as the operating conditions as expressed by the relationships (1), (1'), (2) and (3) above are only examples of methods of operation and examples of operating conditions. Other methods of operation and other methods of operating conditions are, of course, possible.

Figure 5I:
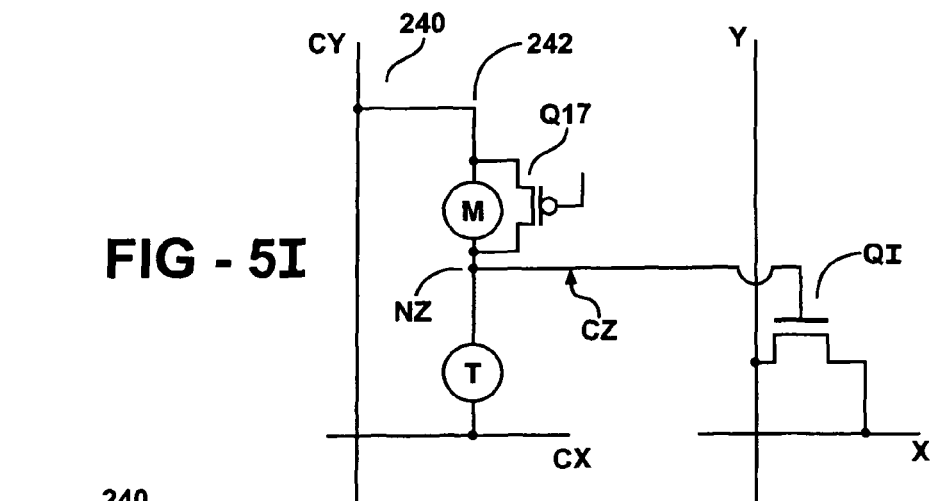
FIG. 5I is an embodiment of a programmable connection of the present invention having a control circuit that includes a threshold switching element, a memory element and a transistor in parallel with the memory element.
Figure 5J:
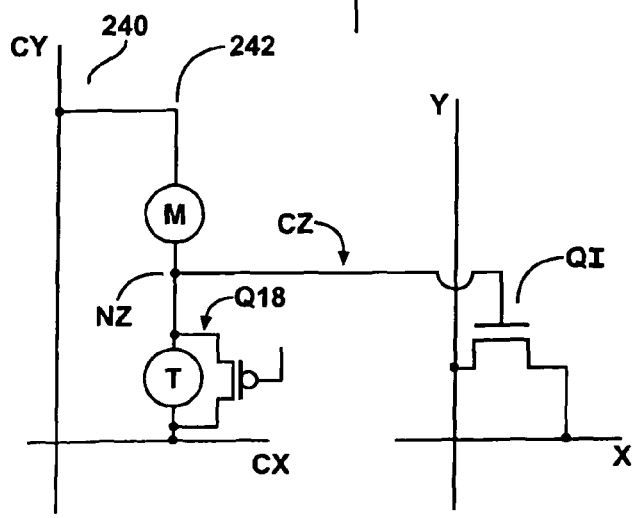
FIG. 5J is an embodiment of a programmable connection of the present invention having a control circuit that includes a threshold switching element, a memory element, and a transistor in parallel with the threshold switching element.
Figure 5K:
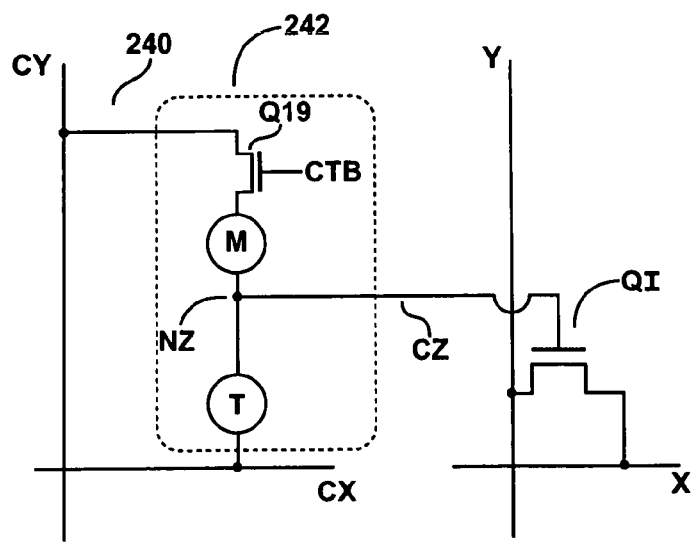
FIG. 5K is an embodiment of a programmable connection of the present invention having a control circuit that includes a threshold switching element, a memory element, and a transistor in series with the memory element and threshold switching element.

As noted above, in an embodiment of the present invention, the resistance of the threshold switching element it its off state (without any breakdown layer) may be greater than the resistance of the memory element in its reset state (without any breakdown layer). If this is the case, it may be possible to operate the control circuit 240 shown in FIG. 5A such that during normal logic operating conditions the threshold switching element T turns on when the memory element M is in its set state (again, assuming there is no breakdown layer or that any breakdown layer has already been broken down). This may occur when, for example, the magnitude of the voltage across the CX and CY lines during normal logic operating conditions is greater than the value of the threshold voltage of the threshold switching element T (that is, when |VCX−VCY|>Vth(T)). When the threshold switching element T turns on, it may be desired to limit the current through the series combination of the threshold switch T and memory element M. In one or more embodiments of the invention, it may be possible to reduce this current with the addition of a current limiting transistor in series with the threshold switch T and memory element M. One such embodiment of the invention is shown in FIG. 5K with the addition of transistor Q19 in series with the memory element M between node NZ and line CY. FIG. 5K shows an embodiment of a control circuit 240 of the present invention that includes a control cell 242 comprising a transistor Q19, a memory element M and a threshold switching element T. The transistor Q19, memory element M and threshold switching element T are all coupled in series between the CX line and the CY line. The gate of transistor Q19 is coupled to a biasing voltage CTB.

The transistor Q19 limits the current through the memory element M (except during programming). This may be done by setting the gate of the transistor Q19 so that the transistor is only slightly on during normal logic operation. During programming, the gate may be set so that the transistor Q19 may be fully on so as to adequately increase the current available to program the memory element M. The transistor may be returned to be only a slightly on after programming is completed.

Figure 5L:
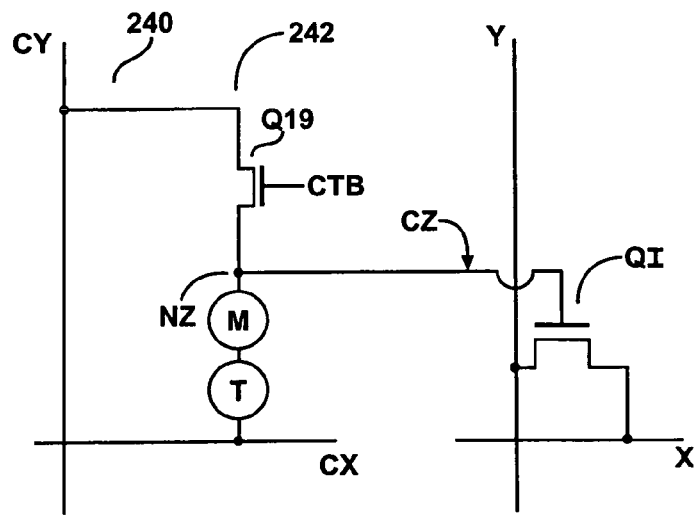
FIG. 5L is an embodiment of a programmable connection of the present invention having a control circuit that includes a threshold switching element, a memory element and a transistor in series with the memory element and threshold switching element.

Another embodiment of the present invention is shown in FIG. 5L. In the embodiment shown in FIG. 5L, the control cell 242 includes a transistor Q19, a memory element M and a threshold switching element T. The memory element M is coupled in series with threshold switching element T between line CX and node NZ while transistor Q19 is coupled between node NZ and line CY. A biasing voltage CTB is coupled to the gate of transistor Q19. In the embodiment shown in FIG. 5L, when the memory element M is programmed to its low resistance set state the threshold switching element T may turn on and may pull the voltage on node NZ to the voltage on line CX with the current limited by the series transistor Q19 (which may be slightly on). If the memory element M is programmed to its high resistance reset state, the unthresholded high resistance reset memory element M in series with the unthresholded high resistance threshold switching element T may have less leakage than the current limiting transistor Q19 that is slightly on, so that the voltage on node NZ may be closer to the voltage of line CY. Thus, by programming the memory element M, the voltage applied to the gate of transistor QI may be controlled, with the leakage limited by the transistor Q19 when the memory element M is in its low resistance set state.

Figure 5M:
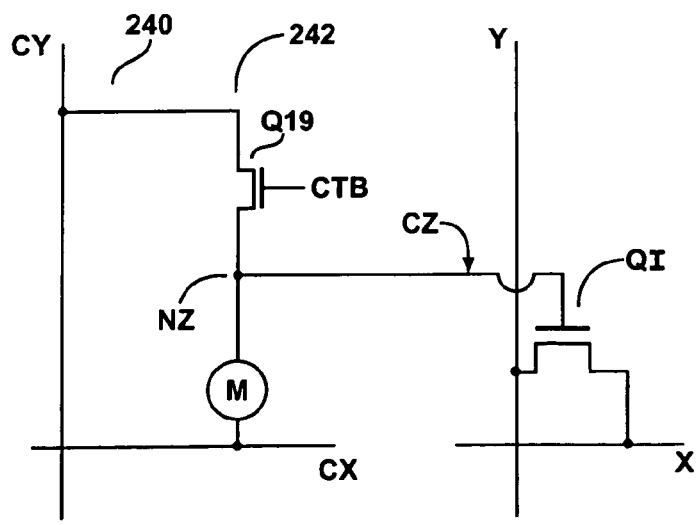
FIG. 5M is an embodiment of a programmable connection of the present invention having a control circuit that includes a memory element in series with a transistor.

Similar operation and result is shown in a further embodiment of the present invention shown in FIG. 5M Here, the threshold switching element T from FIG. 5L is eliminated so that the control cell 242 comprises transistor Q19 in series with memory element M. Conceptual operation is the same as described above for FIG. 5L, but leakage through the memory element M may be greater without threshold switching element T so that transistor Q19 may need to drive more leakage current for good margin during normal operation when transistor Q19 is slightly on (so transistor Q19 may need to be biased more "on"). Also (since threshold switching element T is not in series with the memory element M as shown in FIG. 5L) in order to assure that the voltage across the memory element M remains below its threshold voltage Vth(M) except during programming (to ensure that a memory element programmed to its reset state remains in the reset state), the magnitude of the voltage applied between line CX and line CY may be limited to a lower voltage relative to the embodiment of FIG. 5L where threshold switch T is also in series with memory element M.

Figure 5N:
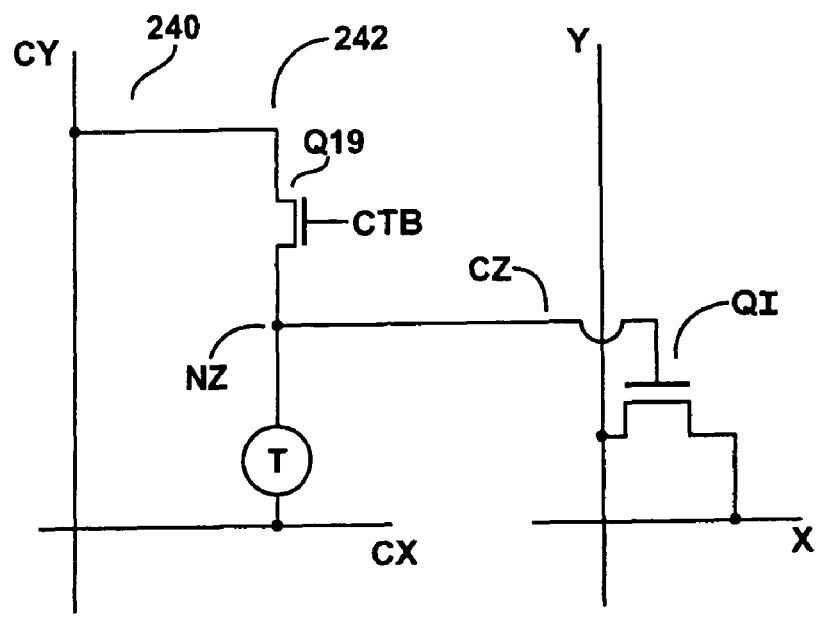
FIG. 5N is an embodiment of a programmable connection of the present invention having a control circuit that includes a threshold switching element in series with a transistor.

Another embodiment of the invention is shown in FIG. 5N where the memory element M from FIG. 5M is replaced with a threshold switching element T. In this embodiment of the invention, the control cell 242 comprises transistor Q19 in series with a threshold switching element T. Transistor Q19 is coupled between node NZ and line CY. The gate of transistor Q19 is coupled to a bias voltage CTB. The gate of the bias transistor Q19 may be biased so that the transistor Q19 is slightly on for normal logic operation with a leakage adequate to pull up node NZ if threshold switching element T is in its untriggered high resistance off state.

The gate of transistor Q19 may be set at a voltage that more fully turns on transistor Q19 during programming to assure that the threshold current Ith(T) of the threshold switching element is exceeded during programming. The voltage between lines CY and CX may be increased during programming to assure more than the threshold voltage Vth(T) is at least briefly (for example, more that about 10 nsec) across the threshold switching element T. Exceeding the threshold voltage Vth(T) will trigger the threshold switching element to its lower resistance on state so that the voltage at node NZ will be closer to the voltage on line CX that it is to the voltage on line CY. To reverse the state of the threshold switching element T from its on state to its high resistance off state (with more voltage drop across the device) the voltage between the CX and CY lines may be reduced to near zero volts (such that, for example, less than the holding current Ih(T) flows through the threshold switching element). Alternately, the power may be turned off and then back on.

The resulting control configuration bit may be reloaded when power is restored after a power-down or battery recharge.

To program the threshold switching element T into its on state after power is restored at system startup, the magnitude of the voltage difference between lines CX and CY may be increased above that used in normal operation. If additional current is needed beyond that normally supplied by transistor Q19 to trigger the threshold switching element T into the on state, the bias voltage on the gate of Q19 may be increased to lower the resistance from source to drain of transistor Q19.

For the embodiment of the control circuit 240 shown in FIG. 5N, if the threshold switching element T is not triggered on by applying a higher voltage between CX and CY after power-up, the threshold switching element T stays in its high resistance off state and the transistor Q19 pulls the voltage at node NZ closer to the voltage on line CY. If threshold switch T is triggered on by programming it after power up, the threshold switch T pulls the voltage at node NZ closer to that of line CX. The voltage at node NZ and the state of transistor QI may be controlled by the state of threshold switching element T (on or off).

In each of the embodiments shown in FIG. 5K, 5L, 5M or 5N a breakdown device may be placed in series with the memory element M and/or threshold switching element T and/or transistor Q19. Likewise, a breakdown layer may be incorporated within the memory element M and/or threshold switching element T and/or transistor Q19. The breakdown device (such as an antifuse) or the breakdown layer may reduce leakage until the device or layer is broken down.

For one or more of the embodiments shown in FIG. 5K, 5L, 5M, or 5N, the control circuit 240 may include a plurality of control cells 242 formed in an array as shown, for example, in FIG. 30A. The bias voltage CTB applied to each of the gates of corresponding transistors Q19 may be tied in common for more efficient use of chip area.

In one or more embodiments of the present invention, a transistor may be placed in parallel with either the memory element or threshold switching element. FIG. 5I shows an embodiment of the present invention that includes a control cell 242 comprising a memory element M in parallel with a transistor Q17. The control cell 242 further comprises a threshold switching element T in series with the parallel combination of memory element M and transistor Q17. In another embodiment of the invention, the PMOS transistor may be replaced with an NMOS transistor or some other controllable interconnect device. The current through the transistor Q17 may be set so that the total current through the parallel combination of transistor Q17 and memory element M is greater than the holding current Ih(T) of threshold switching element T. Then, once on, the threshold switching element T may stay on until the power is removed and/or the current is reduced below the holding current Ih(T) of the threshold switching element.

With a transistor in parallel with a memory element, the threshold switching element T may be turned on after power up by cycling the magnitude of the voltage between CX and CY to be greater than the threshold voltage Vth(T). If the threshold voltage Vth(T) is less than the normal operating voltage and memory element M is in its low resistance set state, then the threshold switching element T will switch on at powerup. Otherwise, the voltage between CX to CY may be increased during programming.

The use of a transistor in parallel with a memory element (such as shown in FIG. 5I) may help to reduce the current through the memory element when the threshold switching element T turns on with the memory element M in the set state. When programming the memory element, the gate of the transistor Q17 may be taken higher, thus reducing the current through transistor Q17, and allowing a higher current through the memory element M which is necessary to program the memory element. The gate may be set higher (for example, nearer the threshold voltage of the transistor) so the current through the memory element M is adequate to remain above Ih(T) and keep the threshold switching element T on.

In another embodiment of the invention, a transistor may be placed in parallel with the threshold switching element so that the parallel combination is more leaky than the serially coupled memory element in its reset state. An example of this is shown in FIG. 5J with transistor Q18 coupled in parallel with the threshold switching element T. In the embodiment of the invention shown in FIG. 5J, the control circuit 240 includes a control cell 242 that comprises a memory element M, a threshold switching element T and a transistor Q18. The transistor Q18 is in parallel with the threshold switching element T. The memory element M is in series with the parallel combination of the threshold switching element T and transistor Q18. In another embodiment of the invention, the NMOS transistor Q18 could be replaced with a PMOS transistor.

With a transistor (such as transistor Q18) in parallel with the threshold switching element T, the threshold switching element T may be bypassed and the memory element M may be programmed directly (such as by turning on transistor Q18 by changing the voltage on the gate), and the control of the gate of Q18 may be with a decoder.

If the voltage to CX is increased, the voltage drop from the gate of transistor QI to the source or drain of transistor QI (connected to line X or line Y) may be accommodated so that transistor QI may tend to stay on across a wide range of voltages of lines X and/or Y. Further, voltages applied to lines CX and CY may be reversed to reduce leakage in the control circuits 240, depending on whether an OPEN state or a CLOSED state is more frequent between the X and Y lines on the customer's pattern. Similarly, if threshold switching element T is connected to a negative voltage, by making the voltage on line CY negative instead of ground, then the voltage margin turning off transistor QI is improved, when the voltage on node NZ is low during normal operation.

In each of the embodiments of the invention shown in FIG. 5I or 5J a breakdown device may added in series with the memory element M and/or threshold switching element T and/or the transistor (for example, transistor source or drain). Likewise, a breakdown layer may be incorporated into the memory element M and/or threshold switching element T and/or the transistor (such as, for example, contact to the transistor source or drain).

In each of the embodiments shown in FIGS. 5A through 5N, the order of memory element M and threshold switching element T (and any transistors) may be interchanged. For example, referring to FIG. 5A, the memory element M may instead be coupled between node NZ and CX while the threshold switching element T may instead be coupled between node NZ and CY. The change in the relative position of the memory element and threshold switching element may require a change in the relative voltages applied to the CX and CY lines for appropriate operation of the control circuit.

In addition, for the embodiments of the present invention that may include a threshold switching element, the cycle life may be extended for the threshold switching element by: 1) providing for a heat sink in close proximity to the threshold switching element such that the resulting thermal environment minimizes temperature rise (heating) during threshold switch device operation. For example, this may be achieved by using high thermal conductivity films in close proximity to the threshold switching element layer. Such films may include one or more of the elements selected from the group consisting of W, Al, and Cu. These films can also serve as device electrode or optionally be separated from the threshold switching material by a barrier film electrode. These optional barrier films may be relatively thin to assist processing topology while minimizing thermal resistance. Operation of the threshold switching element in bi-directional mode may also improve endurance. For example, on power up, the threshold switching element voltage may be reversed by temporarily reversing the voltages to lines CX and CY, but limiting current so the memory element is not reprogrammed. The threshold switching element may be triggered in both directions to further improve endurance.

As discussed above (and as shown in FIGS. 15A and 15B), the control circuit may be formed as an array of control cells. Another example of an array of control cells 242 is shown in FIG. 30A. FIG. 30A shows a control circuit 240 comprising a three by three array of control cells 242. The control circuit 240 includes CX control lines CX1 through CX3, CY control lines CY1 through CY3 and control cells 242. Each of the control cells 242 may take the form of any one of the embodiments presented in FIGS. 5A through 5N as well as variations of these embodiments. A corresponding CZ output line CZ1 through CZ9 are coupled to corresponding control cells 242 of the control circuit array 242. While a three by three array is shown, the size of the array is not limited to any particular dimension. For example, it may have at least one CY line and at least one CX line. As noted above, there may be a plurality of CX lines and a plurality of CY lines. In one or more embodiments of the invention, the CX lines and CY lines may be address lines.

Each of the output lines CZ1 through CZ9 of the control circuit 240 may be coupled to the gate of a corresponding interconnect transistor QI. FIG. 30B, shows a three by three array 130 of an X-Y matrix having three X lines (X1 through X3) and three Y line (Y1 through Y3). Interconnect transistors QI are coupled between a corresponding X line and a corresponding Y line. Each of the output lines CZ1 through CZ9 of the control circuit 240 provides a control signal to a corresponding input line CZ1 through CZ9 of the gate of a corresponding interconnect transistor QI of the X-Y array 130. FIG. 30C provides an example of a control circuit 240 of comprising an array of control cells 242 where each control cell 242 is that of the embodiment shown in FIG. 5A. The X-Y array 130 in combination with the control circuit 240 shown in FIG. 30B may be used in a programmable logic array.

FIGS. 8A through 8H show structures S1 through S8, respectively. These structures S1 through S8 are examples of structures applicable for constructing control cells (such as shown in FIGS. 5A through 5N) incorporating phase-change memory material and/or threshold switching material. In each of the FIGS. 8A through 8H, the layer 300 may represent a phase-change material (such as a chalcogenide phase-change material) or it may represent a threshold switching material (such as a chalcogenide threshold switching material or an S-type threshold switching material). Nodes N20, N10 may represent the CY and CZ lines, respectively. Alternately, nodes N20, N10 may represent the CZ and CX lines, respectively. When layer 300 represents a phase-change material, then nodes N20, N10 may, for example, represent the CY line and the CZ line, respectively, such as shown in FIGS. 5A through 5N. When layer 300 represents a threshold switching material, then nodes N20, N10 may represent the CZ line and the CX line, respectively, such as shown for example in the Figures of 5A through 5N. The relative positions of the memory element and threshold switching element may also be exchanged such that when layer 300 represents a threshold switching material, then nodes N20, N10 may represent the CY and the CZ line, respectively. Likewise, when layer 300 represents a memory material, then nodes N20, N10 may represent the CZ and the CX line, respectively.

Figure 8A:
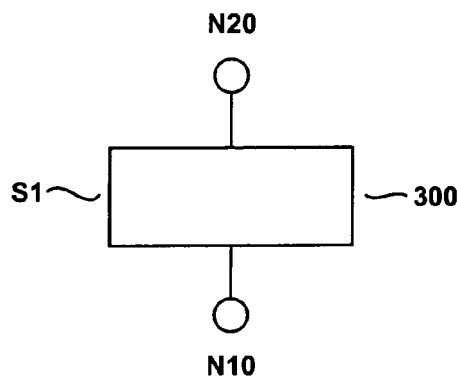
FIG. 8A is an embodiment of a device structure of the present invention comprising a phase-change or threshold switching material.
Figure 8B:
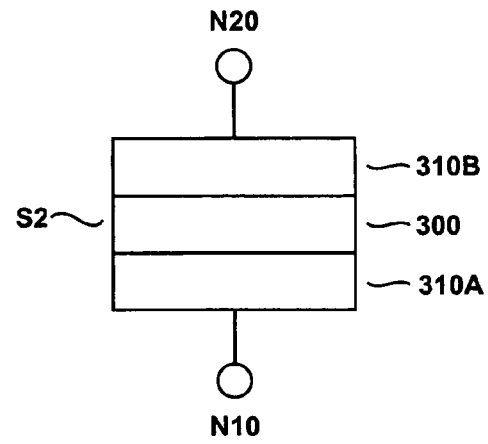
FIG. 8B is an embodiment of a device structure of the present invention comprising a phase-change or threshold switching material, a first electrode and a second electrode.
Figure 8C:
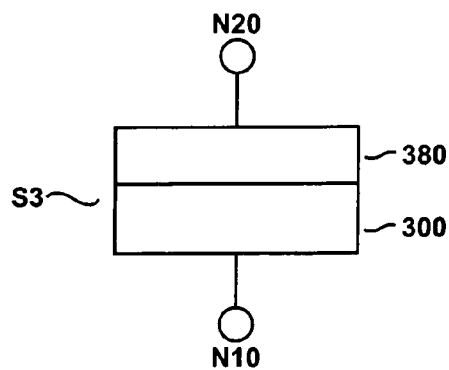
FIG. 8C is an embodiment of a device structure of the present invention comprising a phase-change or threshold switching material and a breakdown layer.
Figure 8D:
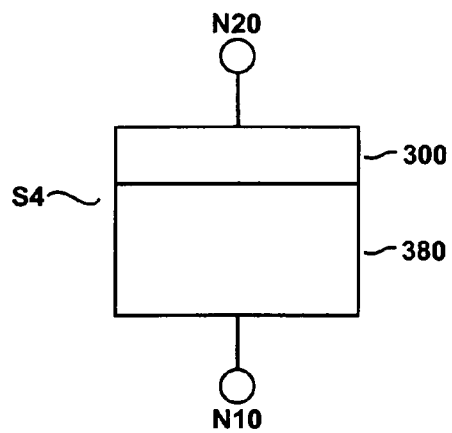
FIG. 8D is an embodiment of a device structure of the present invention comprising a phase-change or threshold switching material and a breakdown layer.
Figure 8E:
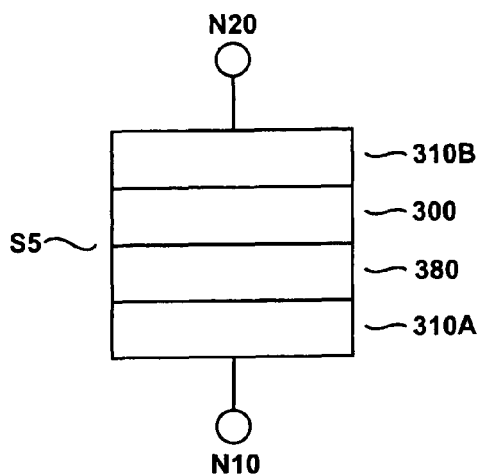
FIG. 8E is an embodiment of a device structure of the present invention comprising a phase-change or threshold switching material, a first electrode, a second electrode and a breakdown layer.
Figure 8F:
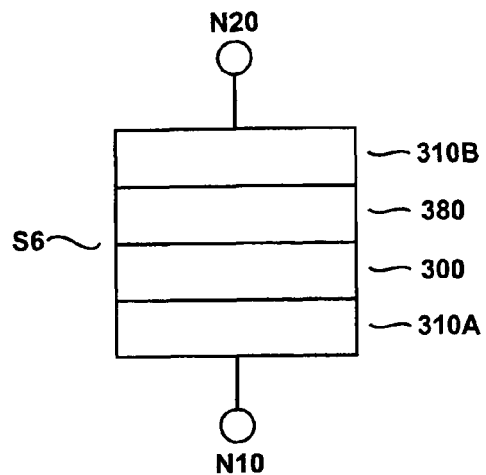
FIG. 8F is an embodiment of a device structure of the present invention comprising a phase-change or threshold switching material, a first electrode, a second electrode and a breakdown layer.
Figure 8G:
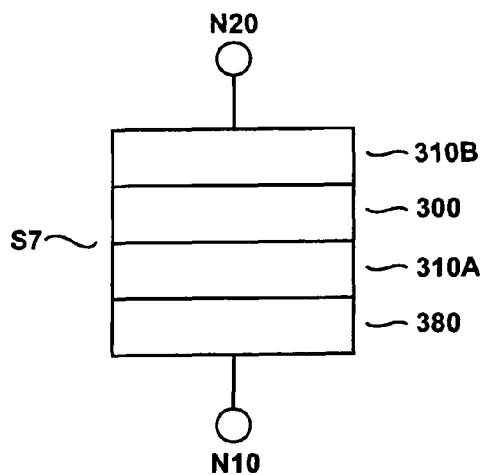
FIG. 8G is an embodiment of a device structure of the present invention comprising a phase-change or threshold switching material, a first electrode, a second electrode and a breakdown layer.
Figure 8H:
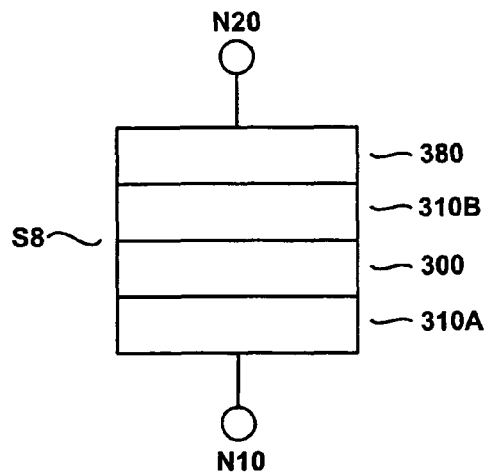
FIG. 8H is an embodiment of a device structure of the present invention comprising a phase-change or threshold switching material, a first electrode, a second electrode and a breakdown layer.
Figure 8I:
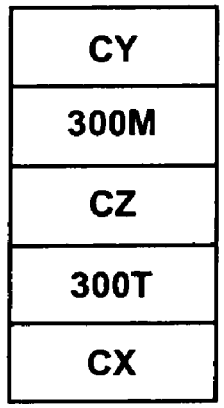
FIG. 8I is an embodiment of a device structure of the present invention comprising a phase-change material and a threshold switching material.
Figure 8J:
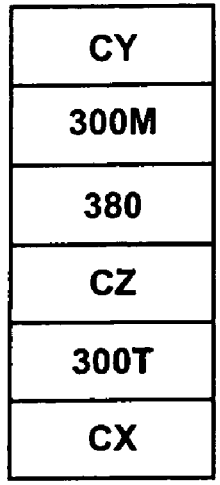
FIG. 8J is an embodiment of a device structure of the present invention comprising a phase-change material, a threshold switching material and a breakdown layer.
Figure 8K:
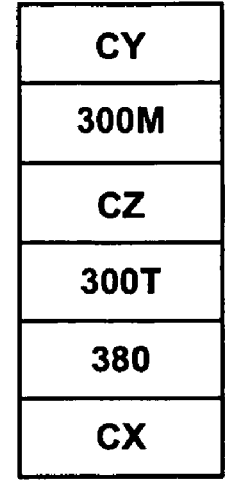
FIG. 8K is an embodiment of a device structure of the present invention comprising a phase-change material, a threshold switching material and a breakdown layer.
Figure 8L:
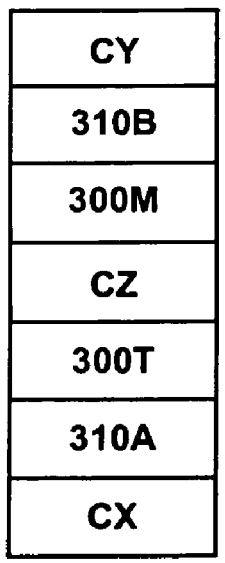
FIG. 8L is an embodiment of a device structure of the present invention comprising a phase-change material and a threshold switching material.
Figure 8M:
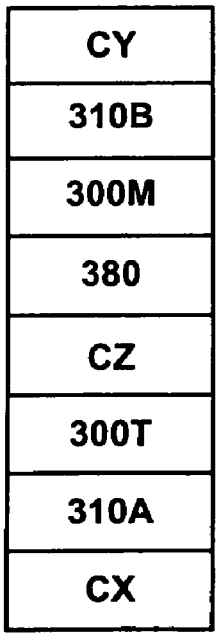
FIG. 8M is an embodiment of a device structure of the present invention comprising a phase-change material, a threshold switching material and a breakdown layer.
Figure 8N:
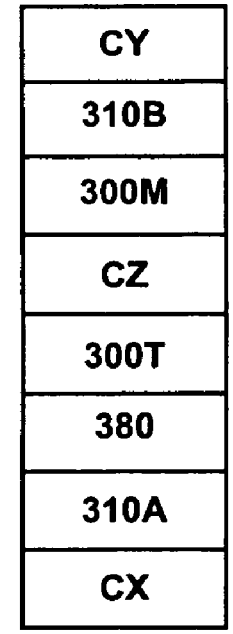
FIG. 8N is an embodiment of a device structure of the present invention comprising a phase-change material, a threshold switching material and a breakdown layer.

In FIG. 8A, structure S1 consists essentially of a layer 300 coupled between nodes N10 and N20. In FIG. 8B, structure S2 comprises a layer 300 coupled between the nodes N10 and N20 but is not directly connected to either. This embodiment further includes a first electrode (or contact layer) 310A coupled between layer 300 and node N 10, and a second electrode 310B (or contact layer) coupled between the layer 300 and node N20. Each electrode 310A and 310B is shown as a single layer. However, each electrode may be formed of multiple layers and each layer may comprise multiple sub-layers. In addition, while two electrodes 310A and 310B are shown, it is possible that only a single electrode (either 310A or 310B) may be used. It is noted that electrodes may be shared at a common junction between the memory element and threshold switch or breakdown layer(s).

Generally, the electrodes 310A and 310B may be formed of any conductive material. Examples of conductive materials include, but are not limited to, n-type doped polysilicon, p-type doped polysilicon, p-type doped silicon carbon alloys and/or compounds, titanium-tungsten, tungsten, tungsten silicide, molybdenum, titanium nitride, titanium carbon-nitride, titanium aluminum-nitride, titanium silicon-nitride, and carbon.

In FIGS. 8C through 8H, the structures S3 through and S8 all include a breakdown layer 380 in series with the layer 300. Structures S5 through S8 include a breakdown layer 380 as well as first and second electrodes 310A, 310B. Additional layers or electrodes may be added on each side of the breakdown layer 380 and/or layer 300. As noted, layer 300 may be a phase-change material or a threshold switching material.

FIGS. 8I through 8N shows different embodiments of possible arrangements of a vertical stack of layers representing a series combination of a memory element M and a threshold switching element T disposed between a CY line and a CX line. In the embodiments shown, layer CY represents the CY line, layer CX represents the CX line, layer CZ represents the CZ line, layer 300M represent a layer of phase-change material, layer 300T represents a layer of threshold switching material, layer 380 represents a breakdown layer and layers 310A,B represent layers of conductive material which may be serving as electrodes or contact layers. As noted above, the layer 300M of phase-change material may be replaced by a layer of some other type of programmable resistance material (which may not be a phase-change material). In each of the examples shown in FIGS. 8I through 8N the phase-change material 300M is in series with the threshold switching material 300T. Each of the embodiments shown in FIGS. 8I through 8N, additional embodiments may be formed by placing an additional electrode or contact layer directly above and/or directly below the CZ line. Each of the electrodes and contact layers may be formed of any conductive material.

In one or more embodiments of the invention, the phase-change material or the threshold switching material may be replaced with a transistor, to implement the embodiments described herein. Further, a transistor may be added to a structure that already includes both a phase-change material and a threshold switching material (with or without one or more breakdown layers). The transistor may be added in series with the phase-change and threshold switching material. Alternately, the transistor may be added in parallel with either the phase-change or threshold switching material.

Figure 6A:
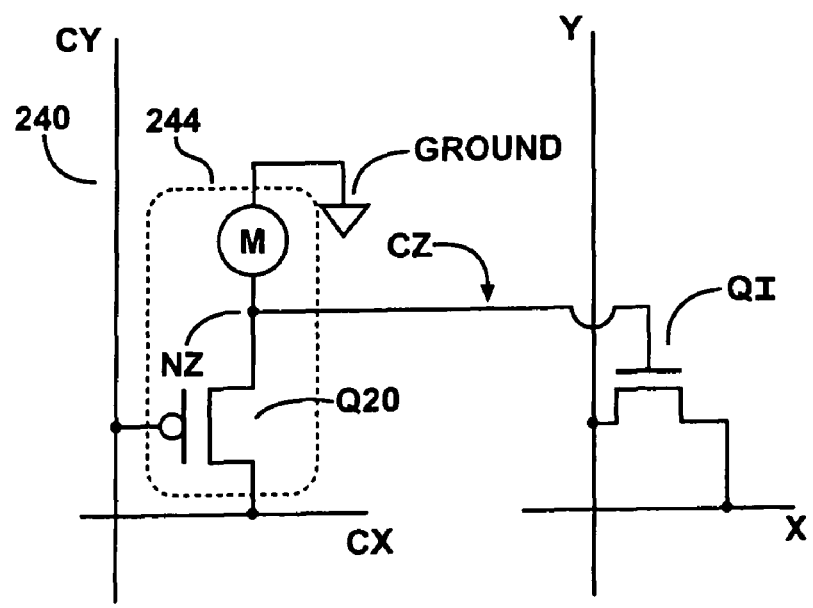
FIG. 6A is an embodiment of a programmable connection of the present invention showing a control circuit that includes a transistor and a memory element.

Alternate embodiments of the present invention are shown in FIGS. 6A through 6E. FIG. 6A shows an embodiment of a control circuit 240 that comprises a ground node, a CY line, a CX line and a control cell 244. The control cell 244 comprises a PMOS transistor Q20 in series with a phase-change memory element M. The memory element M is coupled between node NZ and ground. The transistor Q20 is coupled between the CX line and node NZ. The node NZ is coupled to the gate of the n-channel transistor QI coupled between an X line and a Y line. The memory element M may or may not include a breakdown layer in series with the phase-change memory material. In another embodiment, the ground node may be replaced with a voltage other than ground.

Figure 6B:
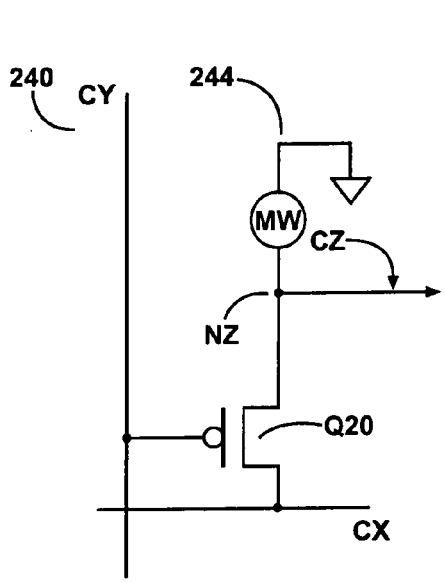
FIG. 6B is an embodiment of a control circuit of the present invention that includes a transistor and memory element without a breakdown layer.
Figure 6C:
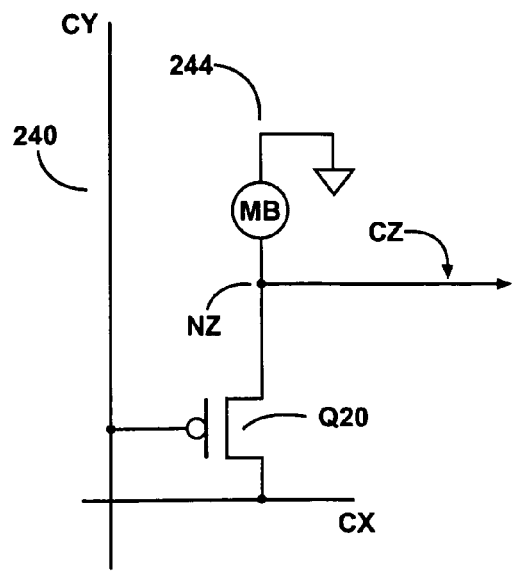
FIG. 6C is an embodiment of a control circuit of the present invention that includes a transistor and a memory element with a breakdown layer.
Figure 6D:
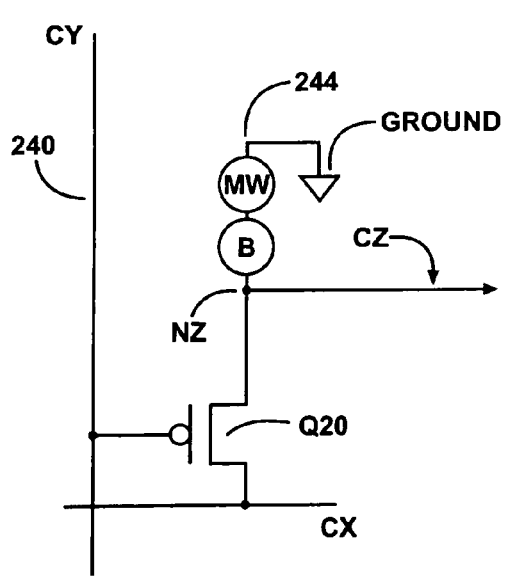
FIG. 6D is an embodiment of a control circuit of the present invention that includes a memory element without a breakdown layer, a breakdown device and a transistor.
Figure 6E:
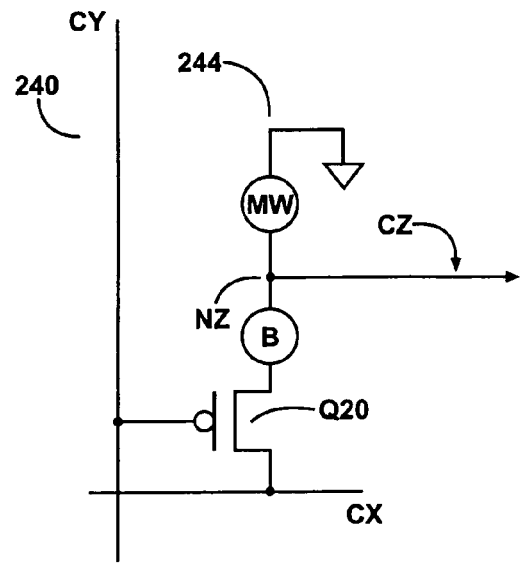
FIG. 6E is an embodiment of a control circuit of the present invention that includes a memory element without a breakdown layer, a breakdown device and a transistor.

In the embodiment shown in FIG. 6B, the control cell 244 includes a memory element MW (without a breakdown layer) and transistor Q20. In the embodiment of FIG. 6C, the control cell 244 comprises a memory element MB (with a breakdown layer) and transistor Q20. In the embodiment of FIG. 6D, the control cell 244 includes a memory element MW (without a breakdown layer) is coupled in series with a breakdown device B (such as an anti-fuse) between ground and the node NZ. The control cell 244 further includes transistor Q20 in series with the memory element MW and breakdown device B. The breakdown device B may be an anti-fuse. In FIG. 6D, the breakdown device B may be placed between the memory element MW and ground. In the embodiment of FIG. 6E, the control cell 244 includes memory element MW, breakdown device B and transistor Q20. In this embodiment, the memory element MW is coupled between ground and the control node NZ while a breakdown device B is coupled in series with transistor Q20 between node NZ and line CX. In another embodiment of the invention, a breakdown layer may be incorporated into the transistor, such as by incorporating the breakdown layer above or into the contact to the source of transistor Q20.

In alternate embodiments of the invention, the transistor Q20 shown in FIGS. 6A through 6E may be replaced with an NMOS transistor. In addition, the ground node GROUND may be replaced by a voltage other than ground. In addition, the relative position of the memory element and transistor Q20 may be interchanged such that the memory element is coupled between line CX and node NZ while the transistor is coupled between node NZ and ground (or some other voltage).

Referring to the embodiments of FIGS. 6A through 6E, the voltage Vnz on node NZ may be kept normally high or normally low (and the state of the connection between the Y line and X line may be kept normally CLOSED or normally OPEN) by using a breakdown layer or a breakdown device. If a breakdown layer or a breakdown device is used and it is not broken down, then the voltage Vnz on node NZ remains in a particular state regardless of the state of the memory element until the breakdown layer or breakdown device (such as an anti-fuse) is broken down (such as by overstressing with voltage).

As an example, refer to the embodiment shown in FIG. 6D. For normal logic operation, the potential on line CX may be kept at some positive voltage while the potential on the CY line may be kept sufficiently below the voltage on the CX line to keep the transistor Q20 slightly on. With the breakdown device B in a high resistance unpopped (not broken down) state, substantially all of the voltage drop between the CX line and GROUND is across the breakdown device so that the voltage on node NZ may be pulled sufficiently high to keep cross-connect transistor QI on and the connection between the Y and X lines CLOSED so long as the breakdown layer remains unpopped, regardless of the state of the memory element MW.

By placing the breakdown device B between transistor Q20 and node NZ, as shown in FIG. 6E, the voltage on node NZ may instead be kept sufficiently low so that transistor QI remains off and the connection between the X and Y lines is normally OPEN. Likewise (referring again to FIG. 6D), by interchanging the transistor Q20 with the series combination of memory element MW and the breakdown device B and making Q20 an N-channel device, the voltage at node NZ may be made to be normally low (with interconnect transistor QI off and the connection between lines X and Y OPEN). In this case the transistor QI will be off and the connection between lines X and Y will be OPEN so long as the breakdown device is unpopped.

Referring again to FIG. 6D, after the breakdown device B is broken down, then the voltage on node NZ may be controlled by programming the memory element MW back and forth between its reset and set states. When the memory element MW is in its low resistance set state, the voltage on node NZ is pulled low because the non-programming bias current through transistor Q20 is overcome. This results in an OPEN connection between the Y line and the X line by turning off transistor QI. If the memory element M is programmed to its high resistance state then, the bias current through transistor Q20 pulls the voltage at node NZ high and creates a CLOSED connection between the Y line and the X line.

The bias current through transistor Q20 (except during programming mode) may be adjusted by changing the size of transistor Q20 and the bias voltage between lines CY and CX. The bias current may be adjusted to that it is adequate to pull the voltage on node NZ high enough so as to turn on transistor Q20 if the memory element M is in its high resistance reset state and yet low enough to pull the voltage on node NZ sufficiently low so as to turn off transistor QI when the memory element is in its low resistance set state. If necessary, the ground potential GROUND shown in FIG. 6D may be replaced with a negative voltage (less than ground) to provide additional margin.

As a further alternative, memory element MW and the transistor Q20 can be interchanged. In this case, during normal logic operation, the voltage on line CX may be made to be the same as the power supply voltage Vcc to the logic section. When the memory element MW is in its reset state, the gate of transistor QI may then be about equal the power supply voltage to the logic section. However, when the voltages on lines X and Y pull up close to voltage of the gate of transistor QI, the transistor QI will turn off. To allow lines Y and X to go rail to rail, the voltage on line CX may be made more positive than that of the logic voltage Vcc by an amount equal to (or even greater than) the threshold voltage Vt(n-channel) of transistor QI so that transistor QI is kept on (and the connection between the X and Y lines is kept CLOSED) over the full range of voltages that occur on the X and Y lines.

In the embodiments shown in FIGS. 6A through 6E, to program the memory element M (or to breakdown the breakdown layer in memory element MB or in the breakdown device or anti-fuse B) CY may be shifted to turn on transistor Q20 and CX increased as necessary to provide adequate programming voltage and current, for a magnitude and duration adequate to program the memory element and/or to breakdown the breakdown layer. Similarly, ground may be made more negative to the selected memory element M and/or other grounds may be raised in voltage to improve margin against programming an unselected memory element M (or breakdown down a breakdown layer). For example, if V/2 or V/3 is the normal voltage across the memory element M when programming is not desired, then CX may be raised and/or ground lowered to increase the voltage across the memory element M from V/2 or V/3 to V, while maintaining the voltage across other unselected memory elements M at less than V/2 or V/3 during programming (by raising the grounds to the memory elements M in series with the CX line being raised.

Figure 6F:
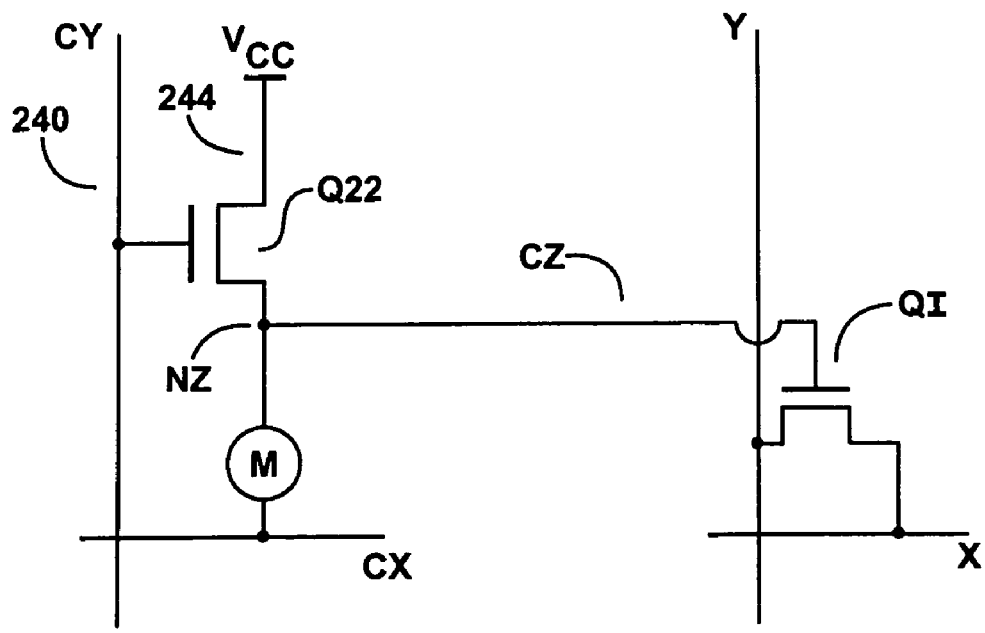
FIG. 6F is an embodiment of a control circuit of the present invention that includes a memory element and a transistor.

Another embodiment of the present invention is shown in FIG. 6F. FIG. 6F shows a control circuit 240 comprising a control cell 244, a CX line and a CY line. The control unit 244 includes a memory element M in series with an NMOS transistor Q22. Memory element M is coupled between the CX line and node NZ while transistor Q22 is coupled between node NZ and the voltage Vcc. In the embodiment shown in FIG. 6F, it is possible that the memory element M be formed without a breakdown layer or with a breakdown layer.

Figure 6G:
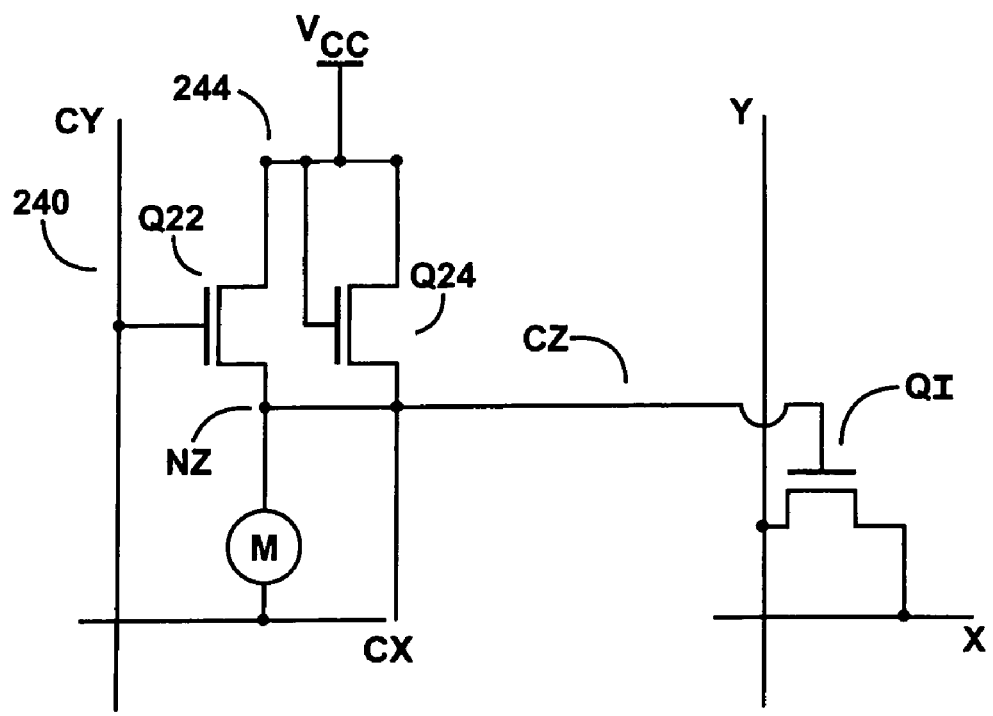
FIG. 6G is an embodiment of a control circuit of the present invention that includes a memory element, a first transistor and a second transistor.

Another embodiment of the present invention is shown in FIG. 6G. FIG. 6G shows a control circuit 240 comprising a control cell 244. Control cell 244 includes memory element M, transistor Q22 and transistor Q24. Memory element M is coupled between the CX line and node NZ, transistor Q22 is coupled between node NZ and voltage Vcc. Transistor Q24 is coupled between node NZ and voltage Vcc and also has its gate coupled to Vcc. The transistor Q24 may be used for reading the memory element M and is separate from the transistor Q22 (used for programming the memory element). Transistor Q24 may has a long channel and a narrow width to provide low leakage current continuously. Transistor Q22 is preferably off during read, and is typically turned on for write (e.g. programming). During read, transistor Q24 may furnish a bias current to adequately pull up the memory element (and the gate of transistor Q24) if memory element M is reset so that transistor QI is turned on. The transistor Q24 bias current is low enough so that when the memory element is in its set state, the gate of transistor QI is low and transistor QI is off (and the connection is OPEN). The voltage Vcc may be higher than the highest level of line X or line Y. The line X may be coupled to transistor QI (such as to its source) or may, additionally, be coupled to line CX. Alternately, the gate of transistor QI may be pumped to a level above that of voltage Vcc, or to a level above the highest level of either line X or line Y. Then, the transistor QI may tend to be on and provide a low current over a wider voltage range. During write, transistor Q22 is turned on. Either the gate of transistor Q22 may be adjusted or the voltage Vcc may be adjusted so that the current through the memory element when programming the memory element to its reset state is higher than the current through the memory element when programming the memory element to its set state. Alternately, the gate to the transistor Q22 may be lowered slowly when programming the memory element to its set state (for example, greater than about 100 nsec) and the gate to the transistor Q22 may be lowered fast (for example, less than about 10 nsec) when programming the memory element to its reset state.

Figure 31C:
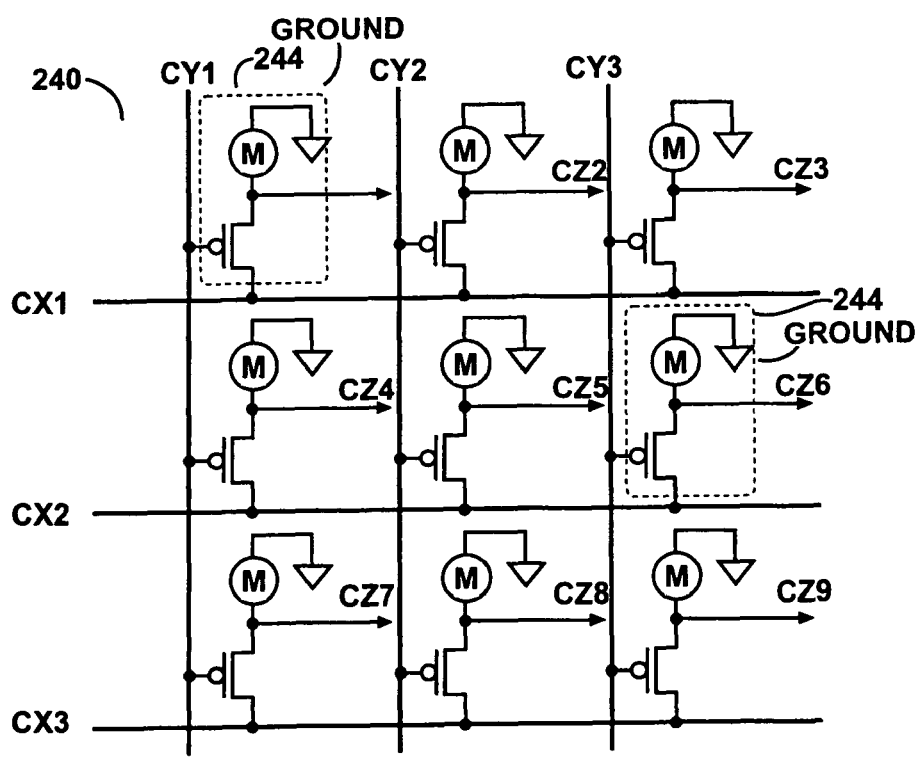
FIG. 31C shows an embodiment of a control circuit of the present invention comprising an array of control cells with CX lines and CY lines.
Figure 31A:
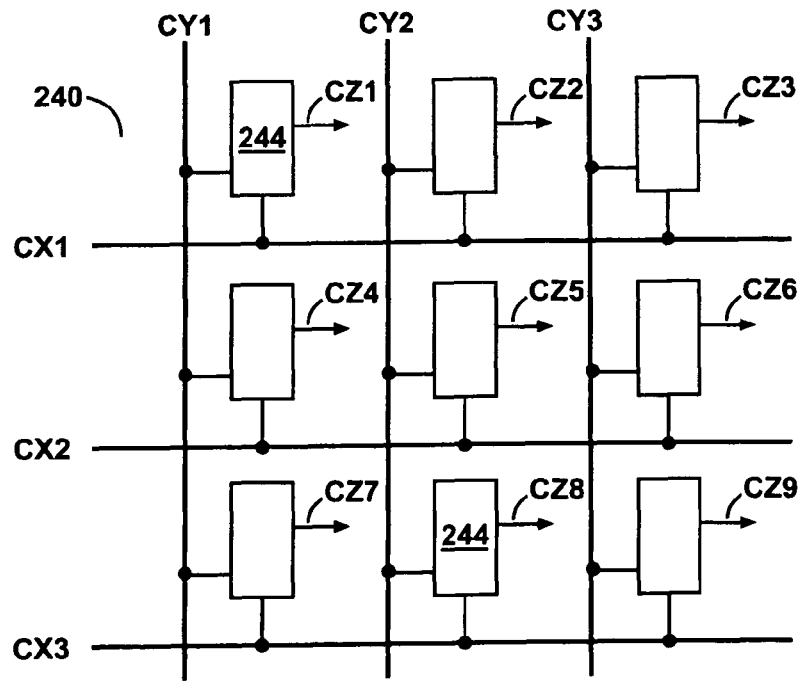
FIG. 31A shows an embodiment of a control circuit of the present invention comprising an array of control cells with CX lines and CY lines.

It is noted that a control circuit may be formed as an array of control cells as shown in FIG. 31A. FIG. 31A shows a control circuit 240 comprising a three by three array of control cells 244. The control circuit 240 includes control lines CX1 through CX3, control lines CY1 through CY3 and control cells 244. Each of the control cells 244 may take the form of any one of the embodiments presented in FIGS. 6A through 6G as well as variations of these embodiments. A corresponding CZ output line CZ1 through CZ9 extends from each of the control cells 242 of the control circuit array 244. While a three by three array is shown, the size of the array is not limited to any particular dimension. For example, it may have at least one CY line and at least one CX line. In one or more embodiments of the invention, there may be a plurality of CX lines and a plurality of CY lines.

Figure 31B:
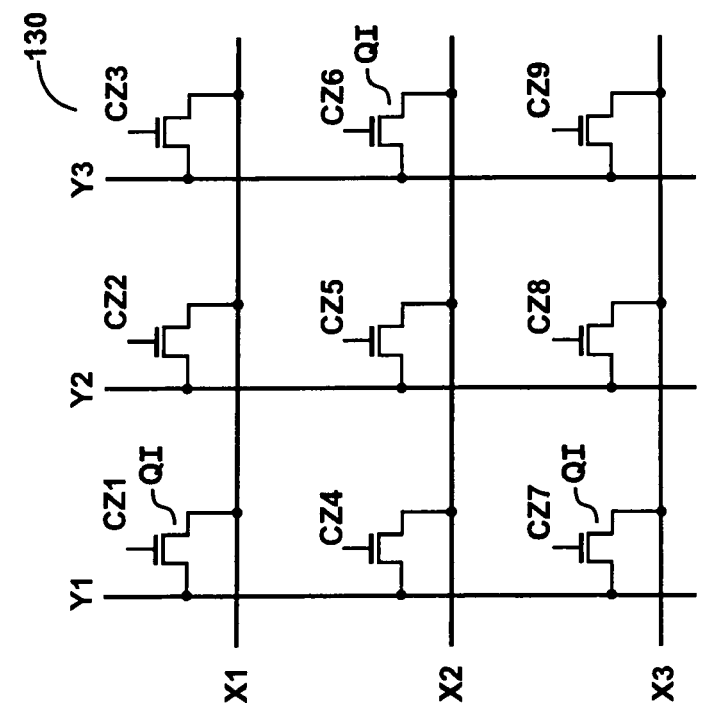
FIG. 31B shows an embodiment of a control circuit of the present invention including a three by three array of control cells where each control cell is providing a control signal to a corresponding interconnect transistor of an X-Y array.
Figure 31B:
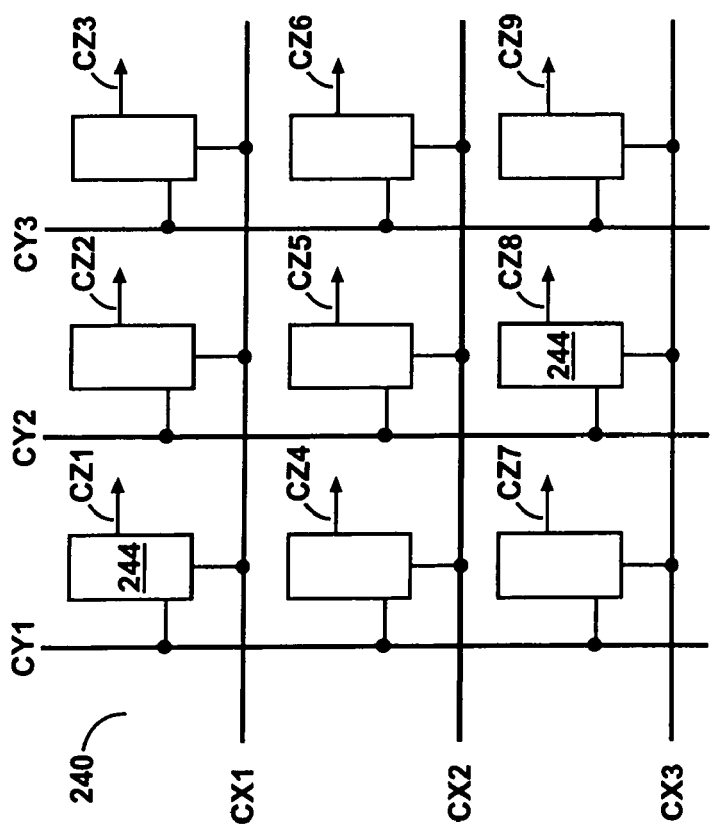

Each of the output lines CZ1 through CZ9 may be coupled to the gate of a corresponding interconnect transistor QI. For example, referring to FIG. 31B, each of the output lines CZ1 through CZ9 of the control circuit 240 may be coupled to a corresponding gate input line CZ1 through CZ9 of a corresponding transistor QI of the X-Y matrix 130. FIG. 31C provides an example of a control circuit 240 comprising an array of control cells 244 where each control cell 244 is that of the embodiment shown in FIG. 6A.

Figure 7A:
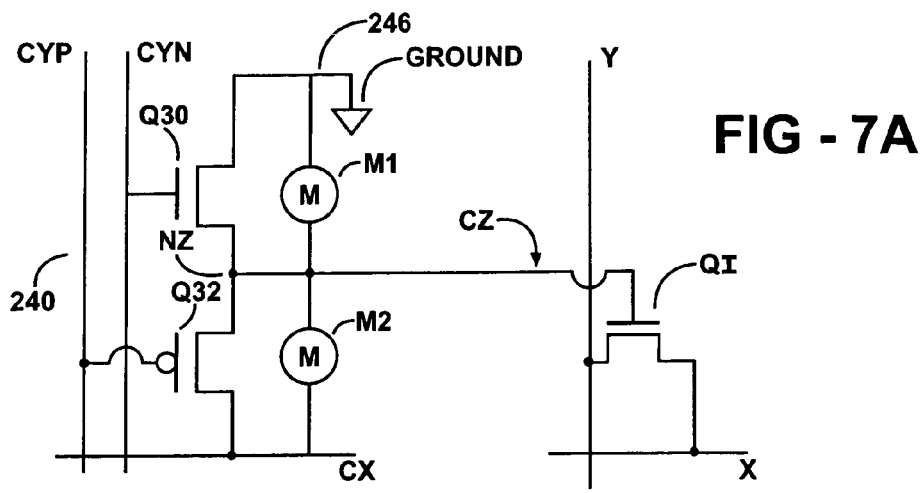
FIG. 7A is an embodiment of the programmable connection of the present invention having a control circuit that includes a first memory element and a second memory element, where each memory element is in parallel with a transistor.

Additional embodiments of the present invention are shown in FIGS. 7A through 7H. Another embodiment of the programmable connection of the present invention is shown in FIG. 7A showing a control circuit 240 comprising an address line CYN (which may be a first bitline), an address line CYP (which may be a second bitline), an address line CX (which may be a first wordline) and a control cell 246. The control cell 246 comprises a first memory element M(M1), a second memory element M(M2), a transistor Q30 and a transistor Q32. First memory element M(M1) coupled between a node (such as ground) and node NZ, and a second memory element M(M2) coupled between node NZ and the CX line. The control cell 246 further includes an NMOS transistor Q30 with source to drain coupled across the memory element M(M1), and a PMOS transistor Q32 coupled across the memory element M(M2). The gate of the NMOS transistor Q30 is coupled to a CYN line while the gate of the PMOS transistor Q32 is coupled to the CYP line. Except during programming, CYP may be biased to be at the same voltage as that coupled to memory element M2 at CX. CYN may be biased to be at the same voltage as that coupled to memory element M1, as shown here for example, such as at ground. Transistors Q30 and Q32 may be turned off except during write.

The gate of transistor QI is driven by the voltage Vgate on the control node NZ (the control node NZ tied to gate of QI). When M1 is programmed through turning on transistor Q32 and increasing CX, or M2 is programmed through turning on transistor Q30 and raising CX, the resistance of one may be high and the other low. The voltage on node NZ is determined by the voltage across the two memory elements M1 and M2 (e.g. between line CX and ground) as well as by the resistances of the memory elements M1 and M2. For example, if the voltage on line CX is high, then the voltage at node NZ will be equal to the voltage on line CX multiplied by RATIO where RATIO=resistance M1/resistance(M1+M2). If memory element M1 is programmed to high resistance while M2 is programmed low, then the voltage at NZ will be high so that transistor QI is on and the connection is CLOSED. If the memory element M2 is programmed to high resistance while M2 is programmed low, then the voltage at NZ will be low so that transistor QI is off and the connection is OPEN.

Figure 7B:
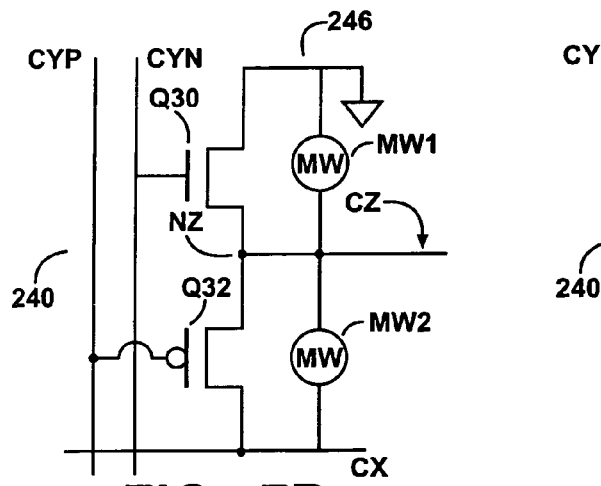
FIG. 7B is an embodiment of a control circuit of the present invention that includes a first memory element without a breakdown layer and a second memory element without a breakdown layer, where each memory element is in parallel with a transistor.
Figure 7C:
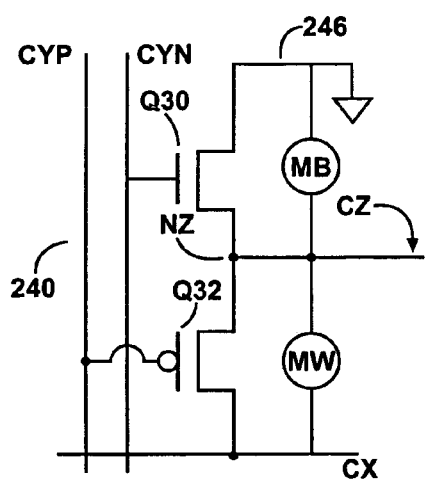
FIG. 7C is an embodiment of a control circuit of the present invention that includes a first memory element with a breakdown layer and a second memory element without a breakdown layer, where each memory element is in parallel with a transistor.
Figure 7D:
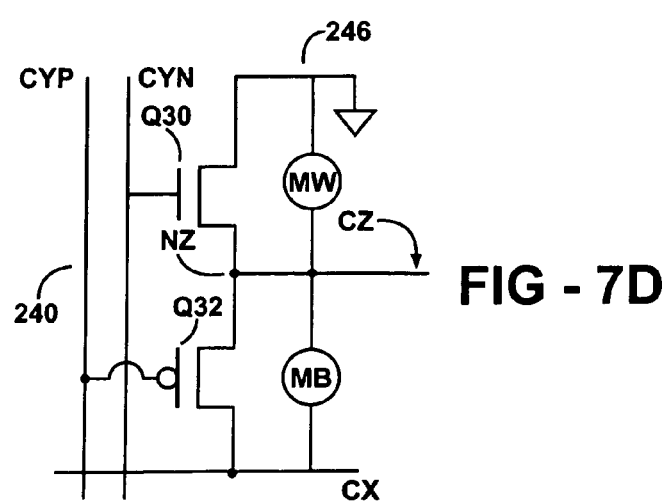
FIG. 7D is an embodiment of a control circuit of the present invention that includes a first memory element without a breakdown layer and a second memory element with a breakdown layer, where each memory element is in parallel with a transistor.

The embodiment of FIG. 7B shows memory element MW(MW1) (without breakdown layer) coupled between ground and node NZ and a second memory element MW(2) coupled between node NZ and the CX line. In this embodiment, control cell 246 comprises memory elements MW1, MW2 and transistors Q30, Q32. The embodiment of FIG. 7C shows a memory element MB (with a breakdown layer) coupled between ground and node NZ, and a second memory element MW (without breakdown layer) coupled between node NZ and the CX line. In this embodiment control cell 246 comprises memory elements MB, MW and transistors Q30, Q32. The embodiment of FIG. 7D shows a memory element MW (without a breakdown layer) coupled between ground and node NZ and a memory element MB (with a breakdown layer) coupled between node NZ and the CX line. In this embodiment, the control cell 246 includes memory elements MW, MB and transistors Q30, Q32.

Figure 7E:
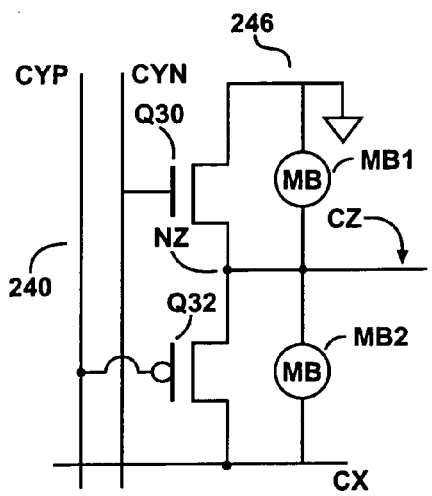
FIG. 7E is an embodiment of a control circuit of the present invention that includes a first memory element with a breakdown layer and a second memory element with a breakdown layer, where each memory element is in parallel with a transistor.

The embodiment of FIG. 7E shows a first memory element MB(MB1) (with breakdown layer) coupled between ground and node NZ with a second memory element MB(MB2) (with breakdown layer) coupled between node NZ and the CX line. In this embodiment, control cell 246 includes memory elements MB1, MB2 and transistors Q30, Q32. Here, the state of NZ (high or low) is indeterminate on power up. Accordingly, CYN may be biased so that either transistor Q30 or transistor Q32 is turned on slightly, so that the voltage at node NZ is in the low state or high state respectively (and the corresponding cross-connect transistor QI is off if the voltage at node NZ is low). Or an alternate power up state may be selected. However, after power-up, the memory element MB1 or memory element MB2 at each cross connect may be programmed. Or alternately, the breakdown layer of memory element MB1 or memory element MB2 may be broken down and the memory element programmed (leaving the memory in the high or low resistance desired for the correct voltage at node NZ), without programming one or both of memory elements MB1 or MB2 until the state needs to be reversed (thereafter increasing the leakage attributable to this control cell 246).

Figure 7F:
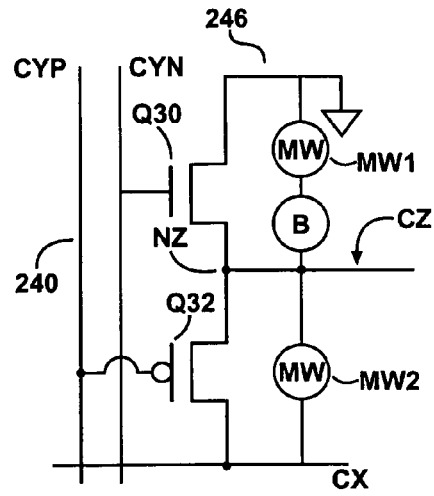
FIG. 7F is an embodiment of a control circuit of the present invention including a first memory element without a breakdown layer, a second memory element without a breakdown layer and a breakdown device, where the first memory element and breakdown device is in parallel with a transistor transistor, and the second memory element is in parallel with a transistor.

The embodiment of FIG. 7F shows a breakdown device in series with a memory element MW(MW1) between ground and the node NZ with a second memory element MW (here labeled MW2) coupled between node NZ and the CX line. In this embodiment, control cell 246 includes memory elements MW1, MW2, transistors Q30, Q32 and breakdown device B.

Figure 7G:
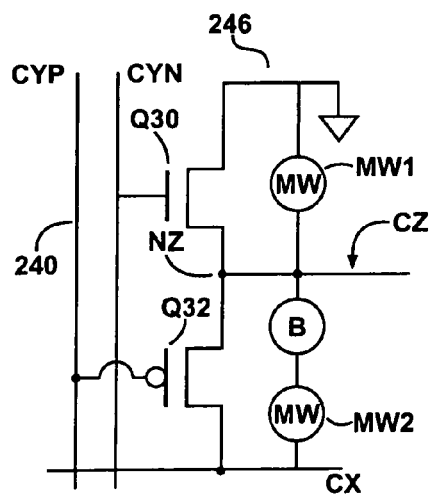
FIG. 7G is an embodiment of a control circuit of the present invention that includes a first memory element without a breakdown layer, a second memory element without a breakdown layer and a breakdown device, where the first memory element is in parallel with a transistor and the second memory element and breakdown device are in parallel with a transistor.

The embodiment of FIG. 7G shows a first memory element MW (MW1) coupled between ground and node NZ, and a second memory element MW(MW2) in series with a breakdown device B between node NZ and the CX line. In this embodiment, control cell 246 includes memory elements MW1, MW2, transistors Q30, Q32 and breakdown device B.

Figure 7H:
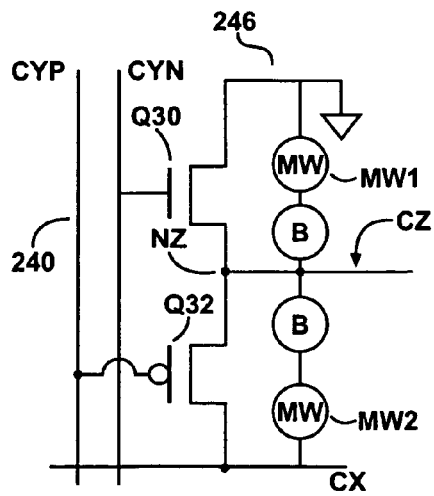
FIG. 7H is an embodiment of a control circuit of the present invention including a first memory element without a breakdown layer, a second memory element without a breakdown layer, a first breakdown device and a second breakdown device, where the first memory element and first breakdown device are in parallel with a transistor, and the second memory element a second breakdown device are in parallel with a transistor.

The embodiment of FIG. 7H shows a first memory element MW (MW1) (without breakdown layer) in series with a first breakdown device B between ground and node NC, and a second memory element MW(MW2) (without breakdown layer) in series with a second breakdown device between node NZ and the CX line. In this embodiment, control cell 246 includes memory elements MW1, MW2, transistors Q30, Q32, first breakdown device B and second breakdown device B. Here again, as for FIG. 7E, the state of NZ (high or low) may be indeterminate on power up. Accordingly, CYN may be biased so transistor Q30 or transistor Q32 is turned on slightly, so all of the unprogrammed MW pairs are in the low state or high state respectively. Or an alternate power up state may be selected if preferred. Then, after power-up, either of the breakdown devices B that is in series with the memory elements may be broken down, and then the extra current in transistor Q30 and transistor Q32 may be turned off for normal operation. Subsequently, if the state needs to be reversed, the other breakdown layer may be punctured and the memory elements MW1 or MW2 at the cross connect may be programmed.

Some of the cross-points between an X line and a Y line in a matrix array, such as for reasons of faster write speed or lower resistance to drive an output, may be hard-wired or coupled together through programmable connections. It is possible to use several different types of programmable connections together in a single integrated circuit or a single programmable matrix array.

If a substantial portion of the phase-change programmable connections are not needed for a particular application or market segment, a breakdown layer may be placed in series with the select device or load, and only those breakdown layers of programmable connections that are potentially needed by the customer may be broken down and tested at the factory to better assure both states are functional. By minimizing the number of breakdown layers (or anti-fuses in that approach) that are broken down will minimize power supply drain. Later, if needed in the field, those breakdown layers that were not broken down at the factory may subsequently be broken down in the field, and thus made conducting so the programmable connections may be programmed to the low resistance state or reprogrammed to whichever state is desired.

Embodiments herein may also be used in contact mask programmable applications. One or more breakdown layers capable of contact mask programming may be fabricated into the control circuits or as part of the programmable connections, and thus may be available for use in all or part of the mask programmable connections or for later breakdown in the field. Then, the breakdown layer may be broken down my mask programming through, for example, use of a contact mask. Other ways to break the layer down while processing the wafers at intermediate steps may be, for example, through use of electrical stress or a laser to selectively break down the breakdown layer for selected cross-points.

Similarly, a volatile connection (programmed on power-up/restoring power) may be made for the embodiments of FIGS. 7A through 7H by replacing the memory element M with threshold switch T, and memory element MW with threshold switch TW, and memory element MB with threshold switch TB. Then, after puncturing the breakdown layer (by techniques described for memory element M above), the threshold switching element T is programmed "on" to low voltage by leaving the transistor across it off, and turning on the transistor across the threshold switch T to be left open, and if necessary increasing CX. Then, with line CX greater than the threshold voltage Vth(T), the threshold switching element T turns on and remains on so long as adequate current flows through the threshold switching element T triggered on (current greater than the holding current Ih(T)). If necessary, the transistor in parallel with the off threshold switching element T may be turned slightly on to assure adequate current through the triggered on T. Once one of the threshold switching elements T in series are triggered on with the other off, NZ will be pulled to within Vh(T) of the node connected to the triggered on threshold switching element T (where, of course, Vh(T) is the holding voltage of the threshold switching element). In turn, this will control the transistor QI connected to that NZ. If more margin is desired (such as eliminating the Vh(T) drop), the node may be increased in voltage relative to the logic (so the gate of QI is either more on for CLOSED, and harder off for OPEN). Endurance of the threshold switch, such as T, may be improved by reducing thermal impedance in the area of the T, such as by use of a tungsten electrode on one or more sides of the T.

Figure 32A:
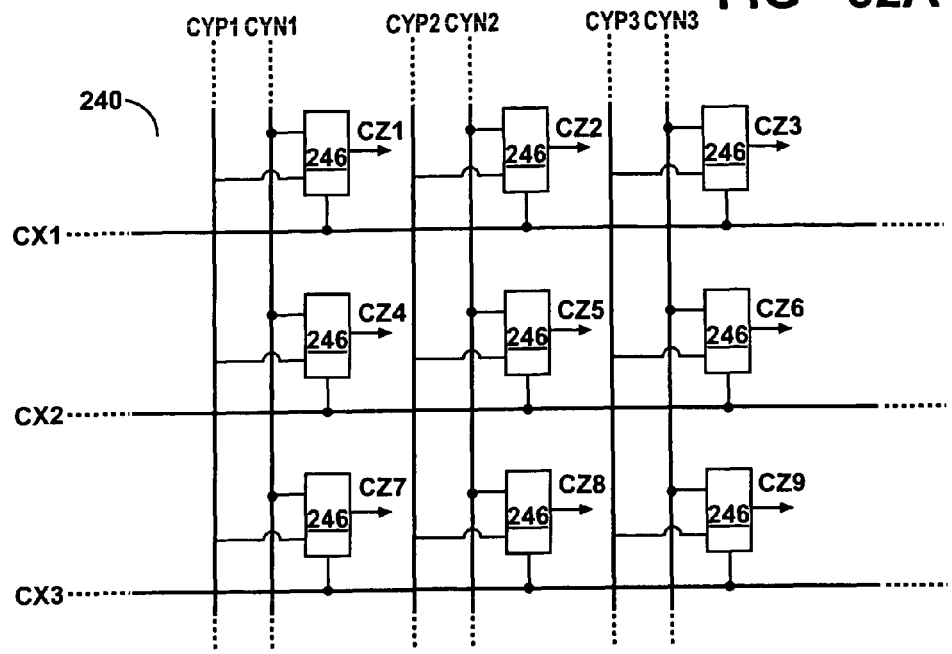
FIG. 32A shows an embodiment of a control circuit of the present invention comprising an array of control cells with CX lines, CYP lines and CYN lines.

It is noted that a control circuit may be formed as an array of control cells as shown in FIG. 32A. FIG. 32A shows a control circuit 240 comprising a three by three array of control cells 246. The array 32A includes control cells 246 and further includes three CYP/CYN pairs CYP1/CYN1, CYP2/CYN2, and CYP3/CYN3 coupled to control cells 246. The array also includes three CX lines CX1, CX2, and CX3 coupled to control cells 246. Each of the control cells 246 may take the form of any one of the embodiments presented in FIGS. 7A through 7H as well as variations of these embodiments. A corresponding output line CZ1 through CZ9 extends from each of the control cells 246 of the control circuit array 240. While a three by three array is shown, the size of the array is not limited to any particular dimension. For example, it may have at least one pair of CYP/CYN lines and at least one CX line. In one or more embodiments of the invention, the array may include a plurality of CYP/CYN line pairs as well as a plurality of CX lines. In one or more embodiments of the invention, the CYP/CYN line pairs as well as the CX lines may be address lines. In one or more embodiments of the invention, a CX line may cross the corresponding CYP and the corresponding CYN line.

Figure 32B:
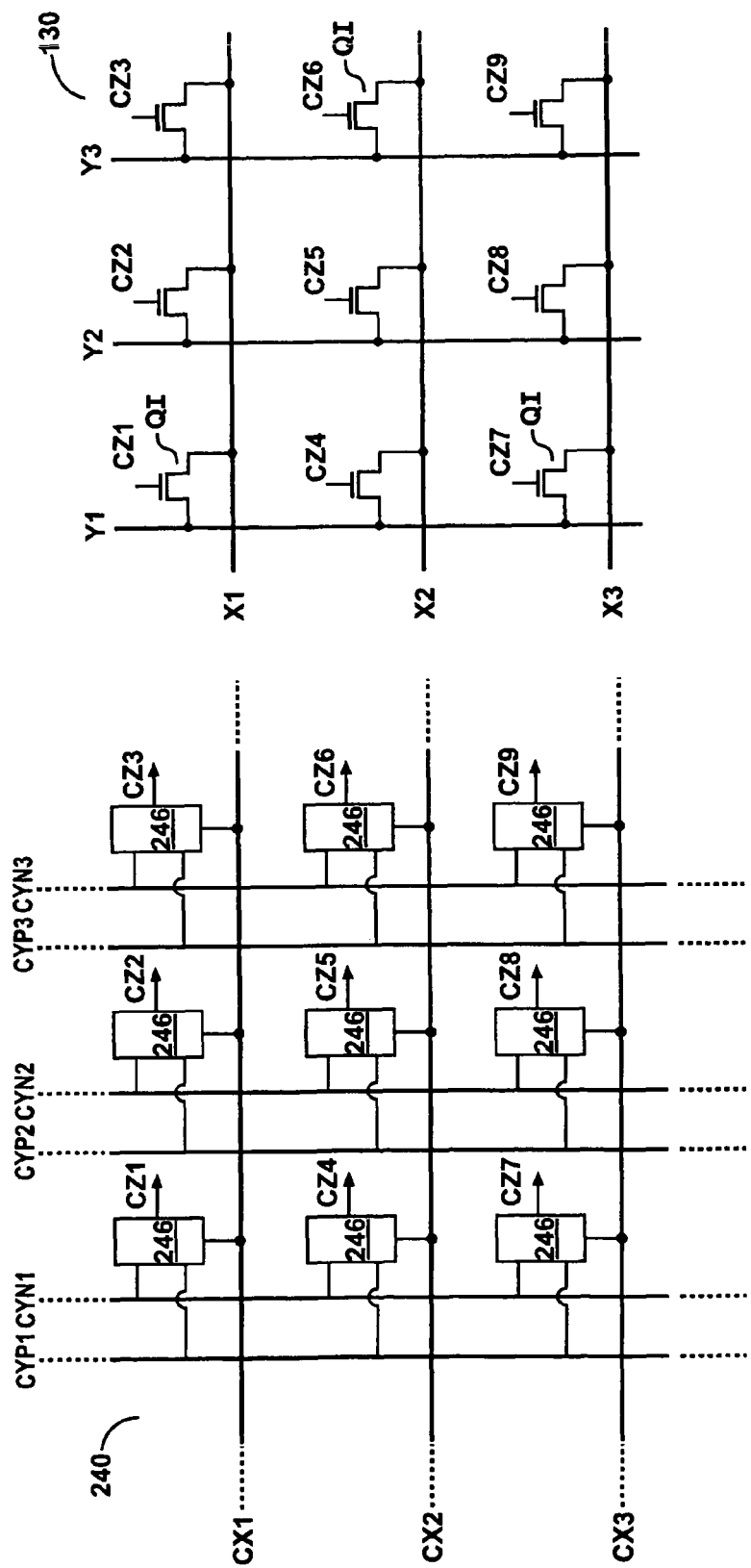
FIG. 32B shows an embodiment of a control circuit of the present invention including a three by three array of control cells where each control cell is providing a control signal to a corresponding interconnect transistor of an X-Y array.
Figure 32C:
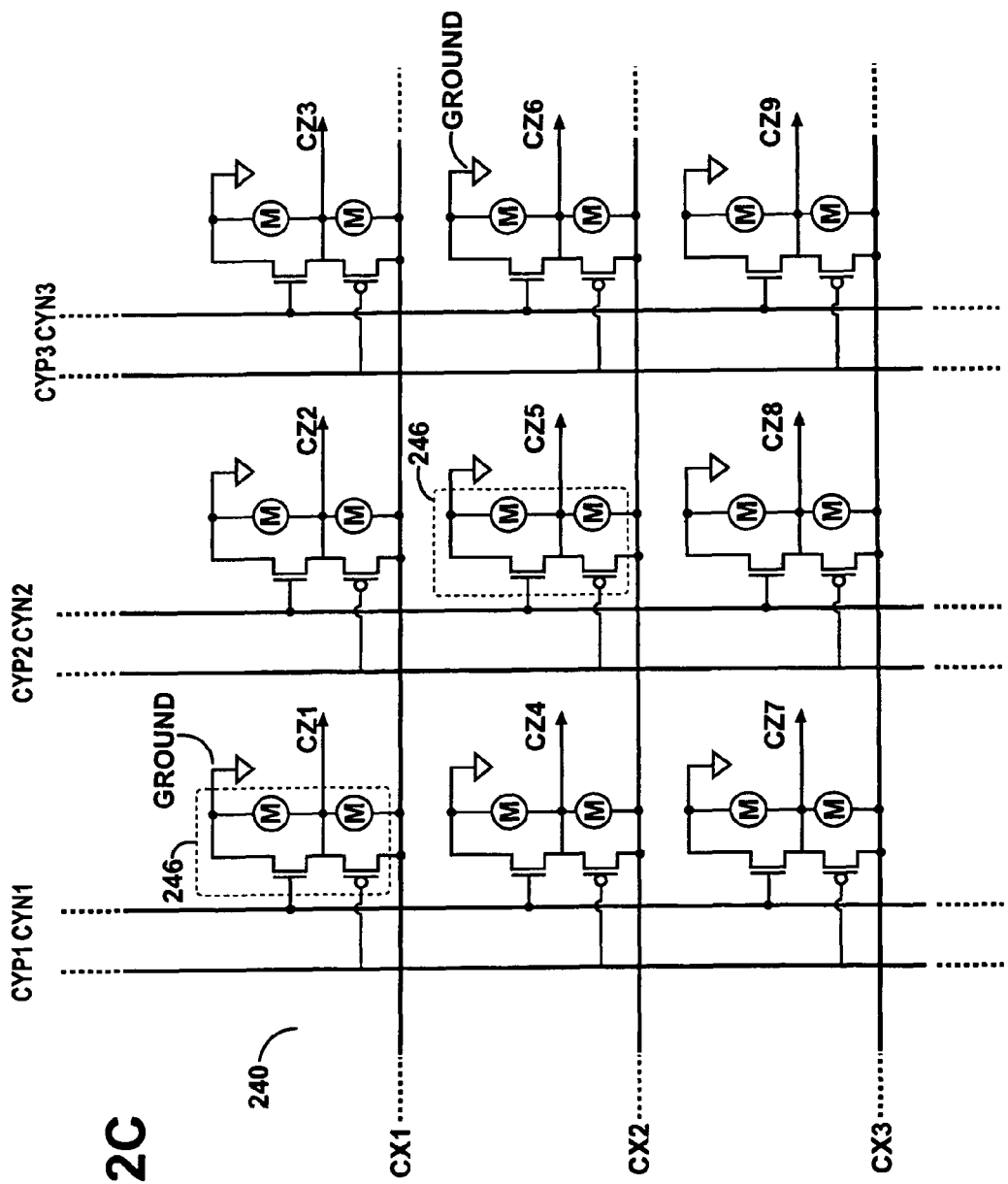
FIG. 32C shows an embodiment of a control circuit of the present invention comprising an array of control cells with CX lines, CYP lines and CYN lines.

Each of the output lines CZ1 through CZ9 shown in FIG. 32A may be coupled to the gate of a corresponding interconnect transistor QI. Referring to FIG. 32B, each of the output lines CZ1 through CZ9 may be coupled to a corresponding gate input line CZ1 through CZ9 of a corresponding transistor QI of the X-Y matrix 130. The control circuit 240 in combination with the array 130 may from a programmable matrix array which may be used as part of a programmable logic array. FIG. 32C shows an embodiment of an array of control cells 246. In other embodiments of the invention, the memory element M may be replaced in part or all of the cells with a threshold switching element T and/or antifuse breakdown device as described in the embodiments herein, including use of series and/or parallel transistor for biasing and programming.

Associated with a threshold switching element (also referred to herein as a threshold switch) is a current-voltage, or "I-V", characteristic curve. The I-V characteristic curve describes the relationship between the current through the threshold switching material as a function of the voltage across the material.

Figure 9A:
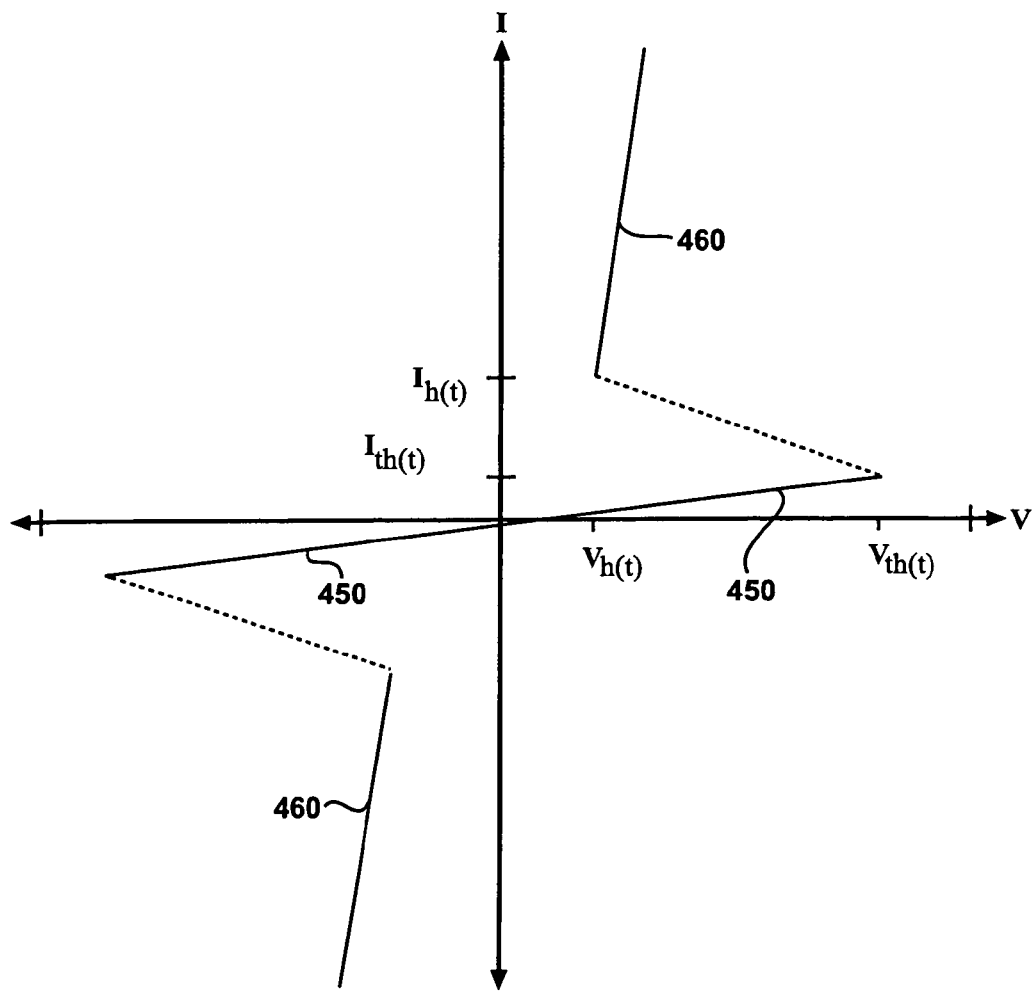
FIG. 9A is an example of a current-voltage curve of a threshold switching element without a breakdown layer.

An example of an I-V characteristic curve for a chalcogenide threshold switching element (formed without a breakdown layer) is shown in FIG. 9A. FIG. 9A shows the I-V plot in both the first quadrant (where voltages and currents are positive) and the third quadrant (where voltages and currents are negative). While only the first quadrant is described below, an analogous description applies to the curve in the third quadrant of the I-V plot (where the voltage and the current are both negative with a similar relationship).

The I-V characteristic curve IV includes an "off-state" branch 450 and an "on-state" branch 460. The off-state branch 450 corresponds to the branch in which the current passing through the threshold switching element (also referred to as a threshold switch) increases slightly upon increasing the voltage applied across the threshold switching element. This branch exhibits a small positive slope in the I-V plot and appears as a nearly horizontal line in the first (and third) quadrant of FIG. 9A, characteristic of high resistance.

The on-state branch 460 corresponds to the branch in which the current passing through the threshold switch increases significantly more upon increasing the voltage applied across the threshold material. The slope of the on-state branch 460 is greater (more positive in the 1.sup.st quadrant and more negative in the 3.sup.rd quadrant) than the slope of the off-state branch 460. This is characteristic of a threshold switching element having a dynamic on-state resistance which is lower than the off-state resistance. In the example shown in FIG. 9A, the on-state branch exhibits a large slope in the I-V plot and appears as a substantially vertical line in the first (and third) quadrant of FIG. 9A reflecting the relatively low dynamic resistance in this region. The dynamic resistance of the on-state branch 460 may be about 1,000 ohms and the resistance of the off-state branch 450 may be about 100,000 ohms to about 200,000 ohms or even greater.

The slopes of the off-state 450 and on-state 460 branches shown in FIG. 9A are illustrative and not intended to be limiting. Regardless of the actual slopes, the on-state branch 460 exhibits a steeper slope than the off-state branch 450. When conditions are such that the current through the threshold switching element and voltage across the threshold switching element is described by a point on the off-state branch 450 of the I-V curve, the threshold switching element is said to be in the off state. When conditions are such that the current through the threshold switch and voltage across the threshold switch is described by a point on the on-state branch of the I-V curve, the threshold switch is said to be in the on state (also referred to as the triggered or thresholded state).

The switching properties of the threshold switch can be described by reference to FIG. 9A. When no voltage is applied across the switch, the threshold switch is in the off state and no current flows. This condition corresponds to the origin of the I-V plot shown in FIG. 9A (current=0, voltage=0). The threshold switching element remains in the off state as the voltage across the threshold switching element and the current through the threshold switching element is increased, up to a voltage Vth(T) which is referred to as the threshold voltage of the threshold switching element. The current on the vertical axis that corresponds to the threshold switching voltage Vth(T) is referred to as the threshold switching current Ith(T).

When the applied voltage across the threshold switching element equals or exceeds the threshold voltage Vth(T), the threshold switching element switches from the off-state branch 450 to the on-state branch 460 of the I-V curve. The switching event occurs instantaneously and is depicted by the dashed line in FIG. 9A. Upon switching and depending upon the load impedance between the forced voltage and the threshold switching element, the voltage across the threshold switching element may decrease significantly and/or the current through the threshold switch increases and becomes much more sensitive to changes in the device voltage (hence, branch 460 is steeper than branch 450). In the embodiment of the I-V curve shown in FIG. 9A, it is seen that when the voltage across the threshold switching element reaches or exceeds the threshold voltage Vth(T), the voltage across the threshold switching element snaps back from the threshold voltage Vth(T) to a lower voltage Vh(T) which is referred to as the holding voltage of the threshold switching element. The current Ih(T) which corresponds to the holding voltage Vh(T) is referred to as the holding current of the threshold switching element.

The threshold switch remains in the on-state branch 460 as long as the current through the threshold switching element is at or above the holding current Ih(T). If the current through the threshold switching element drops below the holding current Ih(T), the threshold switching element normally returns to the off-state branch 450 of the I-V plot and requires reapplication of a voltage across the threshold switch which is greater than or equal to the threshold voltage Vth(T) (or a current through the threshold switching element which is greater than or equal to the threshold current Ith(T)) to resume operation on the on-state branch 460. If the current is only momentarily (a time less than the recovery time of the chalcogenide material) reduced below Ih(T), the on state of the threshold switch may be retained and/or recovered upon restoring a current through the threshold switching material which is at or above the holding current Ih(T).

Analogous switching behavior occurs in the third quadrant of the I-V plot shown in FIG. 9A, as apparent to one reasonably skilled in the art. For example, applied voltages having an absolute magnitude greater than the absolute magnitude of the negative threshold voltage in the third quadrant induce switching from the off-state branch 450 to the on-state branch 460.

It is noted that the current-voltage characteristic curve shown in FIG. 9A is an example of an S-type current-voltage characteristic curve. In one or more embodiments of the invention, a threshold switching element may be used which exhibits S-type current-voltage characteristics. The threshold switching element may be formed of a chalcogenide material. However, it is possible that the threshold switching element may not be formed of a chalcogenide material. The threshold switching element may be formed with or without a breakdown layer. It is conceivable that in one or more embodiments of the invention, other forms of threshold switching elements may be used (even those that may not exhibit S-type characteristics).

Figure 9B:
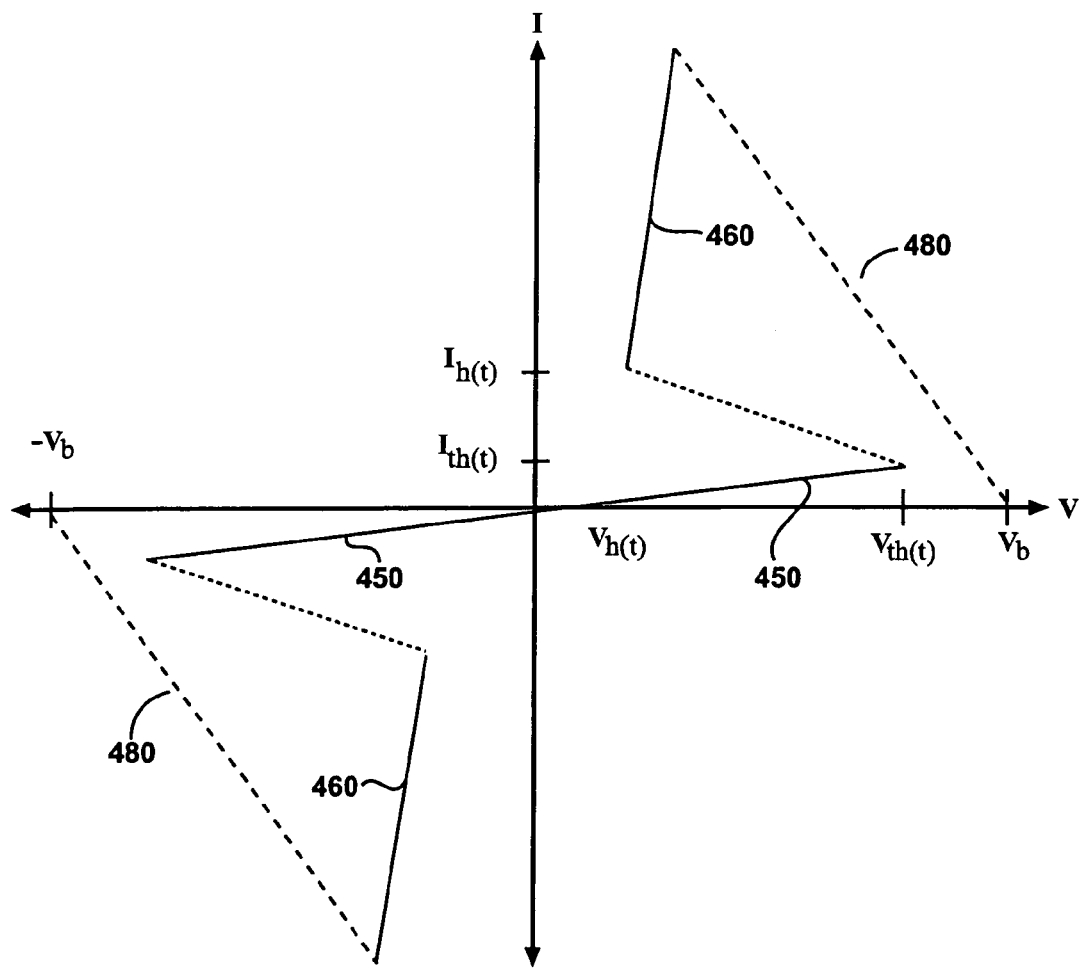
FIG. 9B is an example of a current-voltage curve of a threshold switching element with a breakdown layer.

FIG. 9A are the IV characteristics of a threshold switching element formed without a breakdown layer or formed with a breakdown layer that has been broken down. FIG. 9B shows the characteristics of a threshold switching element formed with a breakdown layer in series with the threshold switching material. The curves 450 and 460 represent the off state and on state branches (described above) of the I-V curve, after the breakdown layer is broken down.

The voltage Vb shown in FIG. 9B represents the voltage needed to breakdown the breakdown layer when a breakdown layer is placed in series with the threshold switching material. The value of Vb may be about equal to or greater than the value of the breakdown voltage of the breakdown layer itself. In the FIG. 9B, the voltage Vb is shown as greater than the threshold voltage Vth(T) of the threshold switching element.

The current flowing through the threshold switching element with a breakdown layer may be negligible when the breakdown layer is a good insulating layer. Hence, the current-voltage (I-V) curve may trace along the X-axis to the voltage Vb until the voltage Vb is reached.

After the voltage across the threshold switching element reaches or exceed Vb, the breakdown layer is broken down (e.g. is punctured, popped or shorted). The dashed line 40 indicates that the threshold switching element will then follow the branches 450 and 460 of a threshold switching element without a breakdown layer (unless the breakdown layer regrows or the threshold switching element is destroyed so as to go into an open circuit state). Of course, one can reverse a state in the embodiments herein as by destroying (forcing open) a memory element, a threshold switch and/or a breakdown device.

Figure 10A:
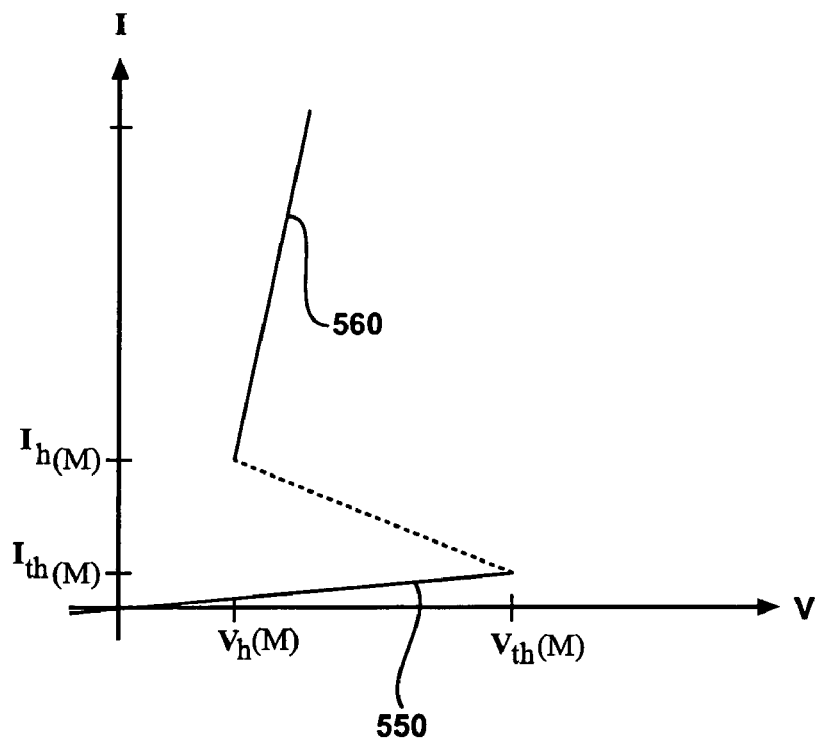
FIG. 10A is an example of a current-voltage curve of a phase-change memory element in the reset state without a breakdown layer.
Figure 10B:
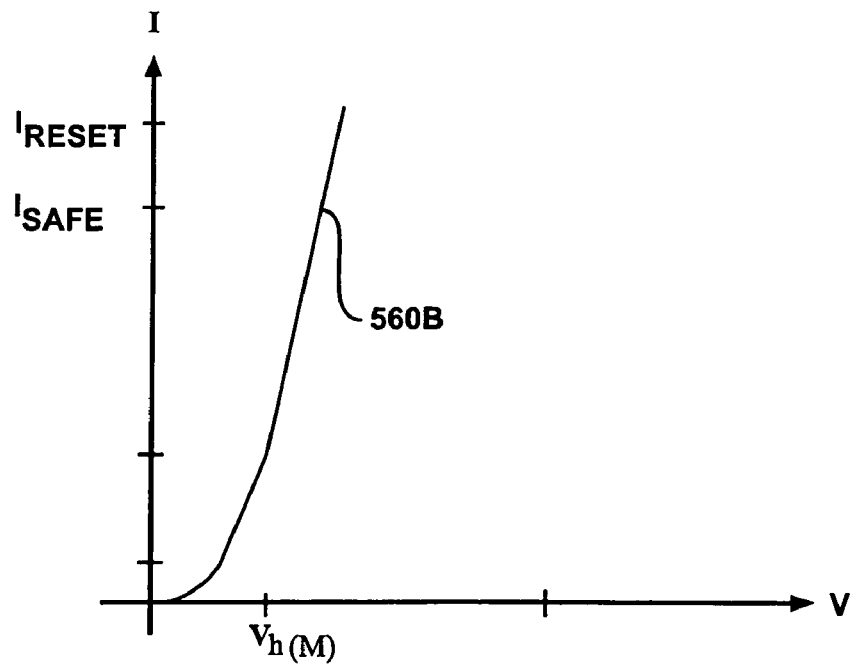
FIG. 10B is an example of a current-voltage curve of a phase-change memory element in the set state without a breakdown layer.

FIGS. 10A and 10B describe the current-voltage (I-V) characteristics of a chalcogenide phase-change memory element formed without a breakdown layer (that is, an MW device) or formed with a breakdown layer that has already been broken down. FIG. 10A corresponds to the I-V characteristics of the reset state of the memory element while FIG. 10B corresponds to the I-V characteristics of the set state of the memory element.

FIG. 10A corresponds to the I-V characteristics of a chalcogenide phase-change memory element in its reset state. In FIG. 10A, the I-V graph includes a first branch 550 and a second branch 560. The first branch 550 corresponds to a higher resistance branch in which the current passing through the device increases only slightly with increasing voltage across the device. The second branch 560 corresponds to a dynamic lower resistance branch in which the current passing through the device increases significantly with increasing voltage. When conditions are such that the current through the device and the voltage across the device is described by a point on the first branch 550, the device is in its high resistance or reset state. Until voltage across the device reaches or exceeds the threshold voltage Vth(M), the device can remain in its high resistance or reset state. The voltage Vth(M) represents the threshold voltage of the memory element in its reset state. The threshold current Ith(M) represent the current which corresponds to the threshold voltage Vth(M).

When the voltage across the memory element reaches or exceeds the threshold voltage Vth(M), the memory element switches from the first branch 550 to the second branch 560. The voltage across the memory element will then fall back (e.g. snapback) to a smaller holding voltage Vh(M) (plus current times dV/dI—the dynamic resistance in region 560). The current Ih(M) is the holding current of the memory element M in its reset state and is the current which corresponds to the holding voltage Vh(M).

On the second branch 560, the memory element becomes more conductive. While on the second branch 560, if a sufficient amount of energy is applied to the memory element, the device may be made to program from the reset state to its low resistance set state. Hence, the memory element may be made to stay in a low resistance set state even after any applied energy is removed.

When the memory element is on the low dynamic resistance branch 560, if the current is brought down below the holding current Ih(M) before the device is programmed to the set state then the device may return to the first branch 550 where it remains in the high resistance reset state. The device will remain on the first branch 550 until another voltage having an amplitude at or greater than the threshold voltage Vth(M) is applied across the memory element.

By changing alloys and/or thickness of the memory material, the threshold voltage Vth(M) may be varied, for example, from about 1 to about 4 volts, while the values of the holding voltage Vh(M) may be around 0.5 volts, depending on alloy and electrode used (of course, other values are possible). In addition, the value of resistance of the first branch 550 may be around 100,000 ohms or greater depending on the alloy and reset current applied (corresponding to the resistance of the high resistance reset state). The value of dV/dI of the dynamic resistance of the second branch 560 may be around 1000 ohms (corresponding to the resistance of the lower dynamic resistance state). The values of the threshold voltage Vth(M), the holding voltage Vh(M) and the holding current Ih(M) may depend, for example, on the size of the contact to the phase-change material as well as the composition of the phase-change material. The I-V characteristics of the second branch 560 may be expressed analytically as Vh(M)+dV/dI times the current through the memory element. The holding voltage Vh(M) may be found by the imaginary straight line extension of the second branch 560 to the X axis.

To prevent accidentally programming the memory element from its high resistance or reset state to its low resistance state or set state, the voltage across the device may be limited to less than the threshold voltage Vth(M) at times other than when the device is being programmed from the reset to the set state. In one or more embodiments of the invention, the threshold voltage Vth(M) may be made greater than the operating power supply range Vcc. For example, for at operating supply voltage Vcc of about 2.7 to 3.3 volts, the threshold voltage Vth(M) may be adjusted to be between about 4 volts or even higher. Then, the voltage used to program the memory element may be greater than the operating power supply voltage. In this case, a charge pump may be used to provide the necessary voltage or another external voltage may be provided for programming.

As noted, after the memory element has switched to the second branch 560 by the applied voltage reaching or exceeding Vth(M), if a sufficient energy is applied to the memory element, it can be made to program from the reset state to the set state and the memory element will then operate on branch 560B shown in FIG. 10B. In this case the memory element will remain on branch 560B shown in FIG. 10B until it is programmed back to its high resistance state (where it returns to an I-V characteristic like that in FIG. 10A).

The amplitude of the current needed to program the memory element from its reset state to its set state may vary, and may be adjusted with contact size. In one or more embodiments, the amplitude of the current may be greater than the holding current Ih(M) but less than the current Ireset (where Ireset is the current needed to program the memory element from its set state back to its reset state). For example, Ireset may have a value of between about 1 ma and about 2 ma. In one or more embodiments, the memory element may be programmed from its reset state to its set state by application of a pulse of energy about equal to or even greater than Ireset but having a slow trailing edge (for example, a trailing edge that may be slower than 1 usec).

After the memory element is programmed to its set state, the I-V characteristics will be as shown, for example, in FIG. 10B. FIG. 10B is an I-V curve corresponding to the set state of the memory element. The I-V curve shows a branch 560B which is similar to second branch 560 of FIG. 10A except that it extends more directly to the origin for voltages below Vh(M), to the origin. When the device has been programmed to its set state it will operate on branch 560B of FIG. 10B. It will remain on branch 560B (no matter how low the current is through the device) until it is programmed back to its reset state.

The resistance of the memory element in its set state may be, for example, around 5000 ohms and may go even lower as the voltage drop across the device approaches and exceeds the holding voltage Vh(M) (where the slope increases and dV/dI decreases along the curve 560B decreases towards, for example, 1000 ohms).

The memory element will remain in its set state and will operate on the branch 560B until it is programmed back to its reset state. That may be done by applying a current pulse of a sufficient amplitude Ireset and for a sufficient time, having a pulse width of, for example, greater than 10 nsec. The current pulse should have a relatively fast trailing edge (compared with the pulse to set the memory element), such as, for example, less than 10 nsec.

Hence, when the device is operating in the set state, care should be taken to preferably limit the current through the device to a level below Ireset (for example, Ireset/2 for good margin) unless it is actually desired to program the device. To ensure against accidental programming, the current through the memory element may be kept below a level Isafe which may be about 70% that of Ireset. Isafe may even be set to about 50% (or less) of Ireset to guard against noise and transients. The current needed to reset the device may be increased to improve margin against accidental programming by, for example, increasing the size of the contacts between the conducting layers and the phase-change material of the memory element.

Programming a phase-change memory element may be done with a higher voltage than the normal range of the power supply. This higher voltage may be supplied externally or on-chip by using a charge pump to create a voltage higher than the power supply, and used either regulated or unregulated on-chip.

Programming the memory element from the set state to the reset state may be accomplished, for example, with a current pulse having an amplitude of about 1.5 ma, a pulse width of about 10 nsec or greater, and a trailing edge of less than about 10 nsec. Programming the memory element from the reset state to the set state may be accomplished using a pulse having similar amplitude and width as a reset pulse but with a longer trailing edge (for example, 500 nsec or longer) than a reset pulse. Alternately, the memory element may be programmed from the reset state to the set state by a set pulse that may have a smaller amplitude (for example, about 1 ma) than a reset pulse and a longer width (for example about 200 nsec or longer) than a reset pulse. It is possible that the set pulse may have a slow trailing edge. It is also possible that the set pulse may have a fast trailing edge (for example, less than 10 nsec) but with an amplitude that is less than that of a reset pulse. The amplitude, width and trailing edge of both the set and reset programming pulses may be adjusted to fit the composition of the phase-change alloy used (which may be a chalcogenide alloy). Such values may be adjusted to fit the composition of the alloy after characterization—using techniques familiar to those reasonably skilled in the art.

In one or more embodiments, a current pulse used to program the device to its set state may have a smaller amplitude and a greater width than that used to program the device to its reset state. For example, the current pulse used to program the device to its set state may have an amplitude of about 1 ma and a width of about 200 nsec (nanoseconds). In another embodiment, when setting the device, a reset pulse may first be applied followed by a set pulse using a slow trailing edge such as greater than 500 nsec, and perhaps 1 usec (microsecond), depending on choice of alloy.

Figure 10C:
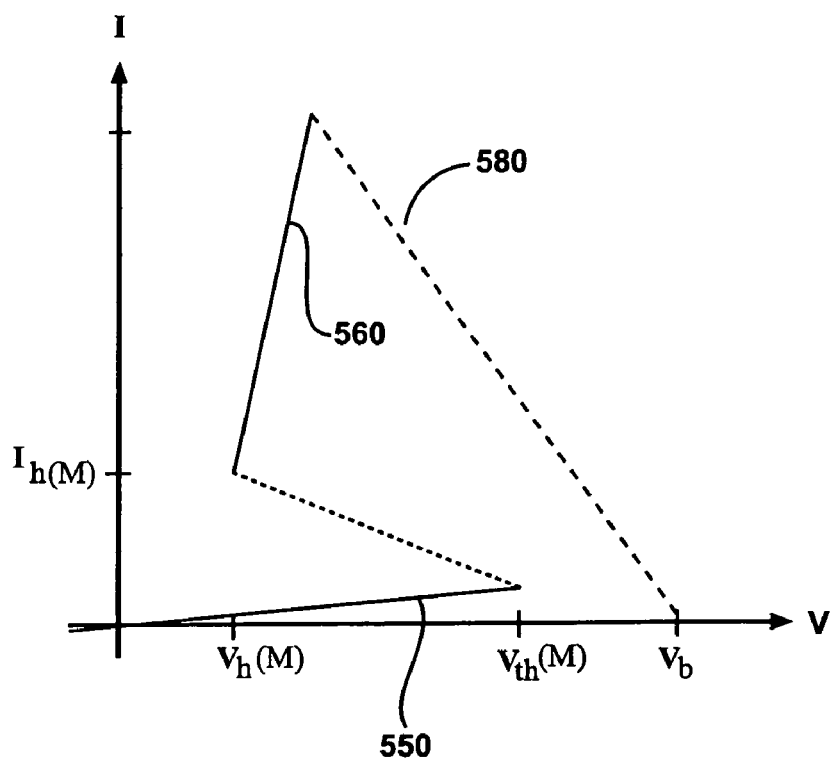
FIG. 10C is an example of a current-voltage curve of a phase-change memory element in the reset state with a breakdown layer.
Figure 10D:
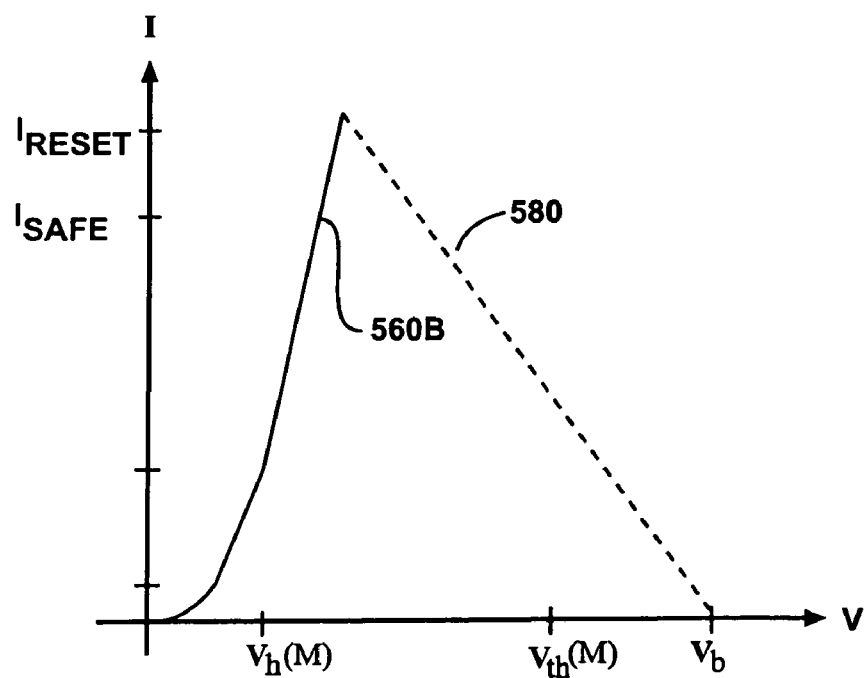
FIG. 10D is an example of a current-voltage curve of a phase-change memory element in the set state with a breakdown layer.

Similar programming techniques, as described above, may be used to program a memory element that includes a breakdown layer (such as an MB device). FIGS. 10C and 10D show current-voltage I-V curves for a memory element formed with a breakdown layer in series with the memory material. The dashed line 580 represents that a device initially formed with a breakdown layer may be transformed into a device where the breakdown layer is broken down, and thereafter performs similar to a device without a breakdown layer with I-V curves as shown in FIGS. 10A and 10B (it is possible that the resistance may be increased relative to an embodiment without the breakdown layer or anti-fuse).

The breakdown voltage Vb shown in FIGS. 10C and 10D represents the voltage needed to breakdown the breakdown layer when a breakdown layer is in series with the memory material. The breakdown voltage Vb may be about the same as or greater than the breakdown voltage of the breakdown layer itself. In FIGS. 10C and 10D, the voltage Vb is shown to be greater than the threshold voltage Vth(M) of the memory element.

If a phase-change memory element is formed with a breakdown layer in series with the memory material, the memory element has very high resistance to current flow until the voltage across the memory element reaches or exceeds the voltage Vb.

After the breakdown layer is broken down and rendered conductive (by a voltage with adequate amplitude equal to or exceeding Vb), a memory element with a breakdown layer (for example, an MB type device), behaves like a memory element without a breakdown layer (for example, an MW device) and returns to the dV/dI portion of the set or reset I-V curve. The state of the memory after forcing the breakdown layer to be broken down may depend on the state programmed while on the dV/dI portion of the curve (branch 560 of FIG. 10C or branch 560B of FIG. 10D), especially if Ireset was exceeded during the breakdown operation with adequate pulse width, such as more than 10 nsec. Otherwise, if the breakdown current or width is less than that required to program the memory element into set or reset (or trigger a threshold switch), the bit state may be determined by the state from prior processing. For example, heat above 400 C and a normally slow cooling rate during wafer processing or packaging may leave the memory element in the set state.

For example, after a breakdown operation with a high current of 2 ma, if the current is reduced with a trailing edge rate after breakdown that is slower than the edge rate that crystallizes, for example slower than 500 nsec for GST 225, the now MW-like device (without an in-tact breakdown layer) may be set. Or, for a peak current that is above Ireset for more than 10 nsec, and reduced with a fast trailing edge, such as by reducing the peak breakdown current below Isafe with a 10 nsec edge rate after breakdown, the now MW-like device may then instead be reset for an initial state after breaking down the breakdown layer. Thereafter, unless the insulating layer were to regrow, the device may continue to remain and operate like an MW device.

Figure 11:
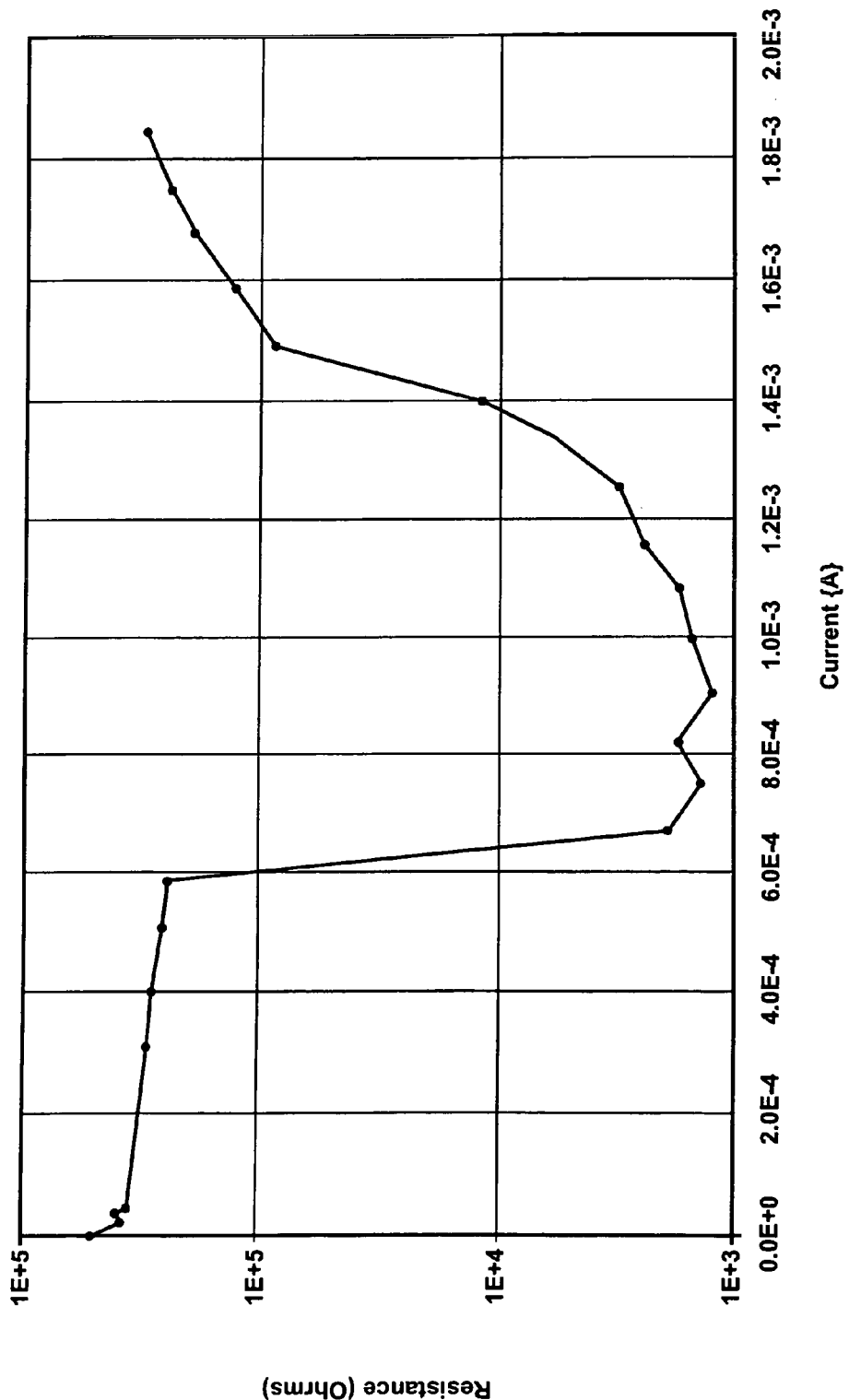
FIG. 11 is an example of a current-resistance curve for a phase-change memory element.

FIG. 11 provides an example of a current-resistance I-R curve of a chalcogenide phase-change memory element showing the resistance of the device as a function of the amplitude of a current pulse applied through the device. The current pulses applied at each point on the curve may have a pulse width of about 250 nsec with a rising edge and a trailing edge each having a time of less than 10 nsec. The width of the current pulses may be chosen so as to exceed both the required set and reset pulse widths (if necessary, this may be about 1 usec, depending on alloy) to show the effect on resistance from varying the current amplitude alone. In FIG. 11, the current amplitude applied is shown on the X-axis while the resulting resistance measured during read after terminating the write pulse is shown on the Y-axis. Here, the resistance may be measured (during read) by sensing the current through the memory element with about 0.2V applied across the device, a voltage here chosen to be less than the holding voltage to reflect more the set or reset resistance than the dV/dI resistance above Vh. However, the read voltage chosen for measuring resistance may be altered to better fit the application of the device.

The range at which the memory element may be programmed to the low resistance or set state, here shown for example as about 0.5 ma to 1 ma, may vary with contact opening size across the die and may drift with repeated write cycles as the device matures and then deteriorates from wear-out. Hence, adequately centering the set pulse current amplitude within this optimum range may require feedback, perhaps a binary search method of programming at one current and then measuring the resulting resistance, as a memory element is programmed. Then, the set resistance may be measured and rewritten at an alternate write amplitude until a satisfactorily low set resistance is obtained. Similarly, a higher reset resistance may be programmed with feedback, using techniques familiar to those skilled in the art.

Alternatively, such feedback methods, with attendant requirements to read a bit after programming, may be minimized or avoided by programming the bit with the same current amplitude that adequately exceeds that required for assured reset to a high resistance, choosing the resulting resistance to be high or low by respectively using a fast or slow trailing edge rate to terminate the write pulse.

For example, the current Ireset at which the memory element may be programmed to its reset state (which may have a resistance of about 100,000 ohms or higher), may be measured at the factory and found to be 1.6 ma, as shown in the example I-V curves. Using fuses or anti-fuses in the factory production process, the reset (and set) programming amplitude as well as pulse width and trailing edge for both set and reset pulses may be adjusted to fit the alloy composition resulting from production. The fuses may be phase-change material. However, other alternatives such as laser fuses or oxide (or oxide-nitride) antifuses maybe preferred to avoid changing from later heating such as from packaging or soldering. Settings, such as for reset current amplitude, may be adequately high, such as at 1.6 ma, to assure adequate current to reliably program all the phase-change programmable connections on a given die to an adequately high resistance. Feedback techniques can also be used to further increase the current used in the field. For even more margin against subsequent drift or deterioration (but at the expense of reduced write cycle endurance), the current used may be even higher, such as at 2 ma or greater for resetting a bit, and the trailing edge slower for setting a bit (at this higher amplitude).

This write current required may be measured at probe, and may be adjusted on chip to be adequately higher than the worst bit measured. This current may be further adjusted higher to provide adequate margin reflecting process characterization correlated to data retention and changes with operation, using techniques familiar to those skilled in the art. And the same current may be used to program both states by using slow or fast trailing edge to determine resistance state preferred after programming.

For example, for a die where the max required Ireset required to program to adequately high resistance, viz. 200,000 ohms, is 1.6 ma, then 2 ma or even 3 ma may be used to program both the set and reset states throughout the life cycle of the product for all phase-change programmable connections on that example chip. Then, the bits may be confirmed by reading after writing and rewritten. Or, if field failure is experienced, the current may be dynamically increased in the field by an on-chip write controller for further re-programming attempts using an even higher write current amplitude.

Then, regardless of its prior state, a phase-change memory element may be written to a reset state resistance greater than, for example, 200,000 ohms by applying a 3 ma pulse for at least 20 nsec (to assure margin on the width) and with a fast trailing edge less than 10 nsec. To write the cross-point to a lower set state resistance such as, for example, to less than 10,000 ohms, regardless of its prior state, the same 3 ma amplitude and 20 nsec pulse width may be applied, but with a slower trailing edge rate, for example a trailing edge rate greater than one micro-second from peak to off. Alternately, for faster speed of programming to set state, the trailing edge may fall slowly to less than half of Ireset, such as to 0.5 ma for the example device in FIG. 11, and fast thereafter to off current. Application of this set-slope technique may be better understood by reference to U.S. Pat. No. 6,487,113 which is hereby incorporated by reference herein.

Figure 16:
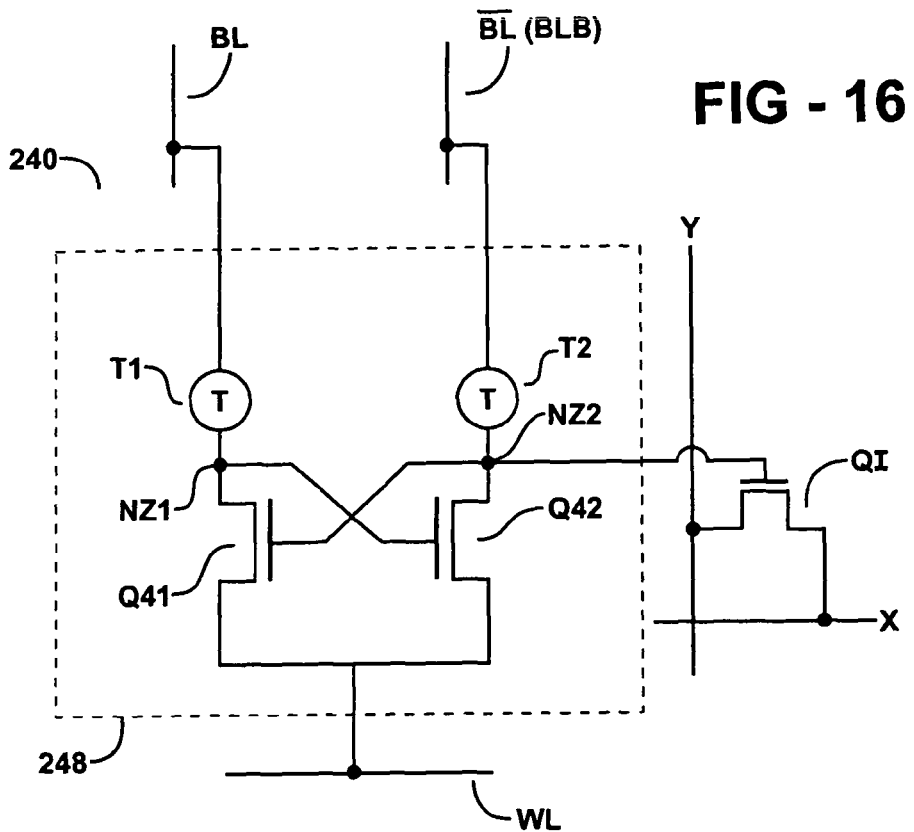
FIG. 16 shows an embodiment of a control cell of the present invention having cross coupled transistors where each load include a threshold switching element.

Another embodiment of the present invention is shown in FIG. 16. FIG. 16 shows an embodiment of a control circuit 240 used to control the state of the cross-connect transistor QI. The control circuit 240 shown in FIG. 16 comprises a control cell 248, a bitline BL, a bitline bar BLB, and a word line WL. The control cell 248 comprises threshold switching elements T1, T2 and NMOS transistors Q41, Q42. The NMOS transistors are cross-coupled. The gate of Q41 is coupled to the drain of Q42 at node NZ2 while the gate of Q42 is coupled to the drain of Q41 at node NZ1. The source of each transistor Q41, Q42 is coupled to the word line WL. As noted, the control circuit 240 in FIG. 16 includes a pair of bitlines, including a bitline BL and a bitline bar BLB. Threshold switching element T1 is coupled between bitline BL and node NZ1 while threshold switching element T2 is coupled between bitline bar BLB and node NZ2. Node NZ2 is coupled to the gate of transistor QI so that the voltage at node NZ2 controls the state of the transistor NZ2. It is noted that the control cell 248 has two legs or sides. For example, the first leg (or side) is coupled to bitline BL and includes threshold switching element T1 and transistor Q41 while the second leg (or side) is coupled to bitline bar BLB and includes threshold switching element T2 and transistor Q42.

The control cell 248 may be programmed between a first state and a second state. For example, the control cell 248 may be programmed to a first state whereby the transistor Q41 and the threshold switching element T1 are both on while the transistor Q42 and threshold switching element T2 are both off. In this state, the voltage at node NZ1 may be relatively low while the voltage at node NZ2 is relatively high. With the node NZ2 coupled to the gate of the transistor QI, the transistor QI may be turned on so that the connection between the X and Y lines may be CLOSED.

Likewise, the control cell 248 may be programmed to a second state whereby the transistor Q42 and the threshold switching element T2 are both on while the transistor Q41 and the threshold switching element T1 are both off. In this state, the voltage at node NZ1 may be relatively high while the voltage at node NZ2 may be relatively low if wordline WL is low. Since the voltage at node NZ2 is coupled to the gate of transistor QI, the transistor QI may be turned off and the programmable connection may be in an OPEN state.

As a further embodiment of the invention, to reduce current drain, a control cell 248 may be programmed where threshold switching element T1 is off and threshold switching element T2 is on when transistor Q41 is on and transistor Q42 is off. Provision must then be made to assure adequate leakage in transistor Q42 (and transistor Q42) when off so that current through the on threshold switching element remains than the holding current Ih(T) (such as, for example, by a parallel slightly on transistor or by depleting part of the channel for transistor Q41 and transistor Q42).

The control cell 248 shown in FIG. 16 may be used to drive a cross-point transistor coupled between an X and a Y line. As shown in FIG. 16, node NZ2 is coupled to the gate of transistor QI. The drain of QI may be connected to a Y line while the source of QI may be connected to an X line. When node NZ2 is high, the voltage Vgate on the gate of transistor QI is also high and transistor QI is on so that the connection between X and Y is CLOSED. For example if the X line is connected to driver in the low state, the driver may also drive the Y line low through transistor QI when transistor QI is on. Conversely, if the driver is high, the driver may drive the X line high and the Y line high until QI turns off. Transistor QI may turn off if the normal high level of node NZ2 is about the same as the high level of the logic. For that case, line Y will be driven to within the threshold voltage Vt(n-channel) of the high level on the X line.

The control cell 248 shown in FIG. 16 may be operated in different ways. In accordance with one embodiment of the present invention, a voltage Vcc may be chosen as the maximum operating voltage for the integrated circuit or chip. In one embodiment, it may be 3 volts. In one or more embodiments, the threshold switching elements T1, T2 may be designed to have a threshold voltage Vth(T) between 2Vcc/3 and Vcc. In one or more embodiments, the threshold switching elements T1 and T2 may be designed to have a holding voltage Vh(T) between Vcc/3 and 2Vcc/3. With the threshold voltages and holding voltage so chosen, all unselected word lines may be biased to Vcc/3 in some embodiments. All unselected bitlines BL and bitline bars BLB may be biased to 2Vcc/3 in some embodiments. Selected word lines WL may be biased at a voltage less than the unselected word line voltage. The logic section of the chip with the interconnect to be coupled may operate at a voltage range Vcc/3 to 2Vcc/3. (It is noted that in an alternate embodiment of the invention, the voltage Vcc may be replaced with a voltage V that may be higher or lower than Vcc. For example, V may be pumped up from Vcc).

In one embodiment, a selected cell may be written to by biasing the selected cell's word line WL to 0 volts. To write a 1, the selected cell's bitline BL may be biased to Vcc, while the selected cell's bitline bar BLB may be kept at 2Vcc/3. To write a 0, the selected cell's bitline bar BLB may be biased to Vcc, while the selected cell's bitline BL is kept at 2Vcc/3.

The cross coupled NMOS transistors Q41, Q42 may have threshold voltages Vt (e.g., voltage between gate and source) which are less than Vcc/3. The threshold voltage of the transistors Q41, Q42 may be higher to assure that the sub-threshold current into the drain of the off transistor is substantially less than the positive pull-up current from the threshold switching elements T1, T2 on the drain of the off transistor over the specified temperature range. That is, the leakage current of a threshold switching elements T1, T2 with less than 0.1 volts across it may be more than the leakage of the off transistor Q41 or Q42. The substrate may be biased or pumped negative relative to the most negative voltage imposed on the word line WL to avoid unreasonably high body effect that can lower the threshold voltage when the word line is low and cause excessive sub-threshold transistor leakage in off transistors, in some embodiments.

In the following discussion, detailed embodiments of possible write operations are provided. However, the present invention is not limited to any particular embodiment. These examples are given without limiting the scope of present invention.

As noted, an unselected cell may have a wordline WL at Vcc/3, a bitline BL at 2Vcc/3 and a bitline bar BLB at 2Vcc/3. One embodiment of selecting and writing to a cell may be to first bias the wordline WL to 0 volts. Then, to write a 1, the selected cell's bitline BL may be biased to Vcc while the selected cell's bitline bar BLB may be kept at 2Vcc/3. To write a 0, the selected cell's bitline bar BLB may be biased to Vcc while the selected cell's bitline BL is kept at 2Vcc/3.

Hence, it is initially assumed that the wordline WL is biased to about Vcc/3 while the bitline BL and the bitline bar are each biased to about 2Vcc/3. In addition, it is assumed that the cell is initially in the 0 state with threshold switching element T1 and transistor Q41 being on and with threshold switching element T2 and transistor Q42 being off. With NMOS transistor Q41 being on, the voltage difference between its source and drain is close to 0 and the voltage at node NZ1 is low at about Vcc/3. With the NMOS transistor Q41 on, there is also high capacitive coupling between the gate of the NMOS transistor Q41, its drain, channel, and source. With threshold switching element T2 and transistor Q42 being off, the voltage at node NZ2 is high at about 2Vcc/3.

To write a 1 to the cell, the wordline WL is brought to 0, and the bitline BL is brought to Vcc, while the bitline bar BLB remains at 2Vcc/3. The threshold switching element T1 now has Vcc volts applied across it. This voltage is greater than its threshold voltage Vth(T) of the threshold switching element so that the threshold switching element T1 is turned on and goes to a more conductive state. The voltage drop across the threshold switching element T1 is the holding voltage Vh(T) (with Vh(T) may be between Vcc/3 and 2Vcc/3 so that the voltage at node NZ1 is high at about Vcc-Vh(T) (which is greater than Vcc/3). The high voltage at node NZ1 is applied to the gate of transistor Q42 thereby turning Q42 on.

The voltage across threshold switching element T2 is about Vcc/3 so that threshold switching element T2 remains off while T1 turns on. Thus, the cross coupled latch, formed of the transistors Q41, Q42, switches states by turning on NMOS transistor Q42 with a low source impedance gate voltage and this turns off NMOS transistor Q41, due to node NZ2 being pulled down to 0 volts when transistor Q42 turns on, as its gate voltage is raised by the threshold switching element T1.

Next, the bitline BL reduces the voltage across the threshold switching element as the bitline is lowered (instead of lowering node NZ1 as the bitline is lowered.

A capacitive divider action after a threshold switching element turns off lowers node NZ1 from Vcc minus the holding voltage of the threshold switching element T1 as the bitline BL voltage lowers. The capacitance across the threshold switching element T1 may, preferably, be much less than the transistor and parasitic capacitance on node NZ1. The holding voltage Vh(T) of the threshold switching element may, preferably, be adjusted to be enough less than 2Vcc/3 to accommodate the capacitive coupling down of node NZ1 from lowering the bitline BL to 2Vcc/3 so that node NZ1 remains more than Vcc/3 greater than the word line WL potential after bitline BL returns to 2Vcc/3, upon deselection after write. If node NZ1 remains more than Vcc/3 greater than the word line WL potential and Vt(transistors Q41, Q42) are less than Vcc/3, then transistor Q42 is assured to remain on.

Because node NZ1 is pulled up to and starts at Vcc minus the holding voltage of the threshold switching element during the write cycle, the voltage across the threshold switching element T1 falls below its holding voltage and turns off when the bitline is lowered from Vcc to 2Vcc/3 since the voltage across the threshold switching element T1 is reduced from its holding voltage by Vcc/3, since node NZ1 remains relatively constant as the bitline BL is lowered (due to capacitance mostly from node NZ1 through "on" transistor Q42).

Lowering the bitline to 2Vcc/3 leaves the node NZ1 at more than 2Vcc/3 minus the holding voltage of the threshold switching element, because of the capacitive coupling of the node NZ1 to the bitline BL. Preferably, node NZ1 is not less than Vcc/3, by assuring that the holding voltage of the threshold switching element is adequately less than 2Vcc/3 to accommodate capacitive coupling. Similarly, the holding voltage of the threshold switching element may be less than 2Vcc/3 so that when the word line voltage rises, the voltage from the word line WL to node NZ1 stays greater than Vcc/3. Here, the capacitive coupling as the word line is deselected back to Vcc/3 reduces margin (voltage between node NZ1 and the word line that keeps transistor Q42 on). Accordingly, the capacitive ratio, Vh(T) and Vth(T), are preferably adjusted so that transistor Q42 remains on when the word line is deselected, such as to Vcc/3. Even if transistor Q42 turns off, node NZ2 is lower than node NZ1, so node NZ2 rises enough to turn transistor Q42 back on before node NZ2 rises to turn transistor Q41 on (after deselection).

After the word line WL is brought backup to Vcc/3, because of the NMOS transistor Q42, there is high capacitive coupling between the gate of the NMOS transistor Q42 and its drain, channel and source. Thus, node Q42 couples up to a value preferably greater than 2Vcc/3 and less than Vcc. Vcc and the holding voltage of the threshold switching element are adjusted for parasitic capacitance ratio to prevent the voltage between node Q42 and the word line WL from being less than a threshold voltage plus an on voltage, where the on voltage is adequate to maintain the cell state during word line switching from Vcc/3 towards 0 during reading. If transistor Q42 remains on when the word line WL returns to Vcc/3, node NZ2 is also brought up to Vcc/3, following and remaining about equal to the word line potential at Vcc/3 because transistor Q42 remains on during the transitions of the word line during standby and read. Should margin decay and transistor Q42 turn off as word line WL is deselected, the node NZ2 may temporarily remain less than Vcc/3 and gradually be charged up to Vcc/3 by threshold switching element T2 (or pulled up once transistor Q42 turns after node NZ1 is charged up by device T1 to be above word line WL plus the threshold voltage of transistor Q42.

To write a 0 into node NZ1 where the cell is previously in the 0 state and has a low voltage on node NZ1 relative to node NZ2, the word line of the selected cell is pulled down to 0 volts. The NMOS transistor Q31 remains on and node NZ1 follows, being pulled down to 0 volts. With the NMOS transistor Q41 on, there is a high capacitive coupling between the gate of the NMOS transistor Q41 and its drain, channel, and source. Thus, node NZ2 is coupled down from 2Vcc/3 to close to Vcc/3 when the word line voltage goes down.

To write 0, the bitline bar BLB is brought up to Vcc, while the bitline BL remains at 2Vcc/3. The threshold switching element T1 now has 2Vcc/3 applied across it and remains off. The threshold switching element T2 has 2Vcc/3 applied across it and it also remains off. Thus, neither threshold switching element T1, T2 turns on.

Next, the bitline bar BLB is brought back to 2Vcc/3. With NMOS transistor Q41 on, there is high capacitive coupling between the gate of the NMOS transistor Q41 and its drain, channel, and source. Thus, node NZ2 remains at a value close to Vcc/3, the voltage it was at before the bitline bar BLB was raised to Vcc. Then, the word line WL is brought back up to Vcc/3. Again, with the NMOS transistor Q41 on, there is a high capacitive coupling between the gate of the NMOS transistor Q31 and its drain, channel, and source. Thus, node NZ2 couples up to 2Vcc/3, keeping the NMOS transistor Q41 on and node NZ1 is also brought up to Vcc/3, following the word line potential.

For the case where the cell is previously in the one state, writing a 1 or a 0 is symmetrically analogous to the procedure described above.

A worse case write condition may exist where the on voltage for an unselected bit may be increased by writing another bit repeatedly on the same column. In this case, a bit is repeatedly written on the same column to the same state on the bitline. For this repeating write cycle, a bitline is repeatedly pulled to Vcc from 2Vcc/3 for write and then back up to 2Vcc/3 after write. For example, a bitline spending half of the time at Vcc, compared to 2Vcc/3, will be at an average voltage of 2.5Vcc/3, the voltage seen by other bits on the column that are not written. Since this is the effective pull-up voltage on the column through which the threshold switching element charges node NZ1 (or node NZ2 if it is bitline bar that is not actively driven low by an on transistor). Thus, the threshold switching element T1, T2 pulls the "off" node up to the average voltage on the bit line, and internal node NZ1 on the unwritten bits is pulled to 2.5Vcc/3 because the internal node impedance is greater than the time of a write cycle.

After the column is "hammered" so long that the internal node is as high as it can go on the unwritten bits, the opposite state is written to a cell that is on the hammered column, but was not the cell selected during the hammering. Here, the drive on the on transistor Q42 is greater due to the higher gate voltage, so that more current is forced into node NZ2 through the bitline bar when bitline bar is the bit line pulled to Vcc. To minimize the increase in worse case current necessary through the threshold switching element T1, T2, the duty cycle may be minimized and, preferably, does not exceed a given percentage, such as 50 percent. Otherwise, Vcc may be increased or the maximum threshold voltage reduced so that the ratio of the on voltage (the voltage on node NZ1 minus the threshold voltage minus the word line voltage) for its maximum value versus its minimum value during write is reduced to assure that excessive current is not required through the threshold switching element to overcome the on resistance. Similarly, the minimum on voltage may be chosen by increasing Vcc and/or reducing threshold voltage so that when the word line is pulled to ground, the transistor is on hard enough so that the on transistor keeps the node reasonably near the word line voltage to avoid the possibility of flipping the bit if there is a mismatch between the internal nodes NZ1 or NZ2 of a given bit.

Also, the holding voltage Vh(T) and the voltage Vcc may be adjusted so that the minimum on voltage (Vonmin) is maintained and adequate even if there is significant parasitic capacitance on node NZ1 or feedthrough capacitance from the threshold switching element. That is, to increase Vonmin, Vh(T) may be reduced and/or Vcc increased to minimize drain-source "on" voltage for the "on" transistor, when the word line is lowered so that the opposite transistor in the cell does not tend to come on and "flip" the bit—causing a bit disturb condition.

For cases with less margin, where a bit may have just been written and the node NZ2 (driven by the off transistor) is not yet high enough when the word line is deselected to Vcc/3, read or write disturb may be avoided. To minimize the source to drain voltage for the on transistor during the transition of the word line from Vcc/3 to 0, the word line may be driven with a controlled, relatively slow edge rate initially, such as with a current source, for at least 50% or more of the transition so the transistor is turned on with more Von before driving the word line at a faster dV/dt rate to ground.

During write, the current into the column selected may be sensed as the column is driven from 2Vcc/3 to Vcc. If the current does not increase after a brief period (e.g., 10 nsec) or if it increases and then decreases, the write cycle may be terminated. This similarly minimizes the write cycle time and decreases the time the bit lines are at other than the deselect voltage. To ease the write current, the Ron of the transistors Q41, Q42 may be increased (by adjusting the width or length of transistors Q41, Q42). If Ron (transistor) is less then Rdyn (threshold switching element T1, T2), the cell will write more readily at less current. Similarly, if Rdyn (threshold switching element T1, T2) is low so the drop at peak write current is low, the voltage margin may improve.

In the embodiment shown in FIG. 16, when node NZ2 is low (and node NZ1 is high), the wordline WL may be at or below the low level in the logic section (so wordline WL may be less than the levels on the Y line or X line). Then, transistor QI will remain off (the connection may remain OPEN) for the high and low levels on the X and Y lines.

To improve margin against triggering on the threshold switching elements T1 or T2 when not desired, the voltages driven into bitline BL and bitline bar BLB may be controlled by a regulator, furnished either on or off-chip. Such a regulator may be a bandgap regulator furnishing voltages relatively tightly controlled even though the operating voltage Vcc and temperature change. Such a regulated voltage may also furnish the levels used in the logic to assure better matching in the drive from the control cell into the interconnect transistor QI. Any of the embodiments described herein may similarly use a regulator to control voltages into the control cell and/or logic section. Hence, in any of the embodiments presented, an operating voltage such as Vcc may be regulated and replaced with a regulated operating voltage such as Vcc(REG).

Figure 17:
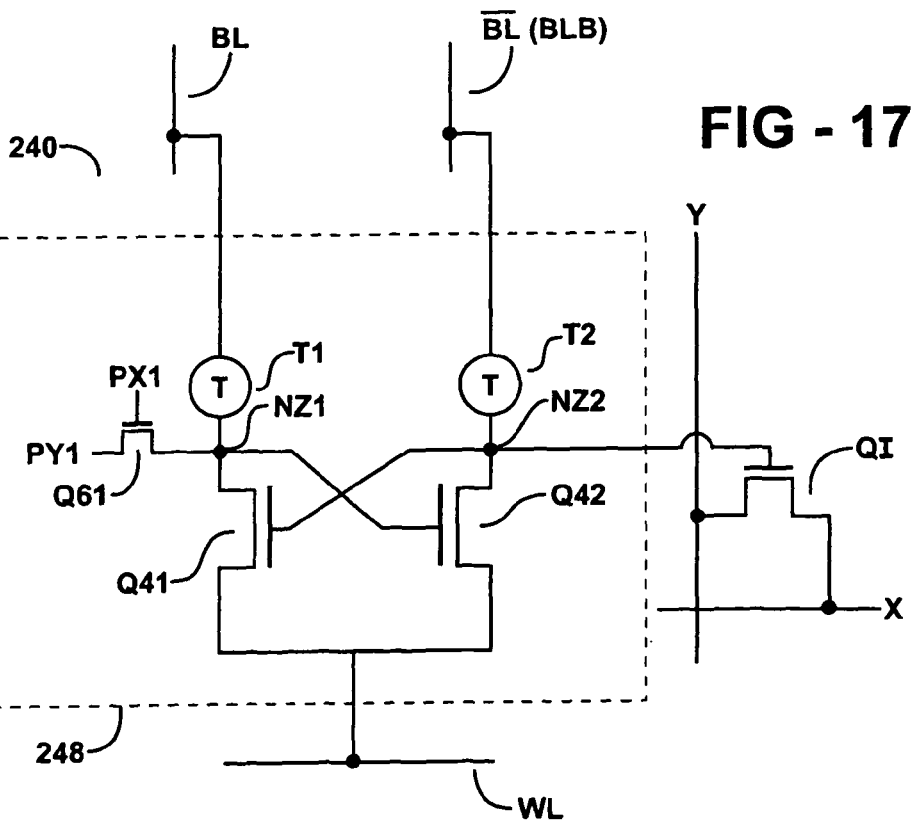
FIG. 17 shows an embodiment of a control cell of the present invention having cross coupled transistors where each load includes a threshold switching element.

Another embodiment of the present invention is shown in FIG. 17. FIG. 17 shows a control cell 248 comprising transistors Q41, Q42 as well as threshold switching elements T1, T2. To further assist programming, a transistor Q61 (having control lines PX1/PY1) may be coupled to node NZ1 as shown in FIG. 17. It is conceivable that an additional transistor with additional control lines PX2/PY2 may be coupled to node NZ2. Other additional circuits to control the bias on the added transistor or transistors during normal operation and programming may be added as will be familiar to one reasonably skilled in the art.

Figure 18:
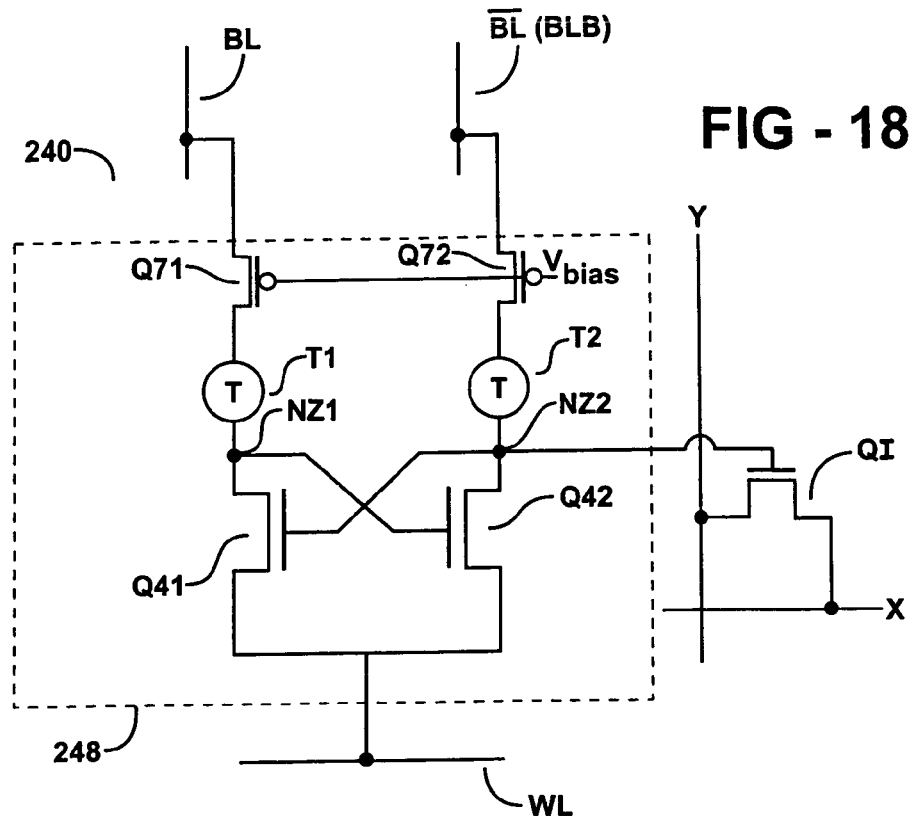
FIG. 18 shows an embodiment of a control cell of the present invention having cross coupled transistors where each load includes a threshold switching element.

Another embodiment of the invention is shown in FIG. 18. FIG. 18 shows a control cell 248 comprising transistors Q41, Q42 as well as threshold switching elements T1, T2. The current through transistors Q41 and Q42 may be limited by addition of a first current limiting transistor Q71 with source and drain coupled between threshold switching element T1 and bitline BL, and a second current limiting transistor Q72 with source and drain coupled between threshold switching element T2 and bitline bar BLB. This is shown in FIG. 18 with the addition of transistors Q71 and Q72. In another embodiment, the transistors Q71, Q72 may be interchanged with the threshold switching elements T1, T2.

Figure 19:
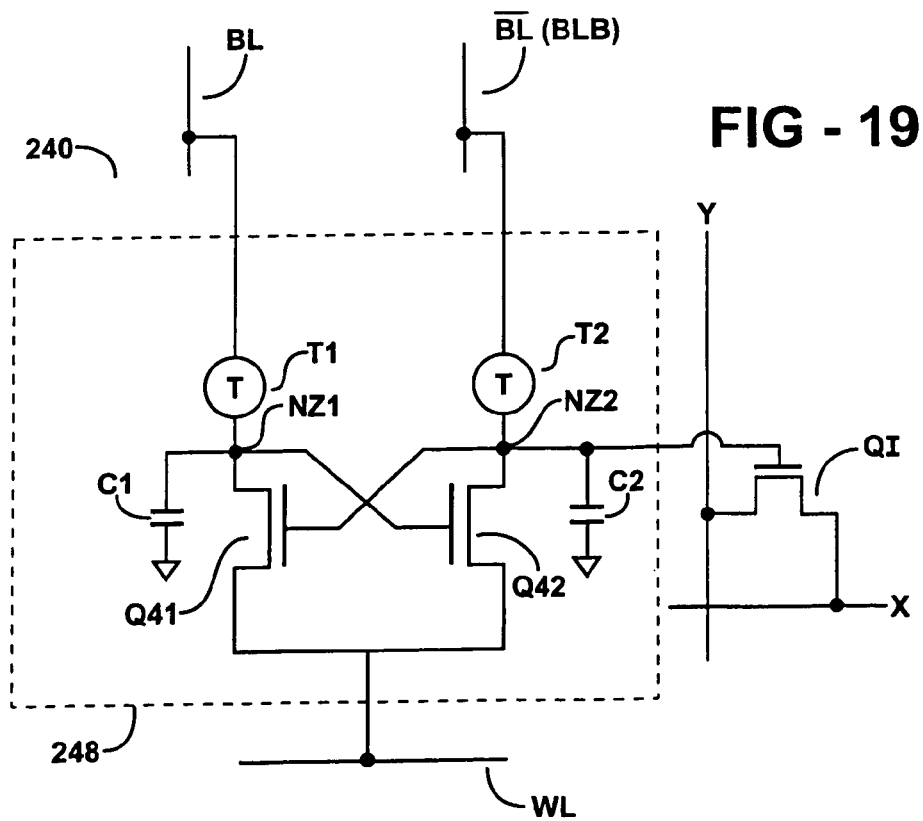
FIG. 19 shows an embodiment of a control cell of the present invention having cross coupled transistors where each load includes a threshold switching element.

Another embodiment of the invention is shown in FIG. 19. Control cell 248 comprises transistors Q41, Q42 and threshold switching elements T1, T2. To better assure balance on nodes NZ1 and NZ2, capacitors C1 and C2 may be added to nodes NZ1 and NZ2 symmetrically. An example of additional capacitors is shown in the embodiment of the control cell 248 of FIG. 19 where capacitors C1 and C2 have been included.

Figure 20:
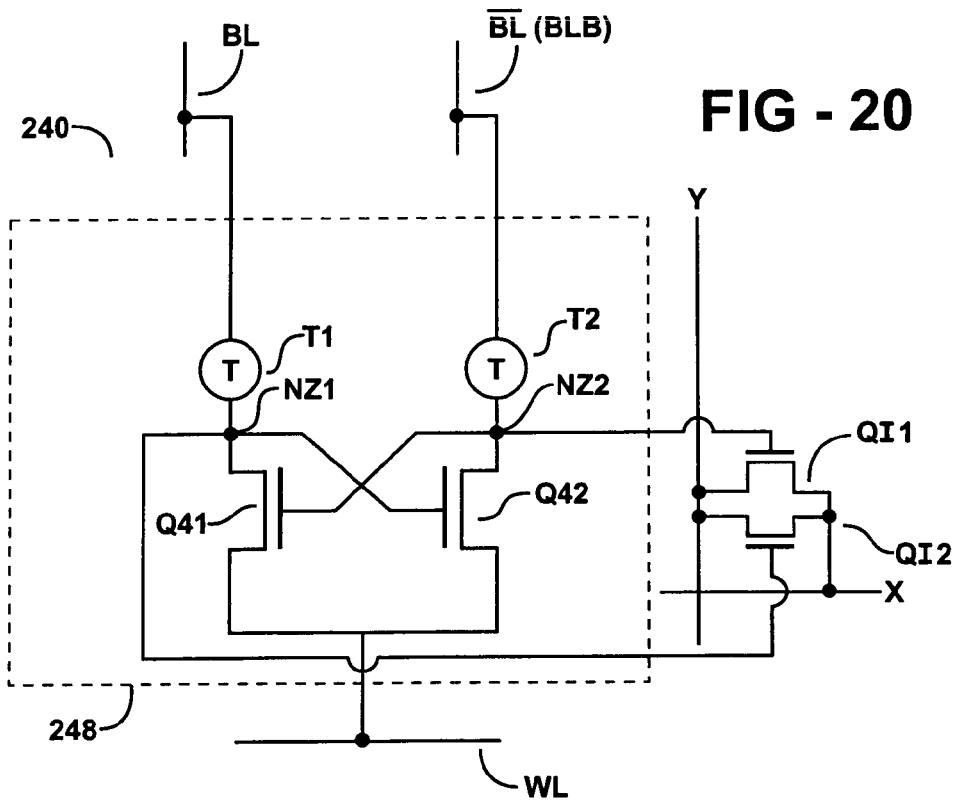
FIG. 20 shows an embodiment of a control cell of the present invention having cross coupled transistors where each load includes a threshold switching element.

Another embodiment of the invention is shown in FIG. 20. Control cell 248 comprises transistors Q41, Q42 and threshold switching elements T1, T2. Node NZ2 is coupled to the gate of N-channel transistor QI1. In addition, in this embodiment, node NZ1 is coupled to the gate of a P-channel transistor. Transistors QI1 and QI2 are coupled in parallel between a corresponding X line and Y line. The configuration shown in FIG. 20 is referred to as a "full mux" approach to controlling the connection between an X line and a Y line. A full drive may be created between the X and Y lines regardless of the relative voltages of the X and Y lines, when transistors QI1, QI2 are both programmed to be CLOSED.

It is noted that the embodiment of FIG. 16 (with only node NZ2 coupled to an n-channel transistor QI coupled between an X and Y line) may be made more equivalent to the embodiment of FIG. 20 in drive across the X and Y lines by adjusting the relative voltages in the control cell section. The normal high level control cell area may be chosen to be higher in voltage by Vt(n-channel transistor) than the high level in the logic (programmable interconnect area). As an example, bitline BL and bitline bar BLB, when at 2Vcc/3 (or 2Vcc(REG)/3), may be at a voltage which is 1 volt higher than the high level for the Y line and X line.

Figure 21:
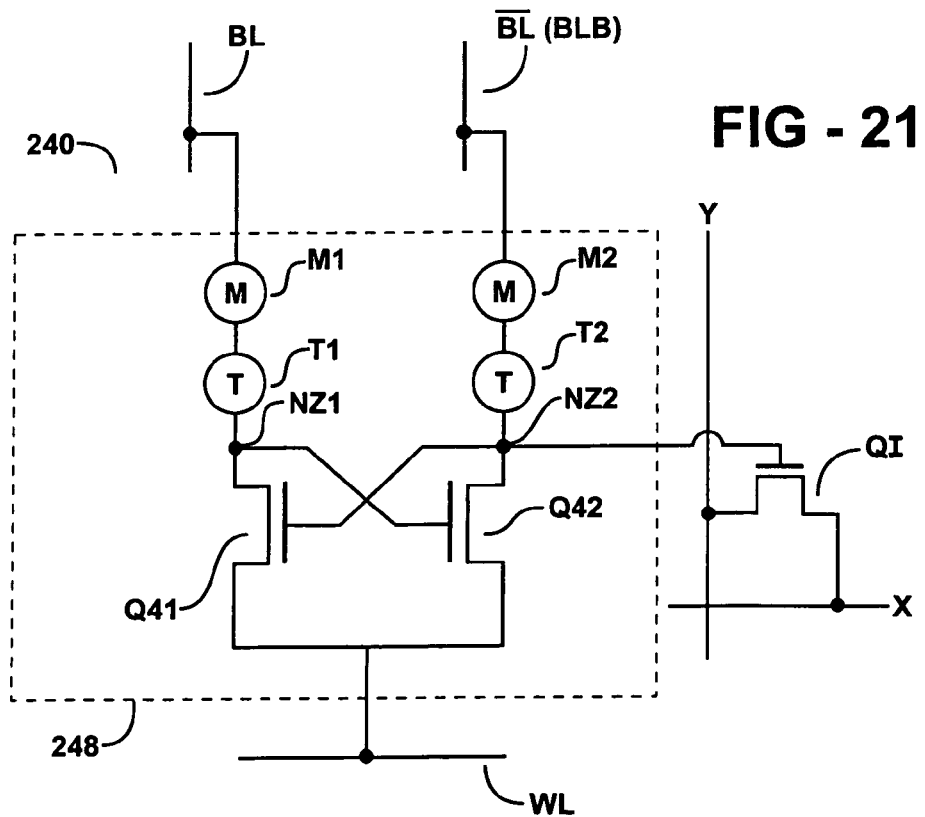
FIG. 21 shows an embodiment of a control cell of the present invention having cross coupled transistors where each load includes a memory element in series with a threshold switching element.

An alternative embodiment of a programmable connection of the present invention is shown in FIG. 21. The control circuit 240 includes the control cell 248 as well as wordline WL, bitline BL and bitline bar BLB. The control cell 248 includes transistors Q41, Q41, threshold switching elements T1, T2 and phase-change memory elements M1, M2. In the embodiment shown, memory element M1 is in series with threshold switching element T1. Likewise, memory element M2 is in series with threshold switching element T2. The series combination of M1, T1 is in series with transistor Q41. Likewise, the series combination of M2, T2 is in series with transistor Q42. The phase-change memory element may comprise a chalcogenide material such as, for example, Ge$_2$Sb$_2$Te$_5$, in one embodiment. The memory elements M1, M2 may be written to a low or high resistance state using the techniques described herein. Further, the resistance may be decreased by terminating the write cycle with a slow trailing edge (such as slowly restoring the bit line and/or word line to the deselect level, such as with an edge rate greater than 500 nsec). Similarly, the resistance may be increased by terminating the write cycle with a fast trailing edge (such as by restoring the bit line and/or word line to the deselect level with a fast edge rate, such as faster than 10 nsec). It is noted that the transistor Q61 shown in FIG. 17 and/or the current limiting transistors Q71, Q72 shown in FIG. 18 and/or the capacitors C1, C2 shown in FIG. 19 may be incorporated into the embodiment shown in FIG. 21 to create additional embodiments.

Figure 22:
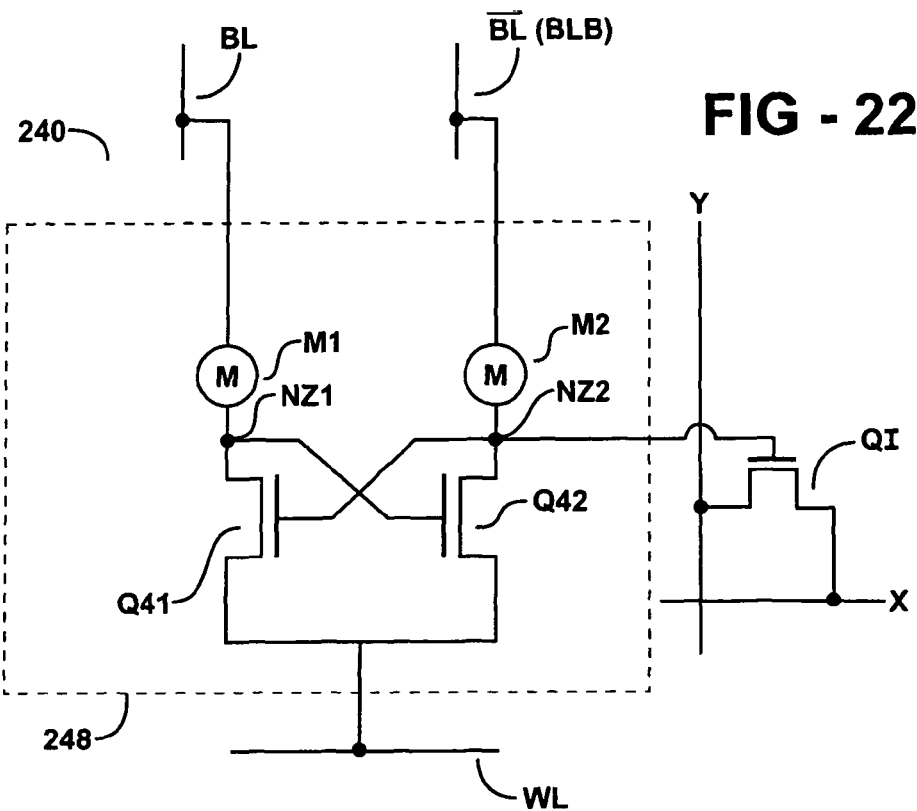
FIG. 22 shows an embodiment of a control cell of the present invention having cross coupled transistors where each load includes a memory element.

In the embodiment of FIG. 22, the threshold switching elements are not included. FIG. 22 shows an embodiment of a control cell 248 that includes transistors Q41, Q42 as well as phase-change memory elements M1, M2. The memory elements M1 and M2 are used alone without additional threshold switching elements, the use of fast edge rates maintain the phase-change memory element in a relatively high resistance state. It is noted that the transistor Q61 shown in FIG. 17 and/or the current limiting transistors Q71, Q72 shown in FIG. 18 and/or the capacitors C1, C2 shown in FIG. 19 may be incorporated into the embodiment shown in FIG. 22 to create additional embodiments.

Where a phase-change memory element is used in series with a threshold switching element (such as in FIG. 21), the phase-change memory element may simply add to the resistance of the threshold switching element by terminating cycles with a slow edge rate. However, writing the phase-change memory elements M1, M2 associated with both threshold switching elements T1, T2 to the appropriate state so the state is retained on power off, each may be successively "written"—one with a slow terminating edge rate and the other with a fast terminating edge rate.

For high performance operation, the phase-change memory element M1, M2 may be maintained in the low or lower resistance state during normal operation and written on power-down, so the cell state is retained on power up. Alternatively, the phase-change memory element may be maintained in the high resistance or reset state (and high threshold state) during normal operation (through use of fast edge rates during read and write), and then one side of the cell written to low resistance state on power down.

Use of these phase-change memory elements either as the load (without additional threshold switching elements) or in series with additional threshold switching elements allows programming the control cells so that the control cells may retain state after power down. If used only as a load without the addition of threshold switching elements, the state of the memory elements M1, M2 may be initialized in the fab (by deposition or rapid cooling) or at probe by programming to the amorphous high resistance reset state, having a high threshold voltage.

When used in combination with threshold switching elements T1 and T2, the threshold voltage Vth(M) of the memory elements M1 and M2 may add to the threshold voltage Vth(T) of the threshold switching elements T1 and T2, respectively. In one or more embodiments, the total threshold voltage of the series combination of a threshold switching element and a memory element may be less than or equal to the sum of the individual threshold voltages.

Referring to the control cell 248 of FIG. 21, an embodiment for a method of programming a memory element M1 or M2 is to apply a voltage which is greater than the sum of the threshold voltage of the threshold switching element and the threshold voltage of the memory element may be applied to both legs of the control cell 248 (that is, to both bitline BL and bitline bar BLB). Both of the memory elements as well as the corresponding threshold switching elements are switched on to the low resistance branches of their respective I-V plots. Then, if one leg is lowered slowly and the other leg faster, or if one leg has less voltage across it, when turned off (by, for example, lowering the voltage of bitline BL), the state of the control cell 248 may have one leg with a low resistance memory element (for example M1) and the other leg with a high resistance memory element (for example M2)

Then, on power-up, the lower resistance side will charge faster above the threshold voltage Vt(n-channel) of the corresponding transistor Q41 or Q42. The transistor whose gate is charged high first will turn on. By such a technique, the cross connected may turn on at power up.

Figure 23:
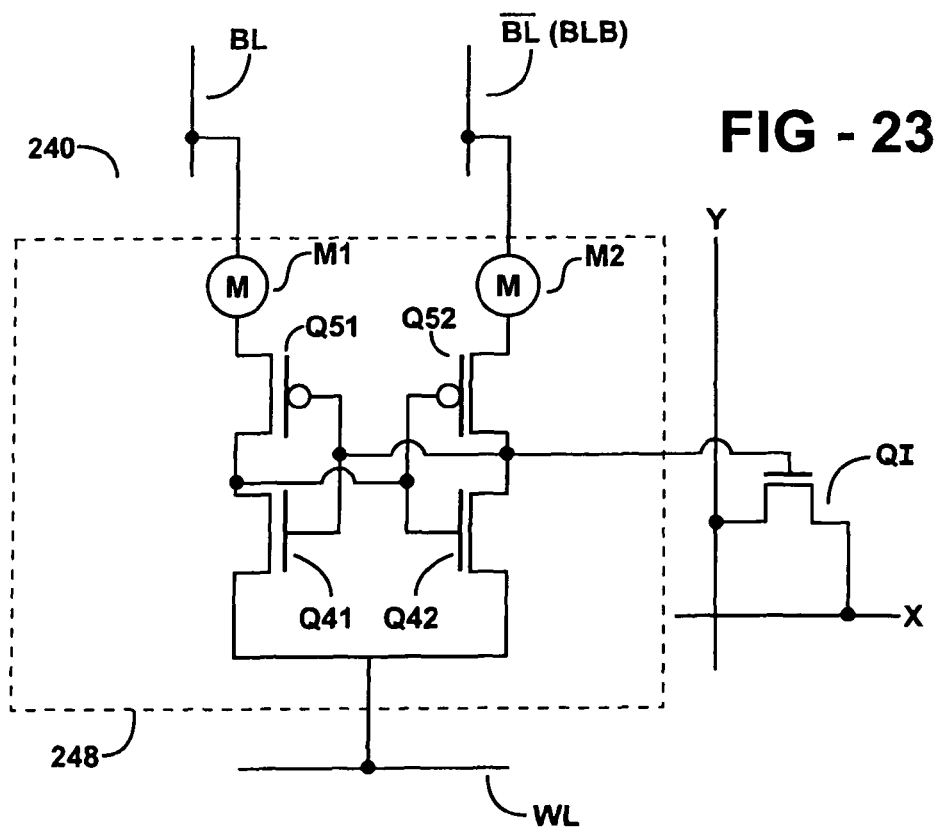
FIG. 23 shows an embodiment of a control cell of the present invention having cross coupled transistors where each load includes a memory element.

Another embodiment of the invention is shown in FIG. 23. In addition to non-volatile memory elements as loads, control cell 248 comprises cross-coupled NMOS transistors Q41 and Q42 as well as PMOS transistors Q51 and Q52. Referring to the embodiment shown in FIG. 23, in another embodiment of the invention it is conceivable that the memory elements M1 and M2 may each be replaced with threshold switching elements. Likewise, in another embodiment of the invention, it is possible that a first threshold switching element be placed in series with memory element M1 and a second threshold switching element be placed in series with memory element M2.

Figure 24:
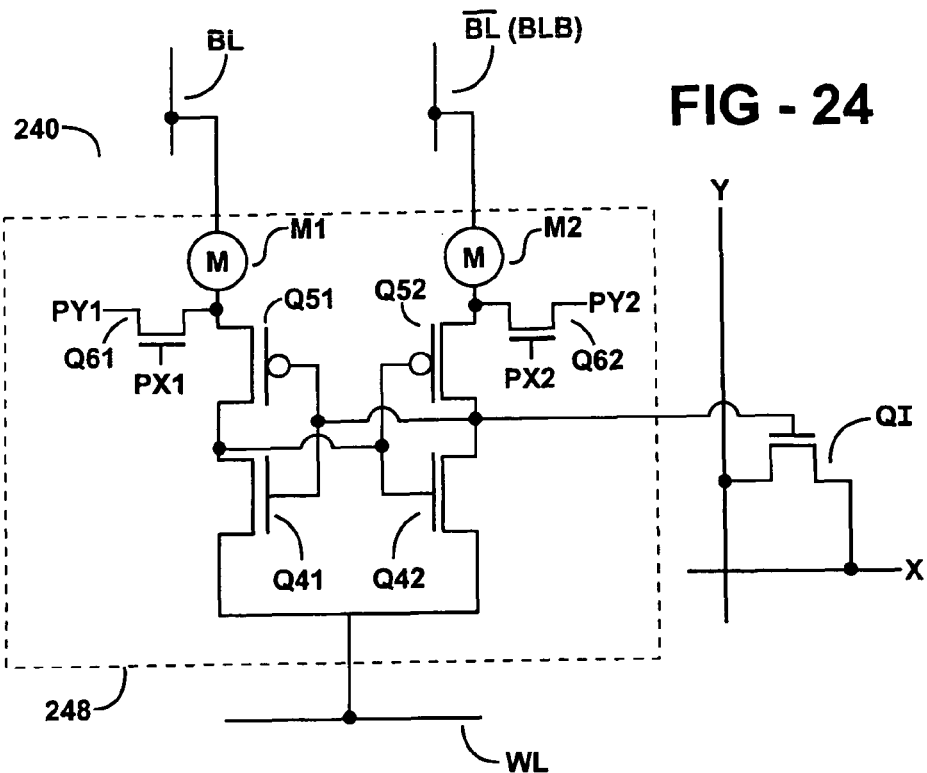
FIG. 24 shows an embodiment of a control cell of the present invention having cross coupled transistors where each load includes a memory element.

To provide for more positive programming means for the non-volatile memory elements M1, M2 shown in FIG. 23, transistor Q61 with programming lines PY1 and PX1, and transistor Q62 with programming lines PY2 and PX2 may be coupled as shown in the embodiment of the control cell 248 shown in FIG. 24. Then, when PX1 (or PX2) is selected high, PY1 may positively force a current through the memory element M1 by transistor Q61 (or memory element M2 by Q62 to program memory element M2 to the opposite state). Also, transistors Q61 and Q62 may be used to assist programming the state of cross-coupled transistors Q41 and Q42.

Figure 25:
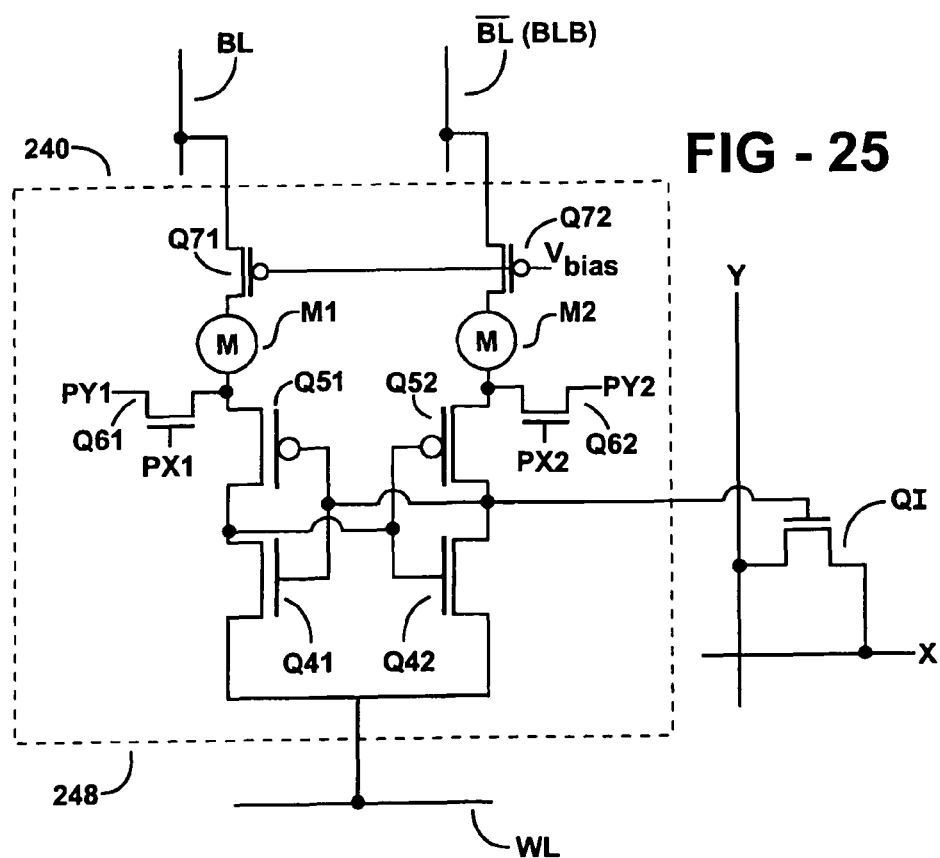
FIG. 25 shows an embodiment of a control cell of the present invention having cross coupled transistors where each load includes a memory element.

Similarly, as shown in FIG. 25, the transistors Q71 and Q72 may be added in series with the memory elements M1 and M2 to bias the bitline BL and bitline bar BLB). To better assure power up in the proper state, the gates of transistors Q71 and Q72 may be kept low (by power-up logic) until Vcc and any regulator are well established after power up. Then, the voltages to the gates of transistors Q71, Q72 respectively, may be lowered rapidly (such as in less than 1 nsec) so that the lower resistance in one of memory elements M1 or M2 (with one programmed to low resistance and the other programmed to high resistance) drives one side or the other of the SRAM cross-couple high (significantly faster than the other), so the latch powers up in the preferred state programmed before power down. In the embodiment shown in FIG. 25, bitline BL and bitline bar BLB may each be coupled to Vcc or to a regulated Vcc referred to as Vcc(REG).

As a further alternative, Vbias may be pulled to ground during write, or turn relatively fully on and/or positioned higher or lower to adjust the current applied during write. On the trailing edge of write cycle (quench), the transition on Vbias (or in deselecting PX1 and PX2) may be fast to write to a higher resistance or slower to write to a lower resistance.

During normal operation, Vbias may be positioned so transistors Q71 and Q72 are slightly on, and adequate to pullup lines BL and BLB. That is, if the Vcc or Vcc(REG) applied to the section during normal logic operation is about 2 volts, and the transistor threshold voltage Vt(p-channel) is, for example, about 0.6 volts, then Vbias for normal logic operation may be positioned at about 1.3 volts (and capacitively coupled to the positive supply, to better track the 2 volts supply). Vbias may be regulated. And, the Vcc may be regulated with a bandgap regulator, and then Vbias should be coupled to the resulting Vcc(REG).

In one or more embodiments, the bitline BL may be coupled to a first voltage V1 while the bitline bar BLB may be coupled to a second voltage V2 where V1 may be different from V2 (such as during write), and may also different from Vcc or Vcc(REG).

The control cells, control circuits and programmable connections described herein may be beneficial not only for FPGA but also for embedded memory applications in combination with FPGA couplable interconnect. The embodiments herein may be implemented in combination with an embedded memory using a volatile or non-volatile memory cell. For example, for embedded memory using an array of non-volatile memory in the form of a phase-change memory with a thin film threshold switching element, the threshold switching elements may be fabricated to act as select device for the phase-change memory and also serve as part of a control cell for couplable interconnect as in the embodiments herein.

Implementing these embodiments for the FPGA may provide a phase-change or chal process that allows the addition of a compact more efficient array of memory cell with less additional processing. Further, use of a process that implements the FPGA couplable interconnect described can beneficially allow adding a low cost cache buffer to the non-volatile Flash that uses a phase change memory. For embedded memory implemented with a thin film memory, such as phase change selected with a threshold switch, the control cell and cross-point switch can be placed underneath a phase-change memory array since the phase-change (embedded) memory array does not need an active isolation device within or under the memory cell or array.

The volatile or non-volatile control cell embodiments herein may be written from a processor off-chip and its memory, or by/from the non-volatile embedded memory cell on-chip (such as at power-up or upon command by the external user through an input/output interface using an on-chip microcontroller). Similarly, the data in a volatile control cell (its state(s)) may be loaded into the non-volatile embedded memory on or off chip upon powering down.

In some embodiments, control cells that include threshold switching elements may be smaller and lower in added cost than conventional 4 transistor or 6 transistor SRAM control cells. Size reduction may reduce the cost of an SRAM memory, whether applied to stand alone commodity memory or as embedded memory on a logic or processor chip that provides other functionality, such as a microprocessor or digital signal processor. A size reduction also provides for potential increased memory capacity while keeping chip size within reasonable limits as dictated by package size and die yield constraints.

Figure 26:
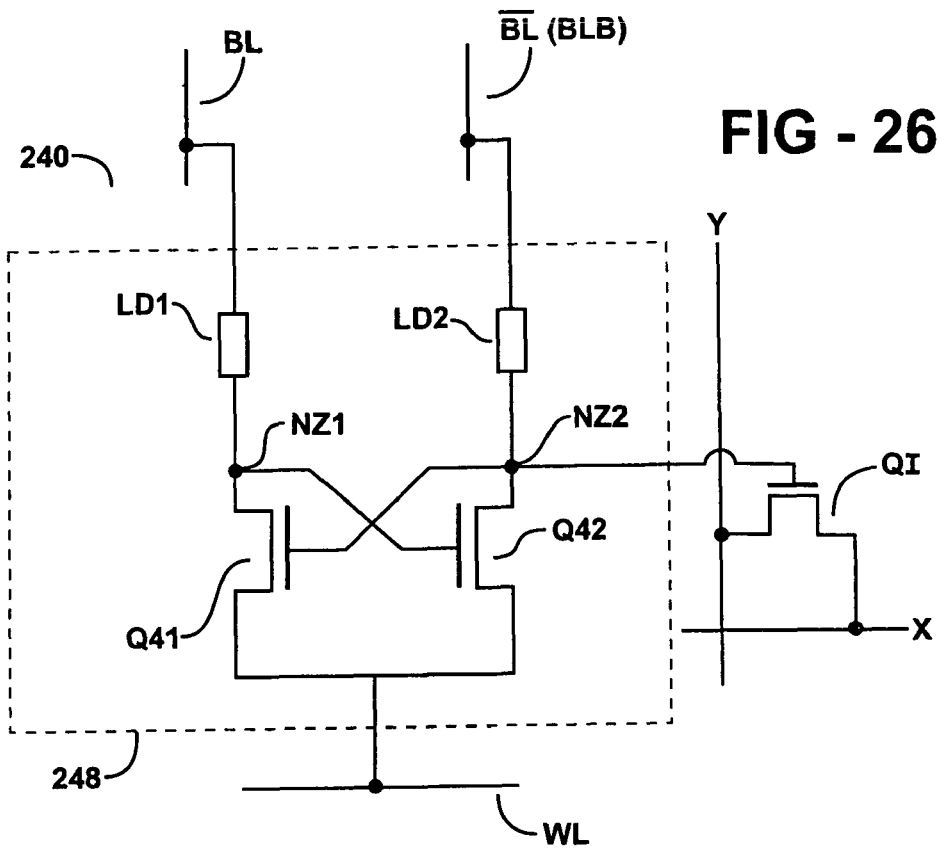
FIG. 26 shows an embodiment of a control cell of the present invention having cross coupled transistors and loads.

Another embodiment of the invention is shown in FIG. 26. The programmable connection shown in FIG. 26 comprises a control circuit 240 that includes a control cell 246, bitline BL, bitline bar BLB and wordline WL. The control cell 246 includes transistors Q41, Q41 as well as load LD1 in series with transistor Q41 and load LD2 in series with Q42. Transistor Q41 is cross-coupled with transistor Q42.

In one or more embodiments, loads LD1 and/or LD2 may include a chalcogenide material. In one or more embodiments, loads LD1 and/or LD2 may include a phase-change material. In one or more embodiments, loads LD1 and/or LD2 may include a threshold switching material. In one or more embodiments, the threshold switching material may be a chalcogenide material. In one or more embodiments, the threshold switching material may be an S-type material. In one or more embodiments, loads LD1 and/or LD2 may include a phase-change memory element. In one or more embodiments, loads LD1 and/or LD2 may includes a threshold switching element. In one or more embodiments, loads LD1 and/or LD2 may include a phase-change memory element in series with a threshold switching element.

In another embodiment of the invention, it is possible that the NMOS transistors Q41, Q42 shown in FIG. 26 may be replaced with PMOS transistors that may be cross coupled. In another embodiment of the invention it is possible that the NMOS transistors Q41, 42 shown in FIG. 26 be replaced with bipolar transistors (or even any other form of transistors) that may be cross coupled.

Figure 27:
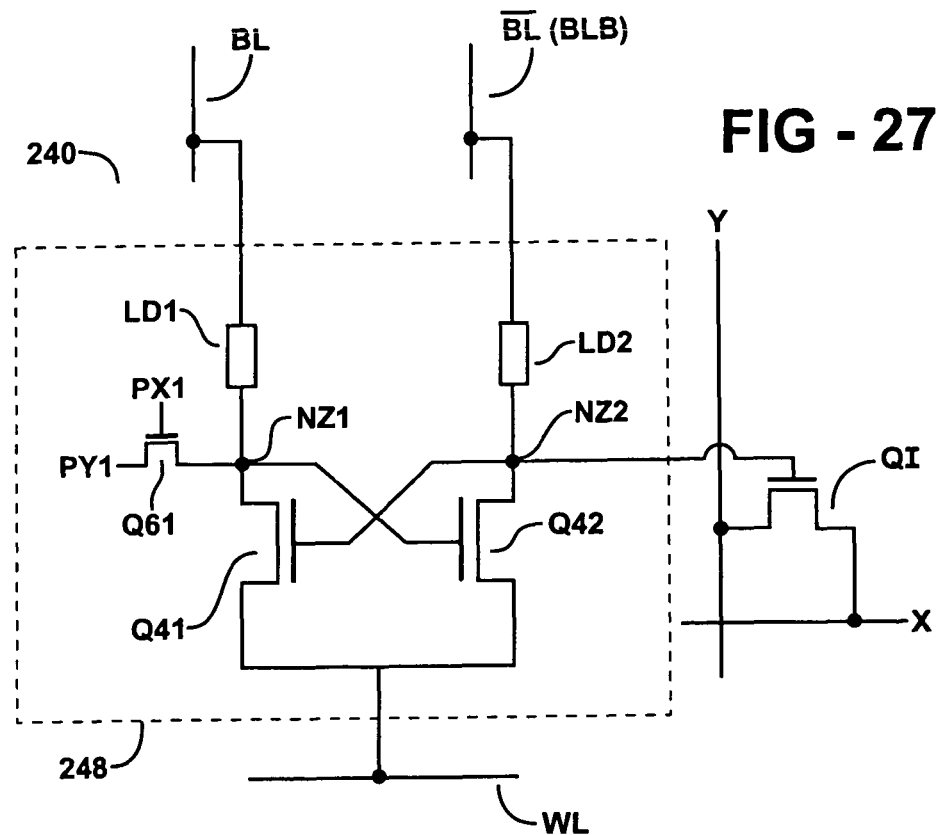
FIG. 27 shows an embodiment of a control cell of the present invention having cross coupled transistors and loads.
Figure 28:
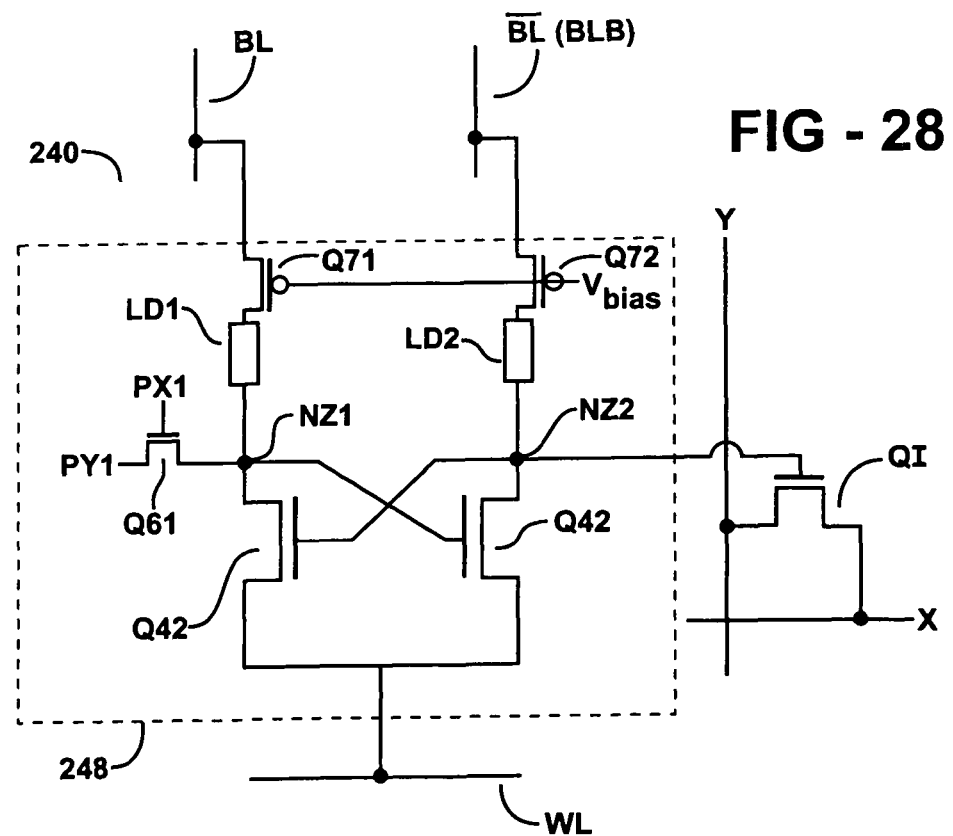
FIG. 28 shows an embodiment of a control cell of the present invention having cross coupled transistors and loads.

In another embodiment of the invention a transistor Q61 may be coupled to node NZ1 as shown in FIG. 27. In another embodiment of the invention, a transistor Q71 may be coupled in series with load LD1 and a transistor Q72 may be coupled in series with load LD2. This is shown in FIG. 28.

In one or more embodiments of a programmable connection of the present invention, a control cell may be formed comprising two cross coupled inverters. In one embodiment, each inverter may be identical with the other. The output of the first inverter may be coupled to the input of the second inverter. The output of the second inverter may be coupled to the input of the first inverter. One of the outputs of the cross coupled inverters may be used to provide an output signal to control an interconnect transistor. In one or more embodiments of the invention, the two cross-coupled inverters may form a circuit having two stable states and may be a bistable circuit. The two cross coupled inverter may form a latch. One or both of the inverters may include a chalcogenide material. One or both of the inverters may include a phase-change material. One or both of the inverters may include a threshold switching material. One or both of the inverters may includes a phase-change material in series with a threshold switching material. One or both of the inverters may include a phase-change memory element. One or both of the inverters may include a threshold switching element. One or both of the inverters may includes a phase-change memory element in series with a threshold switching element. One or both of the inverters may include a first threshold switching element in series with a second threshold switching element. One or both of the inverters may include a first phase-change memory element in series with a second phase-change memory element. The first inverter may comprise a first transistor coupled in series with a first load. The second inverter may comprise a second transistor coupled in series with a second load. The first transistor may be cross coupled with the second transistor. The first transistor may be a MOS transistor such as an NMOS transistor or a PMOS transistor. The first transistor may be a bipolar transistor. The first load and/or the second load may comprise a chalcogenide material. The first load and/or the second load may comprise a phase-change material. The first load and/or the second load may comprise a threshold switching material. The first load and/or the second load may comprise a phase-change material in series with a threshold switching material The first load and/or the second load may comprise a phase-change memory element. The first load and/or the second load may comprise a threshold switching element. The first load and/or the second load may comprise a phase-change memory element in series with a threshold switching element. The first load and/or second load may include an additional transistor in series with a threshold switching element. The first load and/or second load may include an additional transistor in series with a phase-change memory element. The first load and/or second load may include an additional transistor in series with the series combination of threshold switching element and phase-change memory element. The first load and/or the second load may include a capacitance.

In one or more embodiments of the invention, the control cell may be formed as a static random access memory (SRAM) device. The SRAM device may include a chalcogenide material. The SRAM device may include a phase-change material. The SRAM device may include a threshold switching material. The SRAM device may include a phase-change material in series with a threshold switching material. The SRAM device may include a phase-change memory element and/or a threshold switching element. The SRAM device may include a phase-change memory element in series with a threshold switching element.

The SRAM device may be formed as two cross-coupled inverters (for example, a pair of cross-coupled inverters). For example, the output of the first inverter may be coupled to the input of the second inverter while the output of the second inverter may be coupled to the input of the first inverter. The two cross-coupled inverters may form a latch. Each inverter may include a transistor in series with a load. The transistors may be any type of transistors such as bipolar and MOS transistors (such as NMOS or PMOS transistors). Examples of circuits of this type using MOS transistors are shown as control cell 248 in FIGS. 16 through 28. FIGS. 26 through 28 show, more generally, loads LD1 and LD2. Each of the loads LD1 and LD2 in FIGS. 26, 27 and 28 may include a chalcogenide material and/or a phase-change material and/or a threshold switching material. Each of the loads may include a phase-change memory element and/or a threshold switching element. Each of the loads may include a phase-change memory element in series with a threshold switching element. Each of the loads may include an additional transistor in series with a phase-change memory element. Each of the loads may include an additional transistor in series with a threshold switching element. Each of the loads may include an additional transistor in series with the series combination of a phase-change memory element and a threshold switching element. The control cell 248 shown in FIG. 29 provides an example of two cross coupled inverters where each inverter uses two threshold switching elements.

In one or more embodiments of the present invention, a control cell may be formed as an SRAM cell as described in U.S. patent application Ser. No. 11/158,619. U.S. patent application Ser. No. 11/158,619 is hereby incorporated by reference herein. For example, the control cell may be an SRAM memory cell that comprises a chalcogenide material.

Figure 29:
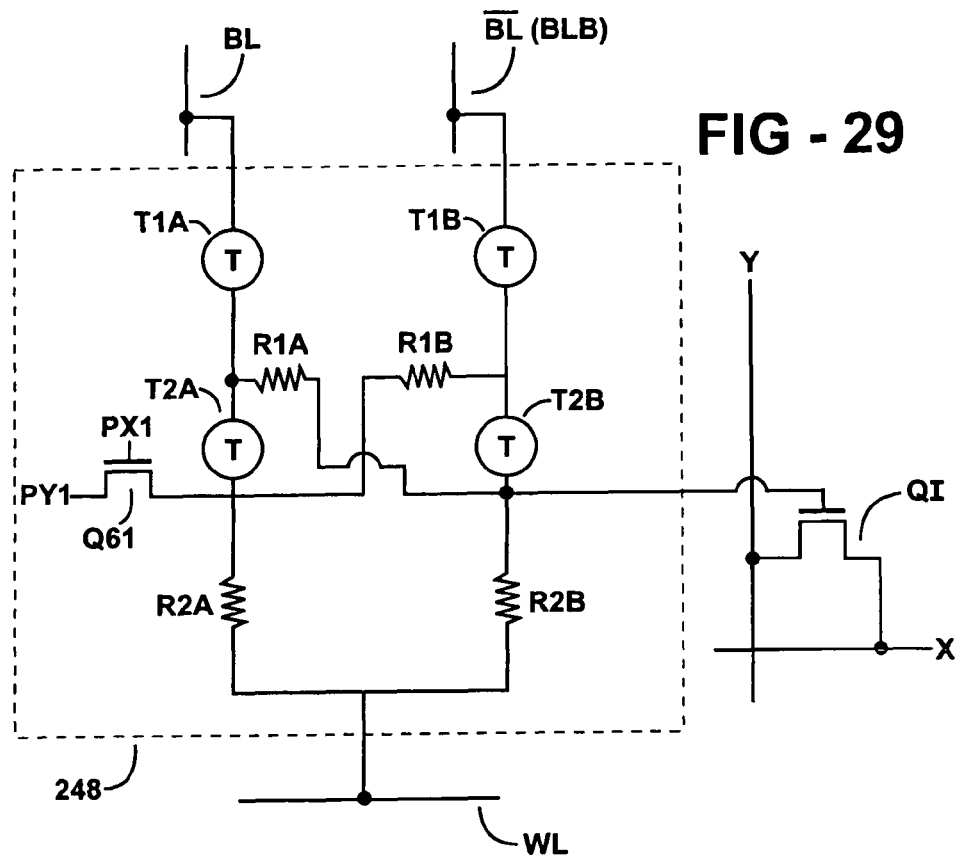
FIG. 29 shows an embodiment of a control cell of the present invention comprising four threshold switching elements.

One or more embodiments of the invention may include a control circuit 240 comprising control cell 248 as shown in FIG. 29. The control cell 248 includes a threshold switching element T1A in series with threshold switching element T2A. Also included are resistors R1A and R2A. The control cell 248 further includes threshold switching elements T1B and T2B. The control cell 248 also includes resistors R1B and R2B. The control cell 248 optionally includes the transistor Q61 with control terminals PX1 and PY1.

Figure 33A:
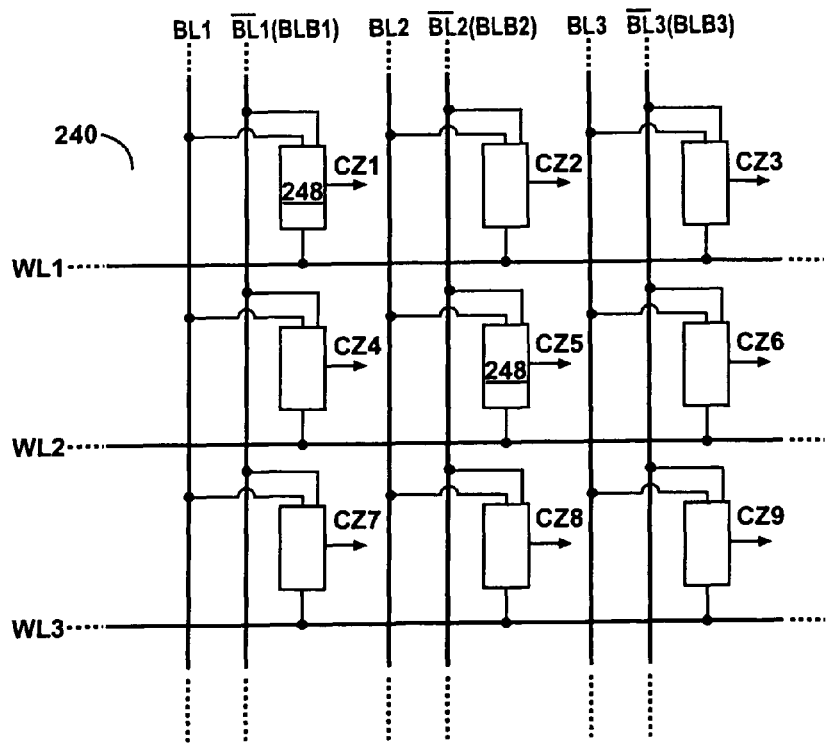
FIG. 33A shows an embodiment of a control circuit of the present invention comprising an array of control cells, wordlines, bitlines and bitline bars.

It is noted that a control circuit may be formed as an array of control cells as shown in FIG. 33A. FIG. 33A shows a control circuit 240 comprising a three by three array of control cells 248. The control circuit 240 includes control cells 248 and further includes three pairs of bitline/bitline bars BL1/BLB1, BL2/BLB2 and BL3/BLB3 interconnected to control cells 248. The array further includes three wordlines WL1, WL2, and WL3 interconnected to the control cells 248. Each of the control cells 248 may, for example, take the form of any one of the embodiments presented herein in FIGS. 16 through 29 as well as variations of these embodiments. A corresponding CZ output line CZ1 through CZ9 extends from each of the control cells 248 of the control circuit array 240. While a three by three array is shown, the size of the array is not limited to any particular dimension. For example, it may have at least one pair of bitline/bitline bar lines and at least one wordline. In one or more embodiments of the invention, the control circuit array may include a plurality of bitline/bitline bar line pairs and a plurality of wordlines. In one or more embodiments of the invention, the bitline/bitline bar lines as well as the wordlines may be address lines.

Figure 33B:
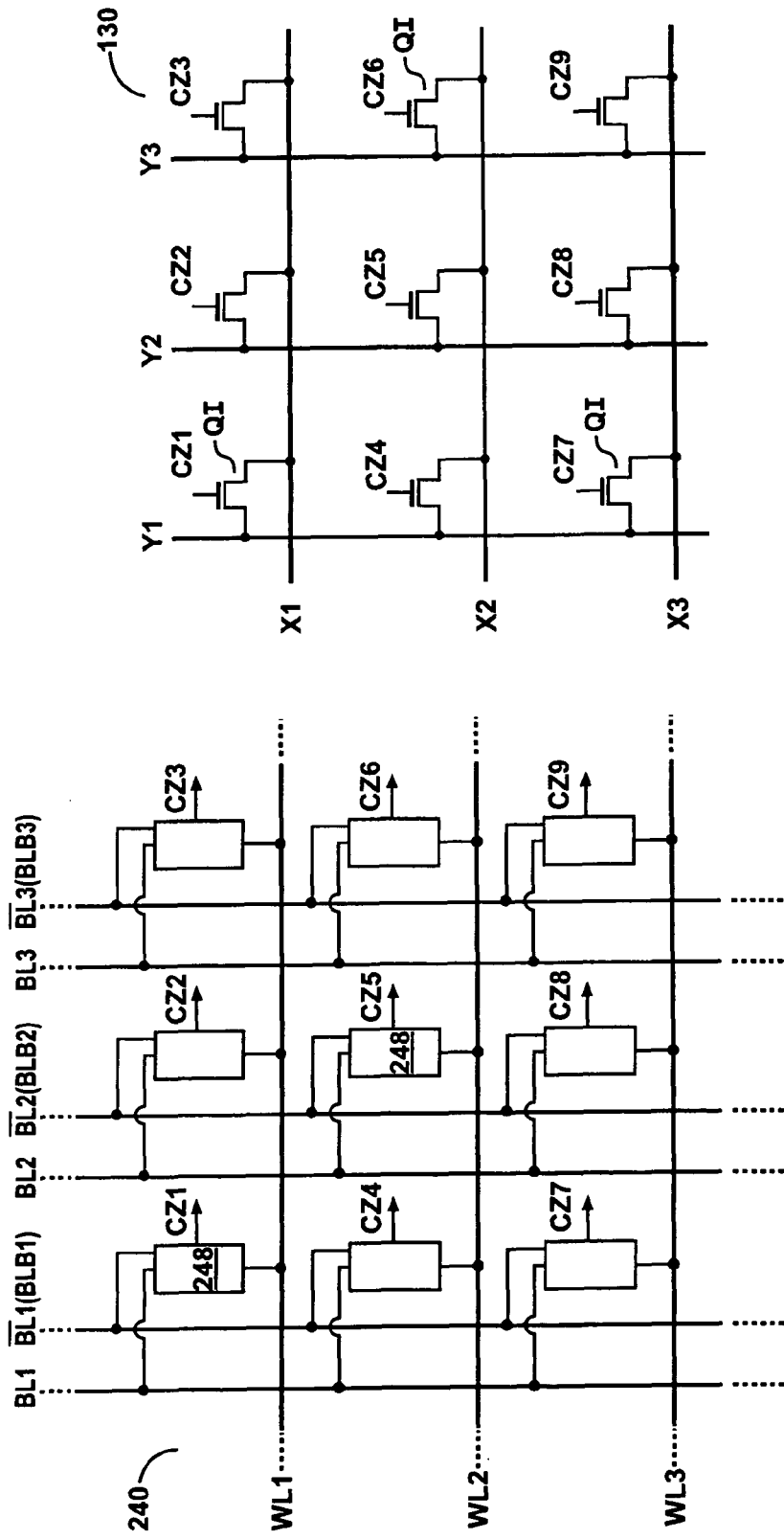
FIG. 33B shows an embodiment of a control circuit of the present invention including a three by three array of control cells where each control cell is providing a control signal to a corresponding interconnect transistor of an X-Y array.
Figure 33C:
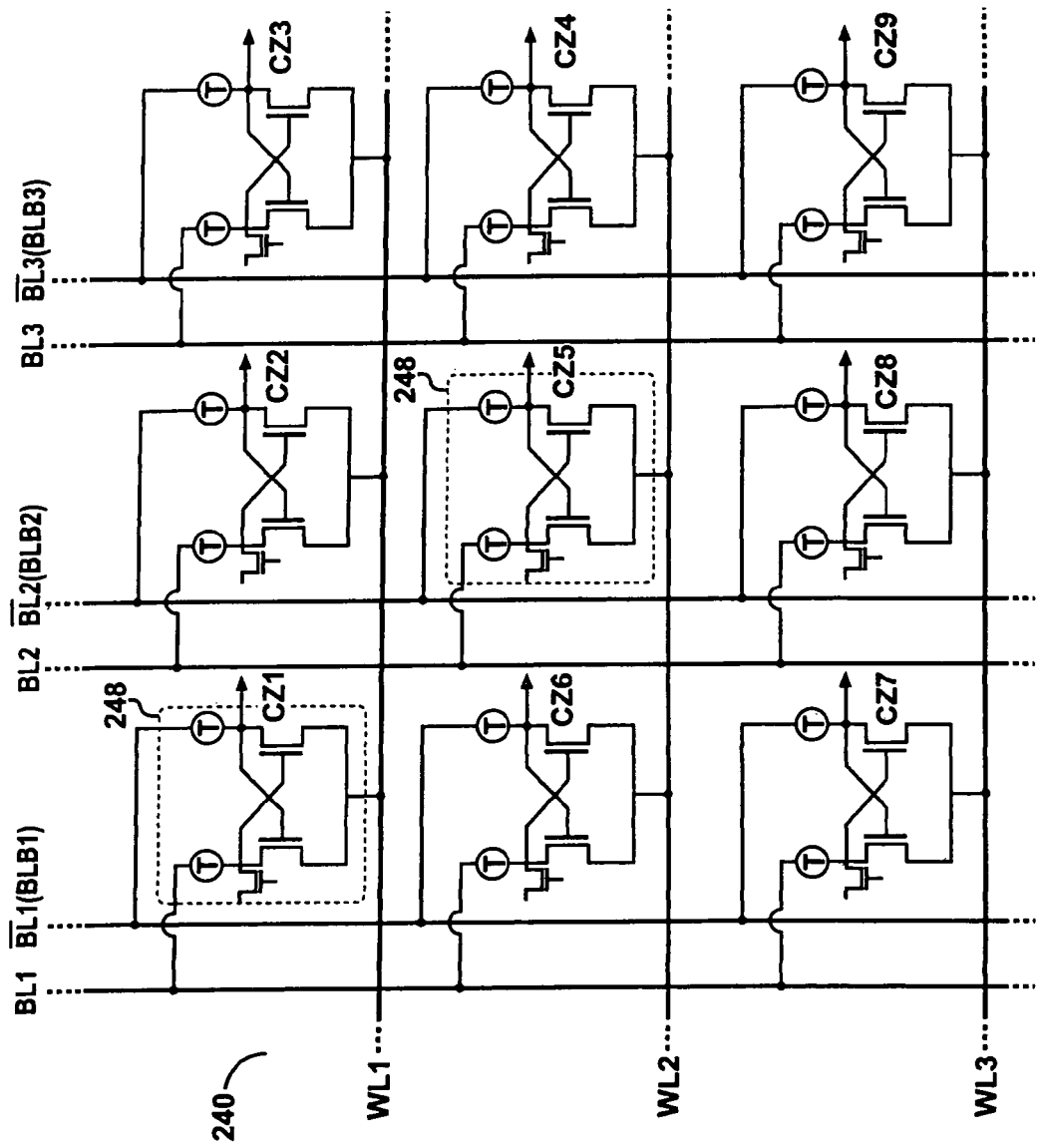
FIG. 33C shows an embodiment of a control circuit of the present invention comprising an array of control cells, wordlines, bitlines and bitline bars.

Each of the output lines CZ1 through CZ9 may be coupled to the gate of a corresponding interconnect transistor QI. Referring to FIG. 33B, each of the output lines CZ1 through CZ9 from the control circuit 240 may be coupled to a corresponding gate input line CZ1 through CZ9 of a corresponding transistor QI of the X-Y matrix 130. The control circuit 240 in combination with the X-Y array 130 may be used to form a programmable matrix array which may be used in a programmable logic device. FIG. 33C shows an embodiment of a control circuit 240 comprising an array of control cells 248.

A plurality of control cells including different types and embodiments (such as, for example, those shown in control cells 242 in FIGS. 5A-N, control cells 244 shown in FIGS. 6A-E, control cells 246 shown in FIGS. 7A-H, or control cells 248 shown in FIGS. 16-29) may thus be arranged in an array. Examples, of control cell arrays are shown in FIGS. 30A,B,C, 31A,B,C, 32A,B,C and 33A,B,C. Each control cell may be used to control the state of an interconnect transistor (or some other type of controllable interconnect device) that may be coupled between an X line and a Y line. The array of control cells may be used to control the states of an X-Y array of transistors (or some other type of controllable interconnect device) where each transistor is coupled between a corresponding X line and a corresponding Y line. The control cell array in combination with the X-Y transistor array may be used to form a programmable logic device. To implement a programmable logic device, it is possible that the array of control cells and the array of transistors (or other form of controllable interconnect device) may, for example, be placed along side each other, parallel to each other, or above/below each other in separate (e.g. metal or poly) layers.

It is noted that each of the control cells described herein, such as control cells 242, 244, 246 or 248 shown in FIGS. 5A-N, 6A-E, 7A-H and FIGS. 16-29 may also be viewed as a memory cell. Each control cell may be programmed between at least two detectable states. The arrays 240 shown in FIGS. 30A,B,C, 31A,B,C, 32A,B,C, and 33A,B,C may be viewed as an array of memory cells. Hence, the control circuit 240 of the present invention may be formed as one or more memory cells. In particular, the control circuits 240 shown in FIGS. 30A, 31A, 32A and 33A of the present invention may be viewed as an array of memory cells. In one or more embodiments, one or more of the memory cells includes a chalcogenide material. In one or more embodiments, one or more of the memory cells includes a phase-change and/or threshold switching material. In one or more embodiments, one or more of the memory cells includes a phase-change memory element and/or a threshold switching element. In one or more embodiments, one or more of the memory cells includes a phase-change material in series with a threshold switching material. In one or more embodiments, one or more of the memory cells includes a phase-change memory element in series with a threshold switching element.

Figure 12:
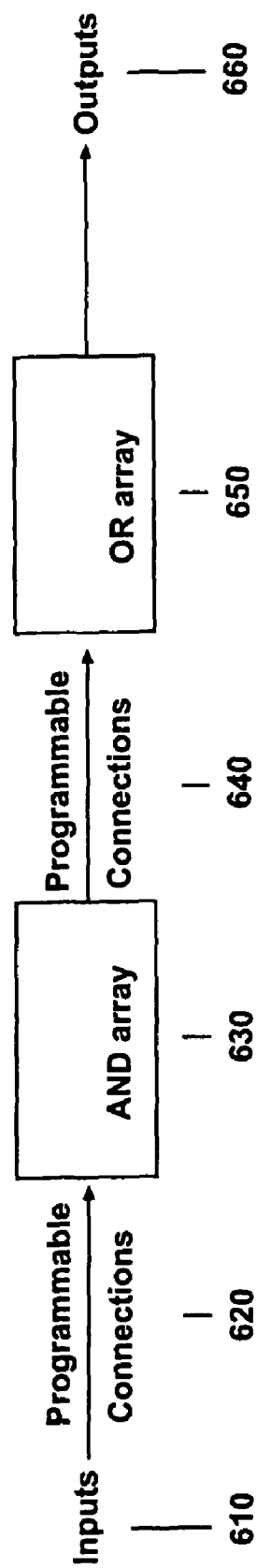
FIG. 12 is an example of a block diagram of a programmable logic array.

One type of programmable logic device is a programmable logic array (PLA). A block diagram of a PLA is shown in FIG. 12. As shown in the block diagram, the PLA includes a set of inputs 610, a first set of programmable connections 620, an AND array 630, a second set of programmable connections 640, an OR array 650 and a set of outputs 660.

Figure 13:
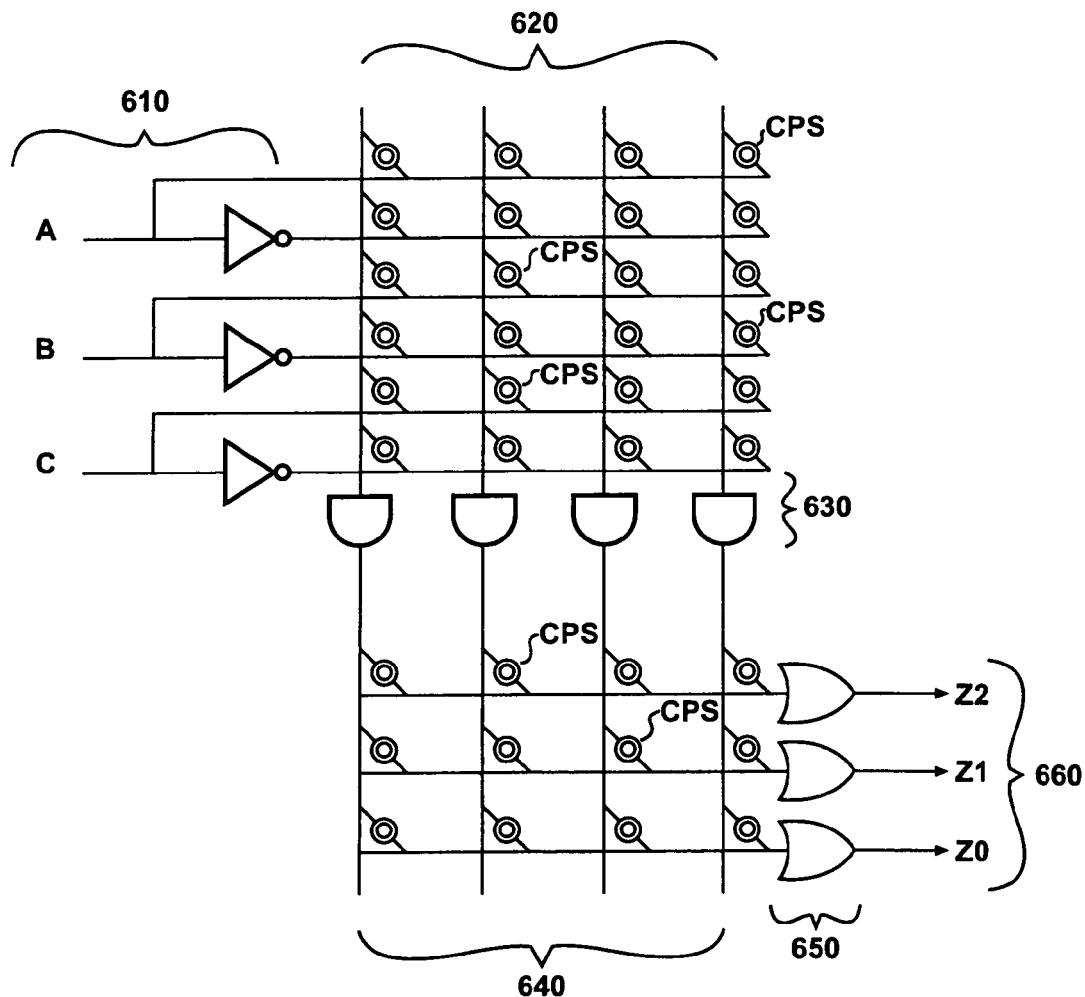
FIG. 13 is an implementation of the block diagram of FIG. 12 using programmable connections.

FIG. 13 is an embodiment of a PLA which is an implementation of the block diagram from FIG. 12. FIG. 13 shows a PLA that includes a set of inputs 610 which includes inputs A, B and C, a first set of programmable connections 620 composed of CPS elements (control circuit and cross-connect transistor between couplable interconnect), an AND array 630, a second set of programmable connections 640 and couplable interconnect similar to 620, an OR array 650 and a set of outputs 660 which includes outputs Z0, Z1 and Z2. The first and second set of programmable connections are formed using programmable connections CPS that comprise a phase-change material. The AND and OR gates shown for illustration may also have additional programmed or unprogrammed inputs, and may also have inverting outputs.

By cross-point programming to a lower resistance, connections from the logic may be made from Y to X, and in turn to inputs to gates, as is familiar to those reasonably skilled in the art. Application of these concepts to create FPGA or FPLA using embodiments herein will be apparent to those reasonably skilled in the art.

To minimize standby current, only those programmable connection elements potentially needed for a given customer's type of circuit application need be tested and available for programming. In the extreme, all programmable connections at each of the cross-point may be tested at the factory, meaning any breakdown devices are made conducting and cause leakage if not programmed to the low resistance state.

The current or voltage forced during programming may be adjustable at the factory by using additional current or voltage programming options, among other helpful options familiar to those skilled in the art, and may be implemented by algorithm and timing, both at the factory or in the field using an on or off-chip processor.

Hence, leakage may be reduced by use of the breakdown layer and breaking down prior to shipment or in the field only those breakdown layers that will probably be normally programmed and/or actually used (as other than an OPEN). Even untested, most if not all may still be field programmable if later needed, though with lower certainty of successful operation (and with less leakage until programmed to short out the breakdown layer while leaving in the high resistance state the element in series with the breakdown layer.

It is noted that another example of applying phase-change memory to programmable logic devices is shown in U.S. patent application Ser. No. 10/459,632, which is hereby incorporated by reference herein.

Although the present invention has been described above with a certain degree of particularity with reference to preferred embodiments thereof, it should be understood that various changes in the form and details as well as other embodiments are possible. For example, the cross-point transistors can be increased in size or wired in parallel to reduce CLOSED resistance. Moreover, it will be apparent to those reasonably skilled in the art that the additional features providing further advantages are not essential for carrying out the invention, and may be omitted or replaced with different features more advantageous for a particular application. A person skilled in the art may apply to the solution described above many modifications and alterations of the embodiments herein, all of which, however, are included within the scope of protection of the invention as defined by the claims herein.

Figure 14:
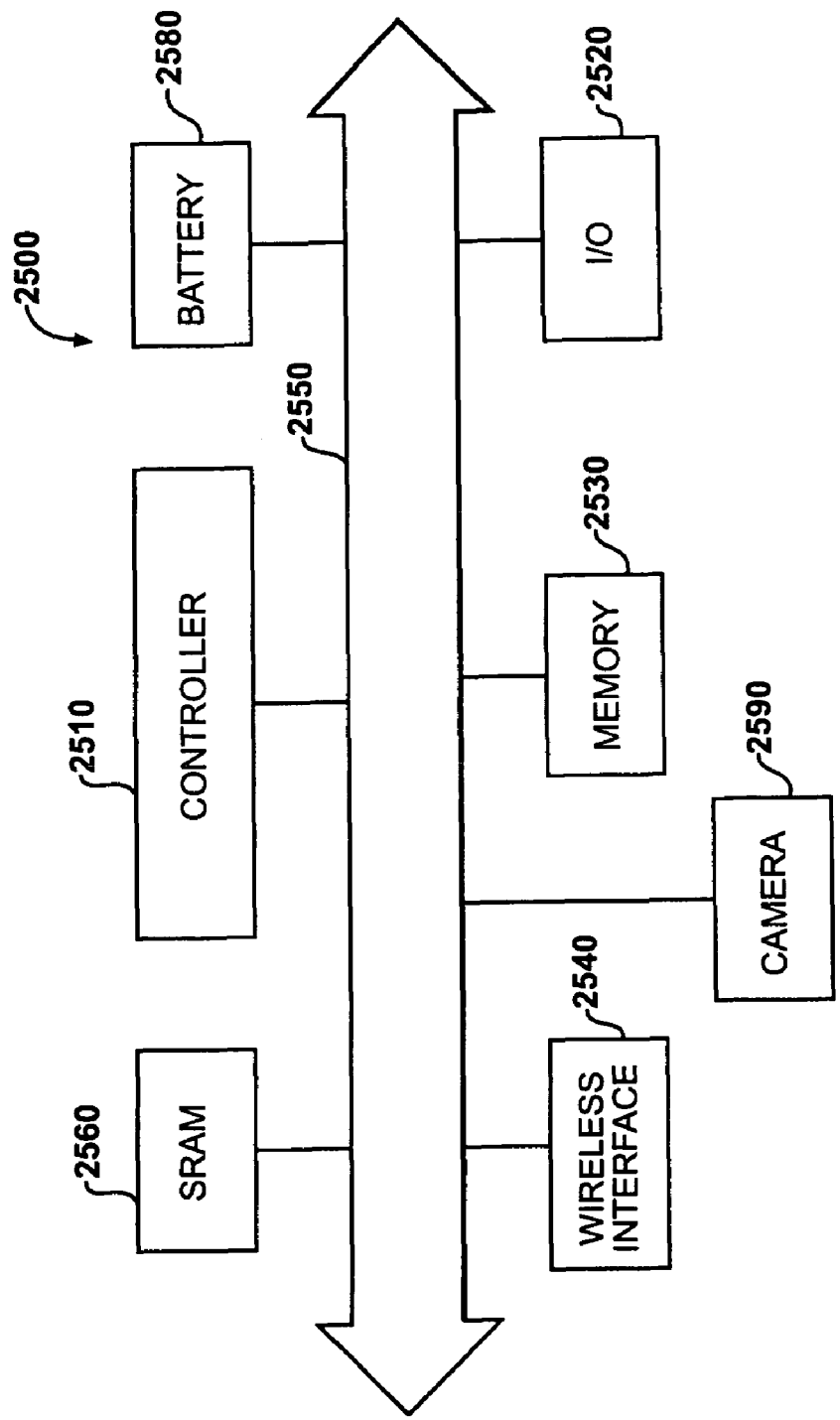
FIG. 14 shows a block diagram of an electronic device comprising memory, a controller, a wireless interface, a camera, SRAM, I/O and a battery.

Turning to FIG. 14, a portion of a system 2500 in accordance with an embodiment of the present invention is described. System 2500 may be used in wireless devices such as, for example, a personal digital assistant (PDA), a laptop or portable computer with wireless capability, a web tablet, a telephone or wireless cell phone, a pager, an instant messaging device, a digital music player, a digital camera, or other devices that may be adapted to transmit and/or receive information wirelessly. System 2500 may be used in any of the following systems: a wireless local area network (WLAN) system, a wireless personal area network (WPAN) system, or a cellular network, although the scope of the present invention is not limited in this respect.

System 2500 may include a controller 2510, an input/output (I/O) device 2520 (e.g. a keypad, display), a memory 2530, a wireless interface 2540, and a static random access memory (SRAM) 2560 and coupled to each other via a bus 2550. A battery 2580 may supply power to the system 2500 in one embodiment. It should be noted that the scope of the present invention is not limited to embodiments having any or all of these components.

Controller 2510 may comprise, for example, one or more microprocessors, digital signal processors, microcontrollers, or the like. Memory 2530 may be used to store messages transmitted to or by system 2500. Memory 2530 may also optionally be used to store instructions that are executed by controller 2510 during the operation of system 2500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 2530 may be provided by one or more different types of memory.

The I/O device 2520 may be used to generate a message. The system 2500 may use the wireless interface 2540 to transmit and receive messages to and from a wireless communication network with a radio frequency (RF) signal. Examples of the wireless interface 2540 may include an antenna, or a wireless transceiver, such as a dipole antenna, although the scope of the present invention is not limited in this respect. Also, the I/O device 2520 may deliver a voltage reflecting what is stored as either a digital output (if digital information was stored), or it may be analog information (if analog information was stored). The system may store camera images either downloaded or uploaded wirelessly, or generated and stored directly in the memory described herein from a camera 2590. One or more of the elements of system 2500 may beneficially incorporate the embodiments herein described to implement functions or change the functions in the field through changing or optimizing interconnect and use of gates or other logic functions therein, such as couplable interconnect and/or embedded memory using part of the process used to construct the control cells and couplable interconnect or programmable interconnect.

For example, the processor may utilize programmable connections comprising a phase-change material to connect a portion of the logic contained therein, or used in the chips to implement the processor.

While an example in a wireless application is provided above, embodiments of the present invention may also be used in non-wireless applications as well.

As noted above, in each of the embodiments of the present invention that includes a phase-change element or phase-change material may be replaced with any programmable resistance element or material. The programmable resistance element or material may be any element or material programmable between at least two resistance states, either volatile (losing state on power down) or non-volatile. The programmable resistance element or material need not be a phase-change element and/or threshold switch or material.

While the present invention has been described with respect to a limited number of embodiments, those skilled in the art will appreciate numerous modifications and variations therefrom. It is intended that the appended claims cover all such modifications and variations as fall within the true spirit and scope of this present invention.

We claim:

1. An integrated circuit, comprising: a first conductive line; a second conductive line; a controllable interconnect device coupled between said first and second conductive lines; a control circuit for controlling the state of said interconnect device, said control circuit including an SRAM device, said SRAM device comprising a threshold switching material.

2. An integrated circuit, comprising: a first conductive line; a second conductive line; a controllable interconnect device coupled between said first and second conductive lines; an SRAM device coupled to said interconnect device, said SRAM device comprising a threshold switching material.

3. The integrated circuit of claim 2, wherein said SRAM device comprises a first inverter cross-coupled with a second inverter.

4. The integrated circuit of claim 3, wherein said first inverter comprises a first transistor in series with a first load and said second inverter comprises a second transistor in series with a second load.

5. The integrated circuit of claim 4, wherein said first load includes a first phase-change memory element and said second load includes a second phase-change memory element.

6. The integrated circuit of claim 4, wherein said first load include a first threshold switching element and said second load includes a second threshold switching element.

7. The integrated circuit of claim 4, wherein said first load includes a first threshold switching element in series with a first phase-change memory element and said second load includes a second threshold switching element in series with a second phase-change memory element.

8. The integrated circuit of claim 3, wherein said first inverter comprises a first phase-change memory element and said second inverter comprises a second phase-change memory element.

9. The integrated circuit of claim 3, wherein said first inverter comprises a first threshold switching element and said second inverter comprises a second threshold switching element.

10. The integrated circuit of claim 3, wherein said first inverter comprises a first threshold switching element in series with a first phase-change memory element and said second inverter comprises a second threshold switching element in series with a second phase-change memory element.

11. The integrated circuit of claim 2, wherein said SRAM device further comprises a first transistor cross-coupled with a second transistor.

12. The integrated circuit of claim 11, wherein said SRAM device further comprises a first phase-change memory element in series with said first transistor and a second phase-change memory element in series with said second transistor.

13. The integrated circuit of claim 11, wherein said SRAM device further comprises a first threshold switching element in series with said first transistor and a second threshold switching element in series with said second transistor.

14. The integrated circuit of claim 2, wherein said SRAM device further comprises a first phase-change memory element series with a first threshold switching element and a second phase-change memory element in series with a second threshold switching element.

15. The integrated circuit of claim 2, wherein said interconnect device includes a transistor.

16. The integrated circuit of claim 15, wherein said transistor is coupled between said first conductive line and said second conductive line.

17. The integrated circuit of claim 16, wherein said transistor is a MOS transistor.

18. The integrated circuit of claim 2, wherein said controllable interconnect device is a controllable impedance device.

19. The integrated circuit of claim 2, wherein said interconnect device is a controllable switch.

20. The integrated circuit of claim 2, wherein said interconnect device is a silicon controlled rectifier.

21. The integrated circuit of claim 2, wherein said first conductive line crosses said second conductive line.

22. The integrated circuit of claim 2, wherein said first conductive line is one of a plurality of first conductive lines of a matrix array and said second conductive line is one of a plurality of second conductive lines of said matrix array.

23. The integrated circuit of claim 2, wherein said integrated circuit is a programmable logic device.

* * * * *